United States Patent [19]

Nakahata et al.

[11] Patent Number: 5,783,896
[45] Date of Patent: Jul. 21, 1998

[54] DIAMOND-ZNO SURFACE ACOUSTIC WAVE DEVICE

[75] Inventors: Hideaki Nakahata; Kenjiro Higaki; Satoshi Fujii; Hiroyuki Kitabayashi; Shin-ichi Shikata, all of Itami, Japan

[73] Assignee: Sumitomo Electric Industries, Ltd., Japan

[21] Appl. No.: 791,894

[22] Filed: Jan. 31, 1997

Related U.S. Application Data

[63] Continuation-in-part of Ser. No. 689,296, Aug. 7, 1996.

[30] Foreign Application Priority Data

Nov. 7, 1996 [JP] Japan ................. 8-295183
Jan. 28, 1997 [JP] Japan ................. 9-014158

[51] Int. Cl.$^6$ ................................................. H03H 9/145
[52] U.S. Cl. ................................. 310/313 A; 310/313 R
[58] Field of Search ........................... 310/313 A, 313 R

[56] References Cited

U.S. PATENT DOCUMENTS

| | | | |
|---|---|---|---|
| 5,160,869 | 11/1992 | Nakahata et al. | 310/313 A |
| 5,221,870 | 6/1993 | Nakahata et al. | 310/313 A |
| 5,294,858 | 3/1994 | Nakahata et al. | 310/313 A |
| 5,320,864 | 6/1994 | Nakahata et al. | 310/313 R |
| 5,426,340 | 6/1995 | Higaki et al. | 310/313 R |
| 5,440,189 | 8/1995 | Nakahata et al. | 310/313 R |

FOREIGN PATENT DOCUMENTS

| | | | |
|---|---|---|---|
| 534355-A1 | 3/1993 | European Pat. Off. | 310/313 A |
| 0 588 261 | 3/1994 | European Pat. Off. | H03H 9/02 |
| 60-124112 | 7/1985 | Japan | 310/313 A |
| 3-160811 | 7/1991 | Japan | 310/313 A |
| 3-198412 | 8/1991 | Japan | H03H 9/145 |
| 6-164294 | 6/1994 | Japan | 310/313 A |
| 8-32398 | 2/1996 | Japan | H03H 9/145 |
| 8-65088 | 3/1996 | Japan | H03H 9/145 |
| 2 069 278 | 8/1981 | United Kingdom | 310/313 A |

*Primary Examiner*—Thomas M. Dougherty
*Attorney, Agent, or Firm*—Pennie & Edmonds LLP

[57] ABSTRACT

A first surface acoustic wave device for 2nd mode surface acoustic wave of a wavelength $\lambda$ (μm) according to the present invention is a SAW device of "type A" device shown in FIG. 6A, wherein a parameter $kh3=2\pi(t_A/\lambda)$ is: $0.033 \leq kh3 \leq 0.099$, and wherein a parameter $kh1=2\pi(t_s/\lambda)$ and a parameter $kh2=2\pi(t_z/\lambda)$ are given within a region ABCDEFGHIJKLA in a two-dimensional Cartesin coordinate graph of FIG. 1.

55 Claims, 27 Drawing Sheets

$0.033 \leq kh$ of $Al \leq 0.099$ $0.033 \leq$ kh of Al $\leq 0.099$ $0.099 \leq$ kh of Al $\leq 0.165$ $0.165 \leq$ kh of Al $\leq 0.231$ 0.231≤kh of Al≤0.297

0.297 ≤ kh of Al ≤ 0.363 kh of Al = 0.132 kh of Al = 0.264 kh of Al = 0.066

DIAMOND-ZNO SURFACE ACOUSTIC WAVE DEVICE

RELATED APPLICATIONS

This is a Continuation-In-Part application of application Ser. No. 08/689,296 filed on Aug. 7, 1996, now pending.

BACKGROUND OF THE INVENTION

1. Field of the Invention

The present invention relates to an improved surface acoustic wave (SAW) device which comprises ZnO and diamond. The SAW device according to the present invention is applicable in operating at higher frequency.

2. Related Background Art

A surface acoustic wave device (SAW device) is a device which utilizes the acoustic wave propagation and the piezo-electricity on the surface of particular solid materials. The SAW device has excellent temperature stability, durability, and phase characteristics. Thus, there are certain demands, in the field of the advanced communication technology, for SAW devices which can be used in high frequency bands of more than 2 GHz, such as band-stop filters, resonators, delay devices, signal processing devices, convolvers, and functional elements for opto-electronic devices. For example, the band-stop filter with wider bandwidth is necessary for the equipments for cellular phones/communications which are typically operated in high frequency bands of more than 2 GHz.

The SAW devices typically comprises interdigital transducers(IDT) for generating and detecting the surface acoustic wave. The operation frequency(f) of a SAW device is given by the equation :f=V/λ, where V is the wave propagation velocity in the SAW device, and λ is the wavelength of the surface acoustic wave. The operation frequency of more than 2 GHz is required for SAW device to be used for the band-stop filters with wider bandwidth. The wavelength λ is generally proportional to the width (d) of electrodes of the interdigital transducer.

Because of difficulties on micro-fabrication technique, the electrode with the width (d) of less than 0.5 μm is difficult to be obtained, thus it is difficult to achieve desirable operation frequency (f) of more than 2 GHz by decreasing wavelength λ. Therefore, the SAW device with higher propagation velocity V is required for being applied to the operation at the frequency of 2 GHz or higher.

The energy transform (piezoelectric) efficiency is also important for SAW device to be used for the advanced communication equipments. The effective coupling coefficient($K^2$) is an index to conversion efficiency of the converting of electrical energy into mechanical energy on the surface of the device. The preferable range of the effective coupling coefficient depends upon applications; about 0.10%—about 0.7% for narrow-band filter; about 0.7%—about 3% for medium-band filter; and about 3%—about 6% for wide-band filter.

The temperature coefficient for frequency (TCF) of the SAW device is preferable to be small as possible, because the smaller temperature dependency of the SAW device is desirable. The propagation loss of the SAW device is also preferable to be small as possible, since smaller attenuation in propagation of surface acoustic wave is desirable.

Japanese Patent Laid-Open No. 03-198,412 discloses SAW devices comprising a ZnO piezoelectric layer formed onto a diamond layer. Another type of SAW devices comprising LiNbO$_3$ piezoelectric layer is disclosed in Japanese Patent Laid-Open No. 08-32,398. Japanese Patent Laid-Open 08-65,088 discloses SAW devices comprising LiTaO$_3$ piezoelectric layer.

FIGS. 6A to 6G illustrate the layer/electrode constitution of SAW devices. In U.S. Pat. No. 5,446,329 to Nakahata et.al., disclosures of which is incorporated by reference, propagation velocity V, effective coupling coefficient $K^2$ and temperature coefficient with frequency TCF of ZnO-diamond SAW devices have been improved, in particular by focusing first mode surface acoustic wave: for example, V of 8,000 to 10,000 (m/s), TCF of −10 to 10 (ppm/°C.) and $K^2$ of 0.7 to 1.7 (%) are achieved for "type E" constitution shown in FIG. 6E; V of 8,000 to 10,000 (m/s), TCF of −10 to 10 (ppm/°C.) and $K^2$ of 1 to 3 (%) are achieved for "type B" constitution shown in FIG. 6B; V of 8,000 to 10,000 (m/s), TCF of −10 to 10 (ppm/°C.) and $K^2$ of 1.5 to 4.5 (%) are achieved for "type F" constitution shown in FIG. 6F; V of 8,000 to 10,000 (m/s), TCF of −10 to 10 (ppm/°C.) and K of 0.8 to 2.3 (%) are achieved for "type D" constitution shown in FIG. 6D; and V of 8,000 to 10,000 (m/s), TCF of −10 to 10 (ppm/°C.) and $K^2$ of 0.7 to 2.2 (%) are achieved for "type G" constitution shown in FIG. 6G.

It is also known that the performances of the SAW device can be further improved by employing LiNbO$_3$ or LiTaO$_3$ for piezoelectric material of SAW device. In the Japanese Patent Laid-Open No. 08-32,398, it is demonstrated that LiNbO$_3$-diamond SAW devices have V of 11,000 to 12,500 (m/sec.), TCF of −10 to 10 (ppm), and $K^2$ of 7.5 to 9.5 (%).

Nevertheless, the use of ZnO for piezoelectric material of SAW device can provide significant advantage in fabricating SAW device, because the processibility of ZnO film is much better than LiNbO$_3$ or LiTaO$_3$ films. Therefore, it is desirable to further improve the performances of SAW devices which comprise ZnO piezoelectric layer.

It is also desirable to further improve the performances of the SAW devices in which short circuit electrode, typically made of aluminum (Al), is not included between diamond layer and ZnO layer, such as "type A" and "type C" devices shown in FIG. 6A and FIG. 6C, respectively. Because such device constitution can eliminate the limitation on the process conditions for forming ZnO layer such as process temperature, since Al electrode having relatively low melting point is not included.

Therefore, it is an object of the invention to further improve the propagation velocity V, the effective coupling coefficient $K^2$, the thermal coefficient for frequency TCF and propagation loss of the SAW device which includes ZnO piezoelectric layer formed on diamond layer, to provide SAW device having improved operation characteristics at the frequency of 2 GHz or higher with superior durability and less energy loss.

SUMMARY OF THE INVENTION

We have conducted a number of experimental evaluations on SAW devices comprising a ZnO piezoelectric layer disposed on a diamond, and an SiO$_2$ passivating layer disposed on the ZnO layer. As mentioned above, ZnO layer is advantageous in utilizing a piezoelectric layer of SAW devices, because of its better formability. These experimental evaluations have been carried out by varying layer thicknesses and utilizing the second mode surface acoustic wave which propagates within SAW devices, in order to achieve the above-mentioned object of the invention. The evaluation is, however, generally difficult and complicated, because a compromise among V, TCF, $K^2$ and the propagation loss must be made, in order to achieve the optimization of the operating characteristics of the SAW devices.

The inventors first carried out a series of preliminary evaluation ("first preliminary evaluation") to obtain good V, TCF and $K^2$, with a manner which is similar to a manner utilized in the U.S. Pat. No. 5,446,329 to Nakahata et.al. The result of the first preliminary evaluation is shown in FIG. 24, in which a desirable range of $kh1=2\pi(t_z/\lambda)$ and $kh2=2\pi(t_s/\lambda)$ ($t_z$ is a thickness of ZnO layer, and $t_s$ is a thickness of $SiO_2$ layer) is shown in a region A'B'C'D'E'F'G'H'T'J'K'L'M'N'O'P'Q'R'A' and a region A'B'C'D'S'T'M'N'O'P'Q'R'A'. These regions are applicable to SAW devices of Types "A" (FIG. 6A), "B" (FIG. 6B), "C" (FIG. 6C), "D" (FIG. 6D) and "E" (FIG. 6F), according to the present invention.

Next, another series of preliminary evaluation (second preliminary evaluation) were carried out with a manner which is similar to but more precise than a manner utilized in the U.S. Pat. No. 5,446,329 to Nakahata et.al. The result of the second preliminary evaluation is shown in FIG. 25, in which a desirable range of $kh1=2\pi(t_z/\lambda)$ and $kh2=2\pi(t_s/\lambda)$ (this a thickness of ZnO layer, and $t_s$ is a thickness of $SiO_2$ layer) is shown in a region abcdefghijklmnopqra and a region abcdstmnopqra. These regions are also applicable to SAW devices of Types "A" (FIG. 6A), "B" (FIG. 6B), "C" (FIG. 6C), "D" (FIG. 6D) and "E" (FIG. 6F), according to the present invention.

In these series of the preliminary evaluations, the inventor have found that a thickness of the interdigital transducer (IDT) must also be considered in order to optimize V, TCF and $K^2$.

The IDT is formed of a electric conductive material, and typically formed of aluminum or aluminum alloys, which have own SAW propagation velocity (V) and own linear expansion coefficient. It have been found that the SAW propagation velocity and the linear expansion coefficient of the electrical conductive material such as aluminum is influential to V, TCF and $K^2$ of the SAW devices and the influence of the SAW propagation velocity and the linear expansion coefficient of the IDT to SAW device depends on thickness of IDT.

The present invention is, in particular, directed to a SAW device which are provided with superior operating performances such as propagation velocity (V), temperature coefficient for frequency (TCF), effective coupling coefficient ($K^2$) and propagation loss. The SAW devices comprise ZnO piezoelectric layer, $SiO_2$ layer and aluminum IDT, and have a particular relationship among the layer thicknesses of ZnO, $SiO_2$ and IDT.

A first surface acoustic wave device for 2nd mode surface acoustic wave of a wavelength $\lambda$ (μm) according to the present invention comprises: (i) a diamond layer, (ii) a ZnO layer disposed on the diamond layer, the ZnO layer having a thickness $t_z$, (iii) an interdigital transducer (IDT) disposed on the ZnO layer, the IDT having a thickness of $t_A$, and (iv) a $SiO_2$ layer disposed over the interdigital transducer onto the ZnO layer, the $SiO_2$ layer having a thickness of $t_s$; wherein a parameter $kh3=2\pi(t_A/\lambda)$ is: $0.033 \leq kh3 \leq 0.099$, and wherein a parameter $kh1=2\pi(t_z/\lambda)$ and a parameter $kh2=2\pi(t_s/\lambda)$ are given within a region ABCDEFGHIJKLA in a two-dimensional Cartesin coordinate graph having abscissa axis of kh1 and ordinate axis of kh2, the outer edge of the region ABCDEFGHIJKLA being given by a closed chain in the Cartesian coordinate consisting of points A, B, C, D, E, F, G, H, I, J, K and L and lines A–B, B–C, C–D, D–E, E–F, F–G, G–H, H–I, I–J, J–K, K–L and L–A; the point A being given by a coordinate point (kh1=0.30, kh2=0.87); the point B being given by a coordinate point (kh1=0.54, kh2=0.87); the point C being given by a coordinate point (kh1=0.60, kh2=0.87); the point D being given by a coordinate point (kh1=0.81, kh2=0.97); the point E being given by a coordinate point (kh1=1.16, kh2=1.20); the point F being given by a coordinate point (kh1=1.52, kh2=0.93); the point G being given by a coordinate point (kh1=1.69, kh2=0.77); the point H being given by a coordinate point (kh1=1.31, kh2=0.59); the point I being given by a coordinate point (kh1=1.04, kh2=0.50); the point J being given by a coordinate point (kh1=0.68, kh2=0.40); the point K being given by a coordinate point (kh1=0.63, kh2=0.33); and the point L being given by a coordinate point (kh1=0.30, kh2=0.63). The layer structure of this SAW device is schematically illustrated in FIG. 6A, "type A".

The first SAW device having above constitution is provided with propagation velocity V of 8,000 (m/s) or higher, temperature coefficient for frequency TCF of from –15 to 15 (ppm/°C.) and effective coupling coefficient $K^2$ of from 0.1 to 1.3 (%). Further, such constitution is more advantageous in manufacturing. Processing temperature for forming ZnO layer is not strictly limited when the "type A" constitution is employed, because the formation of ZnO layer, which requires relatively higher processing temperature, is accomplished before forming IDT which has relatively low melting/softening point.

A second surface acoustic wave device according to the present invention is also a "Type A" SAW device, wherein the parameters kh1 and kh2 are given within a region ABIJKLA in the two-dimensional Cartesian coordinate graph, the outer edge of the region ABIJKLA being given by a closed chain in the Cartesian coordinate, consisting of the points A, B, I, J, K and L, and lines A–B, B–I, I–J, J–K, K–L and L–A.

The second SAW device having this constitution is provided with propagation velocity V of from 10,000 or higher (m/s), temperature coefficient for frequency TCF of from –15 to 15 (ppm/°C.) and effective coupling coefficient $K^2$ of from 0.1 to 1.3 (%). Further, such constitution is more advantageous in manufacturing, as discussed in the first SAW device.

The two-dimensional Cartesian coordinate graph having abscissa axis of kh1 and ordinate axis of kh2 is shown in FIG. 1. The region ABCDEFGHIJKLA and the region ABIJKLA are also shown in FIG. 1.

A third surface acoustic wave device for 2nd mode surface acoustic wave of a wavelength $\lambda$ (μm) according to the present invention comprises: (i) a diamond layer, (ii) a ZnO layer disposed on the diamond layer, the ZnO layer having a thickness $t_z$, (iii) an interdigital transducer (IDT) disposed on the ZnO layer, the IDT having a thickness of $t_A$, and (iv) a $SiO_2$ layer disposed over the interdigital transducer onto the ZnO layer, the $SiO_2$ layer having a thickness of $t_s$; wherein a parameter $kh3=2\pi(t_A/\lambda)$ is: $0.099 \leq kh3 \leq 0.165$, and wherein a parameter $kh1=2\pi(t_z/\lambda)$ and a parameter $kh2=2\pi(t_s/\lambda)$ are given within a region ABCDEFGHIJKLMA in a two-dimensional Cartesian coordinate graph having abscissa axis of kh1 and ordinate axis of kh2, the outer edge of the region ABCDEFGHIJKLMA being given by a closed chain in the Cartesian coordinate consisting of points A, B, C, D, E, F, G, H, I, J, K, L and M and lines A–B, B–C, C–D, D–E, E–F, F–G, G–H, H–I, I–J, J–K, K–L, L–M and M–A; the point A being given by a coordinate point (kh1=0.30, kh2=0.98); the point B being given by a coordinate point (kh1=0.40, kh2=0.95); the point C being given by a coordinate point (kh1=0.45, kh2=0.96); the point D being given by a coordinate point (kh1=0.60, kh2=1.00); the point E being given by a coordinate point (kh1=1.04, kh2=1.25); the point F being given by a coordinate point (kh1=1.53, kh2=0.89); the point G being given by a coordinate point (kh1=1.60, kh2=0.80); the point H being given by a coordinate point (kh1=1.22, kh2=0.63); the point I being given by a coordinate point (kh1=1.00, kh2=0.59); the point J being given by a coordinate point (kh1=0.89, kh2=0.57); the point K being given by a coordinate point (kh1=0.53, kh2=0.52); the point L being given by a coordinate point (kh1=0.53, kh2=0.45); and the point M being given by a coordinate point (kh1=0.30, kh2=0.65). The layer structure of this SAW device is schematically illustrated in FIG. 6A, "type A".

The third SAW device having above constitution is provided with propagation velocity V of 8,000 (m/s) or higher, temperature coefficient for frequency TCF of from −15 to 15 (ppm/°C.) and effective coupling coefficient $K^2$ of from 0.05 to 1.20 (%). Further, such constitution is more advantageous in manufacturing, as mentioned in the first SAW device.

A fourth surface acoustic wave device according to the present invention is also a "Type A" SAW device, wherein the parameters kh1 and kh2 are given within a region ABCNJKLMA in the two-dimensional Cartesian coordinate graph, the outer edge of the region ABCNJKLMA being given by a closed chain in the Cartesian coordinate, consisting of the points A, B and C, a point N, and the points J, K, L, and M, and lines A–B, B–C, C–N, N–J, J–K, K–L, L–M and M–A, the point N being given by a coordinate point (kh1=0.62, kh2=0.77).

The fourth SAW device having this constitution is provided with propagation velocity V of from 10,000 or higher (m/s), temperature coefficient for frequency TCF of from −15 to 15 (ppm/°C.) and effective coupling coefficient $K^2$ of from 0.05 to 1.5 (%). Further, such constitution is more advantageous in manufacturing, as mentioned in the first SAW device.

The two-dimensional Cartesian coordinate graph having abscissa axis of kh1 and ordinate axis of kh2 is shown in FIG. 2. The region ABCDEFGHIJKLMA and the region ABCNJKLMA are also shown in FIG. 2.

A fifth surface acoustic wave device for 2nd mode surface acoustic wave of a wavelength λ (μm) according to the present invention comprises: (i) a diamond layer, (ii) a ZnO layer disposed on the diamond layer, the ZnO layer having a thickness $t_z$, (iii) an interdigital transducer (IDT) disposed on the ZnO layer, the IDT having a thickness of $t_A$, and (iv) a SiO$_2$ layer disposed over the interdigital transducer onto the ZnO layer, the SiO$_2$ layer having a thickness of $t_s$; wherein a parameter kh3=2π($t_A$/λ) is: 0.165≦kh3≦0.231, and wherein a parameter kh1=2π($t_z$/λ) and a parameter kh2=2π($t_s$/λ) are given within a region ABCDEFGHIJKLMA in a two-dimensional Cartesian coordinate graph having abscissa axis of kh1 and ordinate axis of kh2, the outer edge of the region ABCDEFGHIJKLMA being given by a closed chain in the Cartesian coordinate consisting of points A, B, C, D, E, F, G, H, I, J, K, L and M and lines A–B, B–C, C–D, D–E, E–F, F–G, G–H, H–I, I–J, J–K, K–L, L–M and M–A; the point A being given by a coordinate point (kh1=0.30, kh2=1.07); the point B being given by a coordinate point (kh1=0.36, kh2=1.07); the point C being given by a coordinate point (kh1=0.43, kh2=1.07); the point D being given by a coordinate point (kh1=0.90, kh2=1.37); the point E being given by a coordinate point (kh1=1.05, kh2=1.20); the point F being given by a coordinate point (kh1=1.52, kh2=0.85); the point G being given by a coordinate point (kh1=1.34, kh2=0.79); the point H being given by a coordinate point (kh1=1.05, kh2=0.72); the point I being given by a coordinate point (kh1=0.85, kh2=0.68); the point J being given by a coordinate point (kh1=0.71, kh2=0.68); the point K being given by a coordinate point (kh1=0.38, kh2=0.68); the point L being given by a coordinate point (kh1=0.42, kh2=0.55); and the point M being given by a coordinate point (kh1=0.30, kh2=0.65). The layer structure of this SAW device is schematically illustrated in FIG. 6A, "type A".

The fifth SAW device having above constitution is provided with propagation velocity V of 8,000 (m/s) or higher, temperature coefficient for frequency TCF of from −15 to 15 (ppm/°C.) and effective coupling coefficient $K^2$ of from 0.05 to 1.05 (%). Further, such constitution is more advantageous in manufacturing, as mentioned in the first SAW device.

A sixth surface acoustic wave device according to the present invention is also a "Type A" SAW device, wherein the parameters kh1 and kh2 are given within a region ABNOJKLMA in the two-dimensional Cartesian coordinate graph, the outer edge of the region ABCNJKLMA being given by a closed chain in the Cartesian coordinate, consisting of the points A, B and C, a point N, a point O, and the points J, K, L, and M, and lines A–B, B–C, C–N, N–J, J–K, K–L, L–M and M–A, the point N being given by a coordinate point (kh1=0.43, kh2=0.95); and the point O being given by a coordinate point (kh1=0.61, kh2=0.75).

The sixth SAW device having this constitution is provided with propagation velocity V of from 10,000 or higher (m/s), temperature coefficient for frequency TCF of from −15 to 15 (ppm/°C.) and effective coupling coefficient $K^2$ of from 0.05 to 0.95 (%). Further, such constitution is more advantageous in manufacturing, as mentioned in the first SAW device.

The two-dimensional Cartesian coordinate graph having abscissa axis of kh1 and ordinate axis of kh2 is shown in FIG. 3. The region ABCDEFGHIJKLMA and the region ABNOJKLMA are also shown in FIG. 3.

A seventh surface acoustic wave device for 2nd mode surface acoustic wave of a wavelength λ (μm) according to the present invention comprises: (i) a diamond layer, (ii) a ZnO layer disposed on the diamond layer, the ZnO layer having a thickness $t_z$, (iii) an interdigital transducer (IDT) disposed on the ZnO layer, the IDT having a thickness of $t_A$, and (iv) a SiO$_2$ layer disposed over the interdigital transducer onto the ZnO layer, the SiO$_2$ layer having a thickness of $t_s$; wherein a parameter kh3=2π($t_A$/λ) is: 0.231≦kh3≦0.297, and wherein a parameter kh1=2π($t_z$/λ) and a parameter kh2=2π($t_s$/λ) are given within a region ABCDEFGHIJKLMNA in a two-dimensional Cartesian coordinate graph having abscissa axis of kh1 and ordinate axis of kh2, the outer edge of the region ABCDEFGHIJKLMNA being given by a closed chain in the Cartesian coordinate consisting of points A, B, C, D, E, F, G, H, I, J, K, L, M and N and lines A–B, B–C, C–D, D–E, E–F, F–G, G–H, H–I, I–J, J–K, K–L, L–M, M–N and N–A; the point A being given by a coordinate point (kh1=0.30, kh2=1.15); the point B being given by a coordinate point (kh1=0.38, kh2=1.20); the point C being given by a coordinate point (kh1=0.46, kh2=1.32); the point D being given by a coordinate point (kh1=0.60, kh2=1.52); the point E being given by a coordinate point (kh1=0.73, kh2=1.60); the point F being given by a coordinate point (kh1=0.81, kh2=1.44); the point G being given by a coordinate point (kh1=1.00, kh2=1.20); the point H being given by a coordinate point (kh1=1.40, kh2=0.91); the point I being given by a coordinate point (kh1=1.14, kh2=0.83); the point J being given by a coordinate point (kh1=0.83, kh2=0.76); the point K being given by a coordinate point (kh1=0.60, kh2=0.73); the point L being given by a coordinate point (kh1=0.35, kh2=0.73); the point M being given by a coordinate point (kh1=0.38, kh2=0.63); and the point N being given by a coordinate point (kh1=0.30, kh2=0.65). The layer structure of this SAW device is schematically illustrated in FIG. 6A, "type A".

The seventh SAW device having above constitution is provided with propagation velocity V of 8,000 (m/s) or higher, temperature coefficient for frequency TCF of from −15 to 15 (ppm/°C.) and effective coupling coefficient $K^2$ of from 0.05 to 0.95 (%). Further, such constitution is more advantageous in manufacturing, as mentioned in the first SAW device.

A eighth surface acoustic wave device according to the present invention is also a "Type A" SAW device, wherein the parameters kh1 and kh2 are given within a region AOPKLMNA in the two-dimensional Cartesian coordinate graph, the outer edge of the region AOPKLMNA being given by a closed chain in the Cartesian coordinate, consisting of the point A, a point O, a point P, and the points K, L, M and N, and lines A–O, O–P, P–K, K–L, L–M, M–N and N–A, the point O being given by a coordinate point (kh1=0.36, kh2=1.00); and the point P being given by a coordinate point (kh1=0.48, kh2=0.83).

The eighth SAW device having this constitution is provided with propagation velocity V of from 10,000 or higher (m/s), temperature coefficient for frequency TCF of from −15 to 15 (ppm/°C.) and effective coupling coefficient $K^2$ of from 0.05 to 0.70 (%). Further, such constitution is more advantageous in manufacturing, as mentioned in the first SAW device.

The two-dimensional Cartesian coordinate graph having abscissa axis of kh1 and ordinate axis of kh2 is shown in FIG. 4. The region ABCDEFGHIJKLMNA and the region AOPKLMNA are also shown in FIG. 4.

A ninth surface acoustic wave device for 2nd mode surface acoustic wave of a wavelength λ (μm) according to the present invention comprises: (i) a diamond layer, (ii) a ZnO layer disposed on the diamond layer, the ZnO layer having a thickness $t_z$, (iii) an interdigital transducer (IDT) disposed on the ZnO layer, the IDT having a thickness of $t_A$, and (iv) a SiO$_2$ layer disposed over the interdigital transducer onto the ZnO layer, the SiO$_2$ layer having a thickness of $t_s$; wherein a parameter kh3=2π($t_A$/λ) is: 0.297≦kh3≦0.363, and wherein a parameter kh1=2π($t_z$/λ) and a parameter kh2=2π($t_s$/λ) are given within a region ABCDEFGHIJKLA in a two-dimensional Cartesian coordinate graph having abscissa axis of kh1 and ordinate axis of kh2, the outer edge of the region ABCDEFGHIJKLA being given by a closed chain in the Cartesian coordinate consisting of points A, B, C, D, E, F, G, H, I, J, K and L and lines A–B, B–C, C–D, D–E, E–F, F–G, G–H, H–I, I–J, J–K, K–L and L–A; the point A being given by a coordinate point (kh1=0.30, kh2=1.29); the point B being given by a coordinate point (kh1=0.33, kh2=1.36); the point C being given by a coordinate point (kh1=0.40, kh2=1.60); the point D being given by a coordinate point (kh1=0.71, kh2=1.60); the point E being given by a coordinate point (kh1=0.82, kh2=1.41); the point F being given by a coordinate point (kh1=1.00, kh2=1.22); the point G being given by a coordinate point (kh1=1.27, kh2=0.97); the point H being given by a coordinate point (kh1=1.03, kh2=0.89); the point I being given by a coordinate point (kh1=0.68, kh2=0.78); the point J being given by a coordinate point (kh1=0.52, kh2=0.77); the point K being given by a coordinate point (kh1=0.30, kh2=0.76); and the point L being given by a coordinate point (kh1=0.30, kh2=1.09). The layer structure of this SAW device is schematically illustrated in FIG. 6A, "type A".

The ninth SAW device having above constitution is provided with propagation velocity V of 8,000 (m/s) or higher, temperature coefficient for frequency TCF of from −15 to 15 (ppm/°C.) and effective coupling coefficient $K^2$ of from 0.05 to 0.85 (%). Further, such constitution is more advantageous in manufacturing, as mentioned in the first SAW device.

A tenth surface acoustic wave device according to the present invention is also a "type A" SAW device, wherein the parameters kh1 and kh2 are given within a region LMJKL in the two-dimensional Cartesian coordinate graph, the outer edge of the region LMJKL being given by a closed chain in the Cartesian coordinate, consisting of the point L, a point M, and the points J and K, and lines L–M, M–J, J–K and K–L, the point M being given by a coordinate point (kh1=0.37, kh2=0.94).

The tenth SAW device having this constitution is provided with propagation velocity V of from 10,000 or higher (m/s), temperature coefficient for frequency TCF of from −15 to 15 (ppm/°C.) and effective coupling coefficient $K^2$ of from 0.05 to 0.50 (%). Further, such constitution is more advantageous in manufacturing, as mentioned in the first SAW device.

The two-dimensional Cartesian coordinate graph having abscissa axis of kh1 and ordinate axis of kh2 is shown in FIG. 5. The region ABCDEFGHIJKLA and the region LMJKL are also shown in FIG. 5.

An 11th surface acoustic wave device for 2nd mode surface acoustic wave of a wavelength λ (μm) according to the present invention comprises: (i) a diamond layer, (ii) a ZnO layer disposed on the diamond layer, (iii) a short circuit electrode disposed on the diamond layer, (iii) a ZnO layer disposed over the short circuit electrode onto the diamond layer, the ZnO layer having a thickness $t_z$, (iv) an interdigital transducer (IDT) disposed on the ZnO layer, the IDT having a thickness of $t_A$, and (v) a SiO$_2$ layer disposed over the interdigital transducer onto the ZnO layer, the SiO$_2$ layer having a thickness of $t_s$; wherein a parameter kh3=2π($t_A$/λ) is: 0.033≦kh3≦0.099, and wherein a parameter kh1=2π($t_z$/λ) and a parameter kh2=2π($t_s$/λ) are given within a region ABCDEFGHIJKLA in a two-dimensional Cartesin coordinate graph having abscissa axis of kh1 and ordinate axis of kh2, the outer edge of the region ABCDEFGHIJKLA being given by a closed chain in the Cartesian coordinate consisting of points A, B, C, D, E, F, G, H, I, J, K and L and lines A–B, B–C, C–D, D–E, E–F, F–G, G–H, H–I, I–J, J–K, K–L and L–A; the point A being given by a coordinate point (kh1=0.30, kh2=0.87); the point B being given by a coordinate point (kh1=0.54, kh2=0.87); the point C being given by a coordinate point (kh1=0.60, kh2=0.87); the point D being given by a coordinate point (kh1=0.81, kh2=0.97); the point E being given by a coordinate point (kh1=1.16, kh2=1.20); the point F being given by a coordinate point (kh1=1.52, kh2=0.93); the point G being given by a coordinate point (kh1=1.69, kh2=0.77); the point H being given by a coordinate point (kh1=1.31, kh2=0.59); the point I being given by a coordinate point (kh1=1.04, kh2=0.50); the point J being given by a coordinate point (kh1=0.68, kh2=0.40); the point K being given by a coordinate point (kh1=0.63, kh2=0.33); and the point L being given by a coordinate point (kh1=0.30, kh2=0.63). The layer structure of this SAW device is schematically illustrated in FIG. 6B, "type B".

The 11th SAW device having above constitution is provided with propagation velocity V of 8,000 (m/s) or higher, temperature coefficient for frequency TCF of from −15 to 15 (ppm/°C.) and effective coupling coefficient $K^2$ of from 1.0 to 2.4 (%). Further, such constitution is advantageous in manufacturing, because ZnO having better formability is employed.

A 12th surface acoustic wave device according to the present invention is also a "type B" SAW device, wherein the parameters kh1 and kh2 are given within a region ABIJKLA in the two-dimensional Cartesian coordinate graph, the outer edge of the region ABIJKLA being given by a closed chain in the Cartesian coordinate, consisting of the points A, B, I, J, K and L, and lines A–B, B–I, I–J, J–K, K–L and L–A.

The 12th SAW device having this constitution is provided with propagation velocity V of from 10,000 or higher (m/s), temperature coefficient for frequency TCF of from −15 to 15 (ppm/°C.) and effective coupling coefficient $K^2$ of from 1.2 to 2.4 (%). Further, such constitution is advantageous in manufacturing, as discussed in the 11th SAW device.

The two-dimensional Cartesian coordinate graph having abscissa axis of kh1 and ordinate axis of kh2 is shown in FIG. 1. The region ABCDEFGHIJKLA and the region ABIJKLA are also shown in FIG. 1.

A 13th surface acoustic wave device for 2nd mode surface acoustic wave of a wavelength λ (μm) according to the present invention comprises: (i) a diamond layer, (ii) a short circuit electrode disposed on the diamond layer, (iii) a ZnO layer disposed over the short circuit electrode onto the diamond layer, the ZnO layer having a thickness $t_z$, (iv) an interdigital transducer (IDT) disposed on the ZnO layer, the IDT having a thickness of $t_A$, and (v) a $SiO_2$ layer disposed over the interdigital transducer onto the ZnO layer, the $SiO_2$ layer having a thickness of $t_s$; wherein a parameter kh3=2π($t_A$/λ) is: 0.099≦kh3≦0.165, and wherein a parameter kh1=2π($t_z$/λ) and a parameter kh2=2π($t_s$/λ) are given within a region ABCDEFGHIJKLMA in a two-dimensional Cartesian coordinate graph having abscissa axis of kh1 and ordinate axis of kh2, the outer edge of the region ABCDEFGHIJKLMA being given by a closed chain in the Cartesian coordinate consisting of points A, B, C, D, E, F, G, H, I, J, K, L and M and lines A–B, B–C, C–D, D–E, E–F, F–G, G–H, H–I, I–J, J–K, K–L, L–M and M–A; the point A being given by a coordinate point (kh1=0.30, kh2=0.98); the point B being given by a coordinate point (kh1=0.40, kh2=0.95); the point C being given by a coordinate point (kh1=0.45, kh2=0.96); the point D being given by a coordinate point (kh1=0.60, kh2=1.00); the point E being given by a coordinate point (kh1=1.04, kh2=1.25); the point F being given by a coordinate point (kh1=1.53, kh2=0.89); the point G being given by a coordinate point (kh1=1.60, kh2=0.80); the point H being given by a coordinate point (kh1=1.22, kh2=0.63); the point I being given by a coordinate point (kh1=1.00, kh2=0.59); the point J being given by a coordinate point (kh1=0.89, kh2=0.57); the point K being given by a coordinate point (kh1=0.53, kh2=0.52); the point L being given by a coordinate point (kh1=0.53, kh2=0.45); and the point M being given by a coordinate point (kh1=0.30, kh2=0.65). The layer structure of this SAW device is schematically illustrated in FIG. 6B, "type B".

The 13th SAW device having above constitution is provided with propagation velocity V of 8,000 (m/s) or higher, temperature coefficient for frequency TCF of from −15 to 15 (ppm/°C.) and effective coupling coefficient $K^2$ of from 0.75 to 2.25 (%). Further, such constitution is advantageous in manufacturing, as mentioned in the 11th SAW device.

A 14th surface acoustic wave device according to the present invention is also a "type B" SAW device, wherein the parameters kh1 and kh2 are given within a region ABCNJKLMA in the two-dimensional Cartesian coordinate graph, the outer edge of the region ABCNJKLMA being given by a closed chain in the Cartesian coordinate, consisting of the points A, B and C, a point N, and the points J, K, L, and M, and lines A–B, B–C, C–N, N–J, J–K, K–L, L–M and M–A, the point N being given by a coordinate point (kh1=0.62, kh2=0.77).

The 14th SAW device having this constitution is provided with propagation velocity V of from 10,000 or higher (m/s), temperature coefficient for frequency TCF of from −15 to 15 (ppm/°C.) and effective coupling coefficient $K^2$ of from 0.75 to 2.25 (%). Further, such constitution is advantageous in manufacturing, as mentioned in the 11th SAW device.

The two-dimensional Cartesian coordinate graph having abscissa axis of kh1 and ordinate axis of kh2 is shown in FIG. 2. The region ABCDEFGHIJKLMA and the region ABCNJKLMA are also shown in FIG. 2.

A 15th surface acoustic wave device for 2nd mode surface acoustic wave of a wavelength λ (μm) according to the present invention comprises: (i) a diamond layer, (ii) a short circuit electrode disposed on the diamond layer, (iii) a ZnO layer disposed over the short circuit electrode onto the diamond layer, the ZnO layer having a thickness $t_z$, (iv) an interdigital transducer (IDT) disposed on the ZnO layer, the IDT having a thickness of $t_A$, and (v) a $SiO_2$ layer disposed over the interdigital transducer onto the ZnO layer, the $SiO_2$ layer having a thickness of $t_s$; 15. A surface acoustic wave device for 2nd mode surface acoustic wave of a wavelength λ (μm) comprising: (i) a diamond layer, (ii) a short circuit electrode disposed on the diamond layer, (iii) a ZnO layer disposed over the short circuit electrode onto the diamond layer, the ZnO layer having a thickness $t_z$, (iv) an interdigital transducer (IDT) disposed on the ZnO layer, the IDT having a thickness of $t_A$, and (v) a $SiO_2$ layer disposed over the interdigital transducer onto the ZnO layer, the $SiO_2$ layer having a thickness of $t_s$; wherein a parameter kh3=2π($t_A$/λ) is: 0.165≦kh3≦0.231, and wherein a parameter kh1=2π($t_z$/λ) and a parameter kh2=2π($t_s$/λ) are given within a region ABCDEFGHIJKLMA in a two-dimensional Cartesian coordinate graph having abscissa axis of kh1 and ordinate axis of kh2, the outer edge of the region ABCDEFGHIJKLMA being given by a closed chain in the Cartesian coordinate consisting of points A, B, C, D, E, F, G, H, I, J, K, L and M and lines A–B, B–C, C–D, D–E, E–F, F–G, G–H, H–I, I–J, J–K, K–L, L–M and M–A; the point A being given by a coordinate point (kh1=0.30, kh2=1.07); the point B being given by a coordinate point (kh1=0.36, kh2=1.07); the point C being given by a coordinate point (kh1=0.43, kh2=1.07); the point D being given by a coordinate point (kh1=0.90, kh2=1.37); the point E being given by a coordinate point (kh1=1.05, kh2=1.20); the point F being given by a coordinate point (kh1=1.52, kh2=0.85); the point G being given by a coordinate point (kh1=1.34, kh2=0.79); the point H being given by a coordinate point (kh1=1.05, kh2=0.72); the point I being given by a coordinate point (kh1=0.85, kh2=0.68); the point J being given by a coordinate point (kh1=0.71, kh2=0.68); the point K being given by a coordinate point (kh1=0.38, kh2=0.68); the point L being given by a coordinate point (kh1=0.42, kh2=0.55); and the point M being given by a coordinate point (kh1=0.30, kh2=0.65). The layer structure of this SAW device is schematically illustrated in FIG. 6B, "type B".

The 15th SAW device having above constitution is provided with propagation velocity V of 8,000 (m/s) or higher, temperature coefficient for frequency TCF of from −15 to 15 (ppm/°C.) and effective coupling coefficient $K^2$ of from 0.70 to 2.2 (%). Further, such constitution is advantageous in manufacturing, as mentioned in the 11th SAW device.

A 16th surface acoustic wave device according to the present invention is also a "type B" SAW device, wherein the parameters kh1 and kh2 are given within a region ABNOJKLMA in the two-dimensional Cartesian coordinate graph, the outer edge of the region ABCNJKLMA being given by a closed chain in the Cartesian coordinate, consisting of the points A, B and C, a point N, a point O, and the points J, K, L, and M, and lines A–B, B–C, C–N, N–J, J–K, K–L, L–M and M–A, the point N being given by a coordinate point (kh1=0.43, kh2=0.95); and the point O being given by a coordinate point (kh1=0.61, kh2=0.75).

The 16th SAW device having this constitution is provided with propagation velocity V of from 10,000 or higher (m/s), temperature coefficient for frequency TCF of from −15 to 15 (ppm/°C.) and effective coupling coefficient $K^2$ of from 0.70 to 2.2 (%). Further, such constitution is advantageous in manufacturing, as mentioned in the 11th SAW device.

The two-dimensional Cartesian coordinate graph having abscissa axis of kh1 and ordinate axis of kh2 is shown in FIG. 3. The region ABCDEFGHIJKLMA and the region ABNOJKLMA are also shown in FIG. 3.

A 17th surface acoustic wave device for 2nd mode surface acoustic wave of a wavelength $\lambda$ (μm) according to the present invention comprises: (i) a diamond layer, (ii) a short circuit electrode disposed on the diamond layer, (iii) a ZnO layer disposed over the short circuit electrode onto the diamond layer, the ZnO layer having a thickness $t_z$, (iv) an interdigital transducer (IDT) disposed on the ZnO layer, the IDT having a thickness of $t_A$, and (v) a $SiO_2$ layer disposed over the interdigital transducer onto the ZnO layer, the $SiO_2$ layer having a thickness of $t_s$; wherein a parameter kh3=$2\pi (t_A/\lambda)$ is: $0.231 \leq kh3 \leq 0.297$, and wherein a parameter kh1=$2\pi(t_s/\lambda)$ and a parameter kh2=$2\pi(t_z/\lambda)$ are given within a region ABCDEFGHIJKLMNA in a two-dimensional Cartesian coordinate graph having abscissa axis of kh1 and ordinate axis of kh2, the outer edge of the region ABCDEFGHIJKLMNA being given by a closed chain in the Cartesian coordinate consisting of points A, B, C, D, E, F, G, H, I, J, K, L, M and N and lines A–B, B–C, C–D, D–E, E–F, F–G, G–H, H–I, I–J, J–K, K–L, L–M, M–N and N–A; the point A being given by a coordinate point (kh1=0.30, kh2=1.15); the point B being given by a coordinate point (kh1=0.38, kh2=1.20); the point C being given by a coordinate point (kh1=0.46, kh2=1.32); the point D being given by a coordinate point (kh1=0.60, kh2=1.52); the point E being given by a coordinate point (kh1=0.73, kh2=1.60); the point F being given by a coordinate point (kh1=0.81, kh2=1.44); the point G being given by a coordinate point (kh1=1.00, kh2=1.20); the point H being given by a coordinate point (kh1=1.40, kh2=0.91); the point I being given by a coordinate point (kh1=1.14, kh2=0.83); the point J being given by a coordinate point (kh1=0.83, kh2=0.76); the point K being given by a coordinate point (kh1=0.60, kh2=0.73); the point L being given by a coordinate point (kh1=0.35, kh2=0.73); the point M being given by a coordinate point (kh1=0.38, kh2=0.63); and the point N being given by a coordinate point (kh1=0.30, kh2=0.65). The layer structure of this SAW device is schematically illustrated in FIG. 6B, "type B".

The 17th SAW device having above constitution is provided with propagation velocity V of 8,000 (m/s) or higher, temperature coefficient for frequency TCF of from −15 to 15 (ppm/°C.) and effective coupling coefficient $K^2$ of from 0.55 to 1.75 (%). Further, such constitution is advantageous in manufacturing, as mentioned in the 11th SAW device.

A 18th surface acoustic wave device according to the present invention is also a "type B" SAW device, wherein the parameters kh1 and kh2 are given within a region AOPKLMNA in the two-dimensional Cartesian coordinate graph, the outer edge of the region AOPKLMNA being given by a closed chain in the Cartesian coordinate, consisting of the point A, a point O, a point P, and the points K, L, M and N, and lines A–O, O–P, P–K, K–L, L–M, M–N and N–A, the point O being given by a coordinate point (kh1=0.36, kh2=1.00); and the point P being given by a coordinate point (kh1=0.48, kh2=0.83).

The 18th SAW device having this constitution is provided with propagation velocity V of from 10,000 or higher (m/s), temperature coefficient for frequency TCF of from −15 to 15 (ppm/°C.) and effective coupling coefficient $K^2$ of from 0.60 to 1.75 (%). Further, such constitution is advantageous in manufacturing, as mentioned in the 11th SAW device.

The two-dimensional Cartesian coordinate graph having abscissa axis of kh1 and ordinate axis of kh2 is shown in FIG. 4. The region ABCDEFGHIJKLMNA and the region AOPKLMNA are also shown in FIG. 4.

A 19th surface acoustic wave device for 2nd mode surface acoustic wave of a wavelength $\lambda$ (μm) according to the present invention comprises: (i) a diamond layer, (ii) a short circuit electrode disposed on the diamond layer, (iii) a ZnO layer disposed over the short circuit electrode onto the diamond layer, the ZnO layer having a thickness $t_z$, (iv) an interdigital transducer (IDT) disposed on the ZnO layer, the IDT having a thickness of $t_A$, and (v) a $SiO_2$ layer disposed over the interdigital transducer onto the ZnO layer, the $SiO_2$ layer having a thickness of $t_s$; wherein a parameter kh3=$2\pi (t_A/\lambda)$ is: $0.297 \leq kh3 \leq 0.363$, and wherein a parameter kh1=$2\pi(t_s/\lambda)$ and a parameter kh2=$2\pi(t_z/\lambda)$ are given within a region ABCDEFGHIJKLA in a two-dimensional Cartesian coordinate graph having abscissa axis of kh1 and ordinate axis of kh2, the outer edge of the region ABCDEFGHIJKLA being given by a closed chain in the Cartesian coordinate consisting of points A, B, C, D, E, F, G, H, I, J, K and L and lines A–B, B–C, C–D, D–E, E–F, F–G, G–H, H–I, I–J, J–K, K–L and L–A; the point A being given by a coordinate point (kh1=0.30, kh2=1.29); the point B being given by a coordinate point (kh1=0.33, kh2=1.36); the point C being given by a coordinate point (kh1=0.40, kh2=1.60); the point D being given by a coordinate point (kh1=0.71, kh2=1.60); the point E being given by a coordinate point (kh1=0.82, kh2=1.41); the point F being given by a coordinate point (kh1=1.00, kh2=1.22); the point G being given by a coordinate point (kh1=1.27, kh2=0.97); the point H being given by a coordinate point (kh1=1.03, kh2=0.89); the point I being given by a coordinate point (kh1=0.68, kh2=0.78); the point J being given by a coordinate point (kh1=0.52, kh2=0.77); the point K being given by a coordinate point (kh1=0.30, kh2=0.76); and the point L being given by a coordinate point (kh1=0.30, kh2=1.09).

The layer structure of this SAW device is schematically illustrated in FIG. 6B, "type B".

The 19th SAW device having above constitution is provided with propagation velocity V of 8,000 (m/s) or higher, temperature coefficient for frequency TCF of from −15 to 15 (ppm/°C.) and effective coupling coefficient $K^2$ of from 0.30 to 1.7 (%). Further, such constitution is advantageous in manufacturing, as mentioned in the 11th SAW device.

A 20th surface acoustic wave device according to the present invention is also a "type B" SAW device, wherein the parameters kh1 and kh2 are given within a region LMJKL in the two-dimensional Cartesian coordinate graph, the outer edge of the region LMJKL being given by a closed chain in the Cartesian coordinate, consisting of the point L, a point M, and the points J and K, and lines L–M, M–J, J–K and K–L, the point M being given by a coordinate point (kh1=0.37, kh2=0.94).

The 20th SAW device having this constitution is provided with propagation velocity V of from 10,000 or higher (m/s), temperature coefficient for frequency TCF of from −15 to 15 (ppm/°C.) and effective coupling coefficient $K^2$ of from 0.70 to 1.7 (%). Further, such constitution is advantageous in manufacturing, as mentioned in the 11th SAW device.

The two-dimensional Cartesian coordinate graph having abscissa axis of kh1 and ordinate axis of kh2 is shown in FIG. 5. The region ABCDEFGHIJKLA and the region LMJKL are also shown in FIG. 5.

A 21st surface acoustic wave device for 2nd mode surface acoustic wave of a wavelength $\lambda$ (μm) according to the present invention comprises: (i) a diamond layer, (ii) a ZnO layer disposed on the diamond layer, the ZnO layer having a thickness $t_z$, (iii) an interdigital transducer (IDT) disposed on the ZnO layer, the IDT having a thickness of $t_A$, (iv) a $SiO_2$ layer disposed over the interdigital transducer onto the ZnO layer, the $SiO_2$ layer having a thickness of $t_s$, and (v) a short circuit electrode disposed on the $SiO_2$ layer; wherein a parameter kh3=$2\pi(t_A/\lambda)$ is: $0.033 \leq kh3 \leq 0.099$, and wherein a parameter kh1=$2\pi(t_s/\lambda)$ and a parameter kh2=$2\pi(t_z/\lambda)$ are given within a region ABCDEFGHIJKLA in a two-dimensional Cartesin coordinate graph having abscissa axis of kh1 and ordinate axis of kh2, the outer edge of the region ABCDEFGHIJKLA being given by a closed chain in the Cartesian coordinate consisting of points A, B, C, D, E, F, G, H, I, J, K and L and lines A–B, B–C, C–D, D–E, E–F, F–G, G–H, H–I, I–J, J–K, K–L and L–A; the point A being given by a coordinate point (kh1=0.30, kh2=0.87); the point B being given by a coordinate point (kh1=0.54, kh2=0.87); the point C being given by a coordinate point (kh1=0.60, kh2=0.87); the point D being given by a coordinate point (kh1=0.81, kh2=0.97); the point E being given by a coordinate point (kh1=1.16, kh2=1.20); the point F being given by a coordinate point (kh1=1.52, kh2=0.93); the point G being given by a coordinate point (kh1=1.69, kh2=0.77); the point H being given by a coordinate point (kh1=1.31, kh2=0.59); the point I being given by a coordinate point (kh1=1.04, kh2=0.50); the point J being given by a coordinate point (kh1=0.68, kh2=0.40); the point K being given by a coordinate point (kh1=0.63, kh2=0.33); and the point L being given by a coordinate point (kh1=0.30, kh2=0.63). The layer structure of this SAW device is schematically illustrated in FIG. 6C, "type C".

The 21st SAW device having above constitution is provided with propagation velocity V of 8,000 (m/s) or higher, temperature coefficient for frequency TCF of from −15 to 15 (ppm/°C.) and effective coupling coefficient $K^2$ of from 0.12 to 0.85 (%). Further, such constitution is more advantageous in manufacturing. Processing temperature for forming ZnO layer is not strictly limited when the "type C" constitution is employed, because the formation of ZnO layer, which requires relatively higher processing temperature, is accomplished before forming IDT which has relatively low melting/softening point.

A 22nd surface acoustic wave device according to the present invention is also a "type C" SAW device, wherein the parameters kh1 and kh2 are given within a region ABIJKLA in the two-dimensional Cartesian coordinate graph, the outer edge of the region ABIJKLA being given by a closed chain in the Cartesian coordinate, consisting of the points A, B, I, J, K and L, and lines A–B, B–I, I–J, J–K, K–L and L–A.

The 22nd SAW device having this constitution is provided with propagation velocity V of from 10,000 or higher (m/s), temperature coefficient for frequency TCF of from −15 to 15 (ppm/°C.) and effective coupling coefficient $K^2$ of from 0.12 to 0.85 (%). Further, such constitution is more advantageous in manufacturing, as discussed in the 21 SAW device.

The two-dimensional Cartesian coordinate graph having abscissa axis of kh1 and ordinate axis of kh2 is shown in FIG. 1. The region ABCDEFGHIJKLA and the region ABIJKLA are also shown in FIG. 1.

A 23rd surface acoustic wave device for 2nd mode surface acoustic wave of a wavelength $\lambda$ (μm) according to the present invention comprises: (i) a diamond layer, (ii) a ZnO layer disposed on the diamond layer, the ZnO layer having a thickness $t_z$, (iii) an interdigital transducer (IDT) disposed on the ZnO layer, the IDT having a thickness of $t_A$, (iv) a $SiO_2$ layer disposed over the interdigital transducer onto the ZnO layer, the $SiO_2$ layer having a thickness of $t_s$, and (v) a short circuit electrode disposed on the $SiO_2$ layer; wherein a parameter kh3=$2\pi(t_A/\lambda)$ is: $0.099 \leq kh3 \leq 0.165$, and wherein a parameter kh1=$2\pi(t_s/\lambda)$ and a parameter kh2=$2\pi(t_z/\lambda)$ are given within a region ABCDEFGHIJKLMA in a two-dimensional Cartesian coordinate graph having abscissa axis of kh1 and ordinate axis of kh2, the outer edge of the region ABCDEFGHIJKLMA being given by a closed chain in the Cartesian coordinate consisting of points A, B, C, D, E, F, G, H, I, J, K, L and M and lines A–B, B–C, C–D, D–E, E–F, F–G, G–H, H–I, I–J, J–K, K–L, L–M and M–A; the point A being given by a coordinate point (kh1=0.30, kh2=0.98); the point B being given by a coordinate point (kh1=0.40, kh2=0.95); the point C being given by a coordinate point (kh1=0.45, kh2=0.96); the point D being given by a coordinate point (kh1=0.60, kh2=1.00); the point E being given by a coordinate point (kh1=1.04, kh2=1.25); the point F being given by a coordinate point (kh1=1.53, kh2=0.89); the point G being given by a coordinate point (kh1=1.60, kh2=0.80); the point H being given by a coordinate point (kh1=1.22, kh2=0.63); the point I being given by a coordinate point (kh1=1.00, kh2=0.59); the point J being given by a coordinate point (kh1=0.89, kh2=0.57); the point K being given by a coordinate point (kh1=0.53, kh2=0.52); the point L being given by a coordinate point (kh1=0.53, kh2=0.45); and the point M being given by a coordinate point (kh1=0.30, kh2=0.65). The layer structure of this SAW device is schematically illustrated in FIG. 6C, "type C".

The 23rd SAW device having above constitution is provided with propagation velocity V of 8,000 (m/s) or higher, temperature coefficient for frequency TCF of from −15 to 15 (ppm/°C.) and effective coupling coefficient $K^2$ of from 0.05 to 0.85 (%). Further, such constitution is more advantageous in manufacturing, as mentioned in the 21st SAW device.

A 24th surface acoustic wave device according to the present invention, wherein the parameters kh1 and kh2 are given within a region ABCNJKLMA in the two-dimensional Cartesian coordinate graph, the outer edge of the region ABCNJKLMA being given by a closed chain in the Cartesian coordinate, consisting of the points A, B and C, a point N, and the points J, K, L, and M, and lines A–B, B–C, C–N, N–J, J–K, K–L, L–M and M–A, the point N being given by a coordinate point (kh1=0.62, kh2=0.77).

The 24th SAW device having this constitution is provided with propagation velocity V of from 10,000 or higher (m/s), temperature coefficient for frequency TCF of from −15 to 15 (ppm/°C.) and effective coupling coefficient $K^2$ of from 0.05 to 0.80 (%). Further, such constitution is more advantageous in manufacturing, as discussed in the 21st SAW device.

The two-dimensional Cartesian coordinate graph having abscissa axis of kh1 and ordinate axis of kh2 is shown in FIG. 2. The region ABCDEFGHIJKLMA and the region ABCNJKLMA are also shown in FIG. 2.

A 25th surface acoustic wave device for 2nd mode surface acoustic wave of a wavelength λ (μm) according to the present invention comprises: (i) a diamond layer, (ii) a ZnO layer disposed on the diamond layer, the ZnO layer having a thickness $t_z$, (iii) an interdigital transducer (IDT) disposed on the ZnO layer, the IDT having a thickness of $t_A$, (iv) a $SiO_2$ layer disposed over the interdigital transducer onto the ZnO layer, the $SiO_2$ layer having a thickness of $t_s$, and (v) a short circuit electrode disposed on the $SiO_2$ layer; wherein a parameter kh3=$2\pi(t_A/\lambda)$ is: $0.165 \leq kh3 \leq 0.231$, and wherein a parameter kh1=$2\pi(t_z/\lambda)$ and a parameter kh2=$2\pi(t_s/\lambda)$ are given within a region ABCDEFGHIJKLMA in a two-dimensional Cartesian coordinate graph having abscissa axis of kh1 and ordinate axis of kh2, the outer edge of the region ABCDEFGHIJKLMA being given by a closed chain in the Cartesian coordinate consisting of points A, B, C, D, E, F, G, H, I, J, K, L and M and lines A–B, B–C, C–D, D–E, E–F, F–G, G–H, H–I, I–J, J–K, K–L, L–M and M–A; the point A being given by a coordinate point (kh1=0.30, kh2=1.07); the point B being given by a coordinate point (kh1=0.36, kh2=1.07); the point C being given by a coordinate point (kh1=0.43, kh2=1.07); the point D being given by a coordinate point (kh1=0.90, kh2=1.37); the point E being given by a coordinate point (kh1=1.05, kh2=1.20); the point F being given by a coordinate point (kh1=1.52, kh2=0.85); the point G being given by a coordinate point (kh1=1.34, kh2=0.79); the point H being given by a coordinate point (kh1=1.05, kh2=0.72); the point I being given by a coordinate point (kh1=0.85, kh2=0.68); the point J being given by a coordinate point (kh1=0.71, kh2=0.68); the point K being given by a coordinate point (kh1=0.38, kh2=0.68); the point L being given by a coordinate point (kh1=0.42, kh2=0.55); and the point M being given by a coordinate point (kh1=0.30, kh2=0.65). The layer structure of this SAW device is schematically illustrated in FIG. 6C, "type C".

The 25th SAW device having above constitution is provided with propagation velocity V of 8,000 (m/s) or higher, temperature coefficient for frequency TCF of from −15 to 15 (ppm/°C.) and effective coupling coefficient $K^2$ of from 0.05 to 0.85 (%). Further, such constitution is more advantageous in manufacturing, as mentioned in the 21st SAW device.

A 26th surface acoustic wave device according to the present invention is also a "type C" SAW device, wherein the parameters kh1 and kh2 are given within a region ABNOJKLMA in the two-dimensional Cartesian coordinate graph, the outer edge of the region ABCNJKLMA being given by a closed chain in the Cartesian coordinate, consisting of the points A, B and C, a point N, a point O, and the points J, K, L, and M, and lines A–B, B–C, C–N, N–J, J–K, K–L, L–M and M–A, the point N being given by a coordinate point (kh1=0.43, kh2=0.95); and the point O being given by a coordinate point (kh1=0.61, kh2=0.75).

The 26th SAW device having this constitution is provided with propagation velocity V of from 10,000 or higher (m/s), temperature coefficient for frequency TCF of from −15 to 15 (ppm/°C.) and effective coupling coefficient $K^2$ of from 0.05 to 0.65 (%). Further, such constitution is more advantageous in manufacturing, as discussed in the 21st SAW device.

The two-dimensional Cartesian coordinate graph having abscissa axis of kh1 and ordinate axis of kh2 is shown in FIG. 3. The region ABCDEFGHIJKLMA and the region ABNOJKLMA are also shown in FIG. 3.

A 27th surface acoustic wave device for 2nd mode surface acoustic wave of a wavelength λ (μm) according to the present invention comprises: (i) a diamond layer, (ii) a ZnO layer disposed on the diamond layer, the ZnO layer having a thickness $t_z$, (iii) an interdigital transducer (IDT) disposed on the ZnO layer, the IDT having a thickness of $t_A$, (iv) a $SiO_2$ layer disposed over the interdigital transducer onto the ZnO layer, the $SiO_2$ layer having a thickness of $t_s$, and (v) a short circuit electrode disposed on the $SiO_2$ layer; wherein a parameter kh3=$2\pi(t_A/\lambda)$ is: $0.231 \leq kh3 \leq 0.297$, and wherein a parameter kh1=$2\pi(t_z/\lambda)$ and a parameter kh2=$2\pi(t_s/\lambda)$ are given within a region ABCDEFGHIJKLMNA in a two-dimensional Cartesian coordinate graph having abscissa axis of kh1 and ordinate axis of kh2, the outer edge of the region ABCDEFGHIJKLMNA being given by a closed chain in the Cartesian coordinate consisting of points A, B, C, D, E, F, G, H, I, J, K, L, M and N and lines A–B, B–C, C–D, D–E, E–F, F–G, G–H, H–I, I–J, J–K, K–L, L–M, M–N and N–A; the point A being given by a coordinate point (kh1=0.30, kh2=1.15); the point B being given by a coordinate point (kh1=0.38, kh2=1.20); the point C being given by a coordinate point (kh1=0.46, kh2=1.32); the point D being given by a coordinate point (kh1=0.60, kh2=1.52); the point E being given by a coordinate point (kh1=0.73, kh2=1.60); the point F being given by a coordinate point (kh1=0.81, kh2=1.44); the point G being given by a coordinate point (kh1=1.00, kh2=1.20); the point H being given by a coordinate point (kh1=1.40, kh2=0.91); the point I being given by a coordinate point (kh1=1.14, kh2=0.83); the point J being given by a coordinate point (kh1=0.83, kh2=0.76); the point K being given by a coordinate point (kh1=0.60, kh2=0.73); the point L being given by a coordinate point (kh1=0.35, kh2=0.73); the point M being given by a coordinate point (kh1=0.38, kh2=0.63); and the point N being given by a coordinate point (kh1=0.30, kh2=0.65). The layer structure of this SAW device is schematically illustrated in FIG. 6C, "type C".

The 27th SAW device having above constitution is provided with propagation velocity V of 8,000 (m/s) or higher, temperature coefficient for frequency TCF of from −15 to 15 (ppm/°C.) and effective coupling coefficient $K^2$ of from 0.05 to 0.82 (%). Further, such constitution is more advantageous in manufacturing, as mentioned in the 21st SAW device.

A 28th surface acoustic wave device according to the present invention is also a "type C" SAW device, wherein the parameters kh1 and kh2 are given within a region AOPKLMNA in the two-dimensional Cartesian coordinate graph, the outer edge of the region AOPKLMNA being given by a closed chain in the Cartesian coordinate, consisting of the point A, a point O, a point P, and the points K, L, M and N, and lines A–O, O–P, P–K, K–L, L–M, M–N and N–A, the point O being given by a coordinate point (kh1=0.36, kh2=1.00); and the point P being given by a coordinate point (kh1=0.48, kh2=0.83).

The 28th SAW device having this constitution is provided with propagation velocity V of from 10,000 or higher (m/s), temperature coefficient for frequency TCF of from −15 to 15 (ppm/°C.) and effective coupling coefficient $K^2$ of from 0.05 to 0.50 (%). Further, such constitution is more advantageous in manufacturing, as discussed in the 21st SAW device.

The two-dimensional Cartesian coordinate graph having abscissa axis of kh1 and ordinate axis of kh2 is shown in FIG. 4. The region ABCDEFGHIJKLMNA and the region AOPKLMNA are also shown in FIG. 4.

A 29th surface acoustic wave device for 2nd mode surface acoustic wave of a wavelength λ (μm) according to the present invention comprises: (i) a diamond layer, (ii) a ZnO layer disposed on the diamond layer, the ZnO layer having a thickness $t_z$, (iii) an interdigital transducer (IDT) disposed on the ZnO layer, the IDT having a thickness of $t_A$, (iv) a SiO$_2$ layer disposed over the interdigital transducer onto the ZnO layer, the SiO$_2$ layer having a thickness of $t_s$, and (v) a short circuit electrode disposed on the SiO$_2$ layer; wherein a parameter kh3=2π($t_A$/λ) is: 0.297≦kh3≦0.363, and wherein a parameter kh1=2π($t_z$/λ) and a parameter kh2=2π($t_s$/λ) are given within a region ABCDEFGHIJKLA in a two-dimensional Cartesian coordinate graph having abscissa axis of kh1 and ordinate axis of kh2, the outer edge of the region ABCDEFGHIJKLA being given by a closed chain in the Cartesian coordinate consisting of points A, B, C, D, E, F, G, H, I, J, K and L and lines A–B, B–C, C–D, D–E, E–F, F–G, G–H, H–I, I–J, J–K, K–L and L–A; the point A being given by a coordinate point (kh1=0.30, kh2=1.29); the point B being given by a coordinate point (kh1=0.33, kh2=1.36); the point C being given by a coordinate point (kh1=0.40, kh2=1.60); the point D being given by a coordinate point (kh1=0.71, kh2=1.60); the point E being given by a coordinate point (kh1=0.82, kh2=1.41); the point F being given by a coordinate point (kh1=1.00, kh2=1.22); the point G being given by a coordinate point (kh1=1.27, kh2=0.97); the point H being given by a coordinate point (kh1=1.03, kh2=0.89); the point I being given by a coordinate point (kh1=0.68, kh2=0.78); the point J being given by a coordinate point (kh1=0.52, kh2=0.77); the point K being given by a coordinate point (kh1=0.30, kh2=0.76); and the point L being given by a coordinate point (kh1=0.30, kh2=1.09). The layer structure of this SAW device is schematically illustrated in FIG. 6C, "type C".

The 29th SAW device having above constitution is provided with propagation velocity V of 8,000 (m/s) or higher, temperature coefficient for frequency TCF of from −15 to 15 (ppm/°C.) and effective coupling coefficient K$^2$ of from 0.05 to 0.75 (%). Further, such constitution is more advantageous in manufacturing, as mentioned in the 21st SAW device.

A 30th surface acoustic wave device according to the present invention, wherein the parameters kh1 and kh2 are given within a region LMJKL in the two-dimensional Cartesian coordinate graph, the outer edge of the region LMJKL being given by a closed chain in the Cartesian coordinate, consisting of the point L, a point M, and the points J and K, and lines L–M, M–J, J–K and K–L, the point M being given by a coordinate point (kh1=0.37, kh2=0.94).

The 30th SAW device having this constitution is provided with propagation velocity V of from 10,000 or higher (m/s), temperature coefficient for frequency TCF of from −15 to 15 (ppm/°C.) and effective coupling coefficient K$^2$ of from 0.07 to 0.35 (%). Further, such constitution is more advantageous in manufacturing, as discussed in the 21st SAW device.

The two-dimensional Cartesian coordinate graph having abscissa axis of kh1 and ordinate axis of kh2 is shown in FIG. 5. The region ABCDEFGHIJKLA and the region LMJKL are also shown in FIG. 5.

A 31st surface acoustic wave device for 2nd mode surface acoustic wave of a wavelength λ (μm) according to the present invention comprises: (i) a diamond layer, (ii) a first short circuit electrode disposed on the diamond layer, (iii) a ZnO layer disposed over the short circuit electrode onto the diamond layer, the ZnO layer having a thickness $t_z$, (iv) an interdigital transducer (IDT) disposed on the ZnO layer, the IDT having a thickness of $t_A$, (v) an SiO$_2$ layer disposed over the interdigital transducer onto the ZnO layer, the SiO$_2$ layer having a thickness of $t_s$, and (vi) a second short circuit electrode disposed on the SiO$_2$ layer; wherein a parameter kh3=2π($t_A$/λ) is: 0.033≦kh3≦0.099, and wherein a parameter kh1=2π($t_z$/λ) and a parameter kh2=2π($t_s$/λ) are given within a region ABCDEFGHIJKLA in a two-dimensional Cartesin coordinate graph having abscissa axis of kh1 and ordinate axis of kh2, the outer edge of the region ABCDEFGHIJKLA being given by a closed chain in the Cartesian coordinate consisting of points A, B, C, D, E, F, G, H, I, J, K and L and lines A–B, B–C, C–D, D–E, E–F, F–G, G–H, H–I, I–J, J–K, K–L and L–A; the point A being given by a coordinate point (kh1=0.30, kh2=0.87); the point B being given by a coordinate point (kh1=0.54, kh2=0.87); the point C being given by a coordinate point (kh1=0.60, kh2=0.87); the point D being given by a coordinate point (kh1=0.81, kh2=0.97); the point E being given by a coordinate point (kh1=1.16, kh2=1.20); the point F being given by a coordinate point (kh1=1.52, kh2=0.93); the point G being given by a coordinate point (kh1=1.69, kh2=0.77); the point H being given by a coordinate point (kh1=1.31, kh2=0.59); the point I being given by a coordinate point (kh1=1.04, kh2=0.50); the point J being given by a coordinate point (kh1=0.68, kh2=0.40); the point K being given by a coordinate point (kh1=0.63, kh2=0.33); and the point L being given by a coordinate point (kh1=0.30, kh2=0.63). The layer structure of this SAW device is schematically illustrated in FIG. 6D, "type D".

The 31st SAW device having above constitution is provided with propagation velocity V of 8,000 (m/s) or higher, temperature coefficient for frequency TCF of from −15 to 15 (ppm/°C.) and effective coupling coefficient K$^2$ of from 0.85 to 2.0 (%). Further, such constitution is advantageous in manufacturing, because ZnO having better formability is employed.

A 32nd surface acoustic wave device according to the present invention is also a "type D" SAW device, wherein the parameters kh1 and kh2 are given within a region ABIJKLA in the two-dimensional Cartesian coordinate graph, the outer edge of the region ABIJKLA being given by a closed chain in the Cartesian coordinate, consisting of the points A, B, I, J, K and L, and lines A–B, B–I, I–J, J–K, K–L and L–A.

The 32nd SAW device having this constitution is provided with propagation velocity V of from 10,000 or higher (m/s), temperature coefficient for frequency TCF of from −15 to 15 (ppm/°C.) and effective coupling coefficient K$^2$ of from 1.05 to 2.0 (%). Further, such constitution is advantageous in manufacturing, as discussed in the 31st SAW device.

The two-dimensional Cartesian coordinate graph having abscissa axis of kh1 and ordinate axis of kh2 is shown in FIG. 1. The region ABCDEFGHIJKLA and the region ABIJKLA are also shown in FIG. 1.

A 33rd surface acoustic wave device for 2nd mode surface acoustic wave of a wavelength λ (μm) according to the present invention comprises: (i) a diamond layer, (ii) a first short circuit electrode disposed on the diamond layer, (iii) a ZnO layer disposed over the short circuit electrode onto the diamond layer, the ZnO layer having a thickness $t_z$, (iv) an interdigital transducer (IDT) disposed on the ZnO layer, the IDT having a thickness of $t_A$, (v) an SiO$_2$ layer disposed over the interdigital transducer onto the ZnO layer, the SiO$_2$ layer having a thickness of $t_s$, and (vi) a second short circuit electrode disposed on the SiO$_2$ layer; wherein a parameter kh3=2π($t_A$/λ) is: 0.099≦kh3≦0.165, and wherein a parameter kh1=2π($t_z$/λ) and a parameter kh2=2π($t_s$/λ) are given within a region ABCDEFGHIJKLMA in a two-dimensional Cartesian coordinate graph having abscissa axis of kh1 and ordinate axis of kh2, the outer edge of the region ABCDEFGHIJKLMA being given by a closed chain in the Cartesian coordinate consisting of points A, B, C, D, E, F, G, H, I, J, K, L and M and lines A–B, B–C, C–D, D–E, E–F, F–G, G–H, H–I, I–J, J–K, K–L, L–M and M–A; the point A being given by a coordinate point (kh1=0.30, kh2=0.98); the point B being given by a coordinate point (kh1=0.40, kh2=0.95); the point C being given by a coordinate point (kh1=0.45, kh2=0.96); the point D being given by a coordinate point (kh1=0.60, kh2=1.00); the point E being given by a coordinate point (kh1=1.04, kh2=1.25); the point F being given by a coordinate point (kh1=1.53, kh2=0.89); the point G being given by a coordinate point (kh1=1.60, kh2=0.80); the point H being given by a coordinate point (kh1=1.22, kh2=0.63); the point I being given by a coordinate point (kh1=1.00, kh2=0.59); the point J being given by a coordinate point (kh1=0.89, kh2=0.57); the point K being given by a coordinate point (kh1=0.53, kh2=0.52); the point L being given by a coordinate point (kh1=0.53, kh2=0.45); and the point M being given by a coordinate point (kh1=0.30, kh2=0.65). The layer structure of this SAW device is schematically illustrated in FIG. 6D, "type D".

The 33rd SAW device having above constitution is provided with propagation velocity V of 8,000 (m/s) or higher, temperature coefficient for frequency TCF of from −15 to 15 (ppm/°C.) and effective coupling coefficient $K^2$ of from 0.75 to 1.80 (%). Further, such constitution is advantageous in manufacturing, as mentioned in the 31st SAW device.

A 34th surface acoustic wave device according to the present invention is also a "type D" SAW device, wherein the parameters kh1 and kh2 are given within a region ABCNJKLMA in the two-dimensional Cartesian coordinate graph, the outer edge of the region ABCNJKLMA being given by a closed chain in the Cartesian coordinate, consisting of the points A, B and C, a point N, and the points J, K, L, and M, and lines A–B, B–C, C–N, N–J, J–K, K–L, L–M and M–A, the point N being given by a coordinate point (kh1=0.62, kh2=0.77).

The 34th SAW device having this constitution is provided with propagation velocity V of from 10,000 or higher (m/s), temperature coefficient for frequency TCF of from −15 to 15 (ppm/°C.) and effective coupling coefficient $K^2$ of from 0.75 to 1.80 (%). Further, such constitution is advantageous in manufacturing, as discussed in the 31st SAW device.

The two-dimensional Cartesian coordinate graph having abscissa axis of kh1 and ordinate axis of kh2 is shown in FIG. 2. The region ABCDEFGHIJKLMA and the region ABCNJKLMA are also shown in FIG. 2.

A 35th surface acoustic wave device for 2nd mode surface acoustic wave of a wavelength λ (μm) according to the present invention comprises: (i) a diamond layer, (ii) a first short circuit electrode disposed on the diamond layer, (iii) a ZnO layer disposed over the short circuit electrode onto the diamond layer, the ZnO layer having a thickness $t_z$, (iv) an interdigital transducer (IDT) disposed on the ZnO layer, the IDT having a thickness of $t_A$, (v) an SiO$_2$ layer disposed over the interdigital transducer onto the ZnO layer, the SiO$_2$ layer having a thickness of $t_s$, and (vi) a second short circuit electrode disposed on the SiO$_2$ layer; wherein a parameter kh3=2π($t_A$/λ) is: 0.165≦kh3<0.231, and wherein a parameter kh1=2π($t_z$/λ) and a parameter kh2=2π($t_s$/λ) are given within a region ABCDEFGHIJKLMA in a two-dimensional Cartesian coordinate graph having abscissa axis of kh1 and ordinate axis of kh2, the outer edge of the region ABCDEFGHIJKLMA being given by a closed chain in the Cartesian coordinate consisting of points A, B, C, D, E, F, G, H, I, J, K, L and M and lines A–B, B–C, C–D, D–E, E–F, F–G, G–H, H–I, I–J, J–K, K–L, L–M and M–A; the point A being given by a coordinate point (kh1=0.30, kh2=1.07); the point B being given by a coordinate point (kh1=0.36, kh2=1.07); the point C being given by a coordinate point (kh1=0.43, kh2=1.07); the point D being given by a coordinate point (kh1=0.90, kh2=1.37); the point E being given by a coordinate point (kh1=1.05, kh2=1.20); the point F being given by a coordinate point (kh1=1.52, kh2=0.85); the point G being given by a coordinate point (kh1=1.34, kh2=0.79); the point H being given by a coordinate point (kh1=1.05, kh2=0.72); the point I being given by a coordinate point (kh1=0.85, kh2=0.68); the point J being given by a coordinate point (kh1=0.71, kh2=0.68); the point K being given by a coordinate point (kh1=0.38, kh2=0.68); the point L being given by a coordinate point (kh1=0.42, kh2=0.55); and the point M being given by a coordinate point (kh1=0.30, kh2=0.65). The layer structure of this SAW device is schematically illustrated in FIG. 6D, "type D".

The 35th SAW device having above constitution is provided with propagation velocity V of 8,000 (m/s) or higher, temperature coefficient for frequency TCF of from −15 to 15 (ppm/°C.) and effective coupling coefficient $K^2$ of from 0.65 to 1.7 (%). Further, such constitution is advantageous in manufacturing, as mentioned in the 31st SAW device.

A 36th surface acoustic wave device according to the present invention is also a "type D" SAW device, wherein the parameters kh1 and kh2 are given within a region ABNOJKLMA in the two-dimensional Cartesian coordinate graph, the outer edge of the region ABCNJKLMA being given by a closed chain in the Cartesian coordinate, consisting of the points A, B and C, a point N, a point O, and the points J, K, L, and M, and lines A–B, B–C, C–N, N–J, J–K, K–L, L–M and M–A, the point N being given by a coordinate point (kh1=0.43, kh2=0.95); and the point O being given by a coordinate point (kh1=0.61, kh2=0.75).

The 36th SAW device having this constitution is provided with propagation velocity V of from 10,000 or higher (m/s), temperature coefficient for frequency TCF of from −15 to 15 (ppm/°C.) and effective coupling coefficient $K^2$ of from 0.65 to 1.7 (%). Further, such constitution is advantageous in manufacturing, as discussed in the 31st SAW device.

The two-dimensional Cartesian coordinate graph having abscissa axis of kh1 and ordinate axis of kh2 is shown in FIG. 3. The region ABCDEFGHIJKLMA and the region ABNOJKLMA are also shown in FIG. 3.

A 37th surface acoustic wave device for 2nd mode surface acoustic wave of a wavelength λ (μm) according to the present invention comprises: (i) a diamond layer, (ii) a first short circuit electrode disposed on the diamond layer, (iii) a ZnO layer disposed over the short circuit electrode onto the diamond layer, the ZnO layer having a thickness $t_z$, (iv) an interdigital transducer (IDT) disposed on the ZnO layer, the IDT having a thickness of $t_A$, (v) an SiO$_2$ layer disposed over the interdigital transducer onto the ZnO layer, the SiO$_2$ layer having a thickness of $t_s$, and (vi) a second short circuit electrode disposed on the SiO$_2$ layer; wherein a parameter kh3=2π($t_A$/λ) is: 0.231≦kh3≦0.297, and wherein a parameter kh1=2π($t_z$/λ) and a parameter kh2=2π($t_s$/λ) are given within a region ABCDEFGHIJKLMNA in a two-dimensional Cartesian coordinate graph having abscissa axis of kh1 and ordinate axis of kh2, the outer edge of the region ABCDEFGHIJKLMNA being given by a closed chain in the Cartesian coordinate consisting of points A, B, C, D, E, F, G, H, I, J, K, L, M and N and lines A–B, B–C, C–D, D–E, E–F, F–G, G–H, H–I, I–J, J–K, K–L, L–M, M–N and N–A; the point A being given by a coordinate point (kh1=0.30, kh2=1.15); the point B being given by a coordinate point (kh1=0.38, kh2=1.20); the point C being given by a coordinate point (kh1=0.46, kh2=1.32); the point D being given by a coordinate point (kh1=0.60, kh2=1.52); the point E being given by a coordinate point (kh1=0.73, kh2=1.60); the point F being given by a coordinate point (kh1=0.81, kh2=1.44); the point G being given by a coordinate point (kh1=1.00, kh2=1.20); the point H being given by a coordinate point (kh1=1.40, kh2=0.91); the point I being given by a coordinate point (kh1=1.14, kh2=0.83); the point J being given by a coordinate point (kh1=0.83, kh2=0.76); the point K being given by a coordinate point (kh1=0.60, kh2=0.73); the point L being given by a coordinate point (kh1=0.35, kh2=0.73); the point M being given by a coordinate point (kh1=0.38, kh2=0.63); and the point N being given by a coordinate point (kh1=0.30, kh2=0.65). The layer structure of this SAW device is schematically illustrated in FIG. 6D, "type D".

The 37th SAW device having above constitution is provided with propagation velocity V of 8,000 (m/s) or higher, temperature coefficient for frequency TCF of from −15 to 15 (ppm/°C.) and effective coupling coefficient $K^2$ of from 0.55 to 1.6 (%). Further, such constitution is advantageous in manufacturing, as mentioned in the 31st SAW device.

A 38th surface acoustic wave device according to the present invention is also a "type D" SAW device, wherein the parameters kh1 and kh2 are given within a region AOPKLMNA in the two-dimensional Cartesian coordinate graph, the outer edge of the region AOPKLMNA being given by a closed chain in the Cartesian coordinate, consisting of the point A, a point O, a point P, and the points K, L, M and N, and lines A–O, O–P, P–K, K–L, L–M, M–N and N–A, the point O being given by a coordinate point (kh1=0.36, kh2=1.00); and the point P being given by a coordinate point (kh1=0.48, kh2=0.83).

The 38th SAW device having this constitution is provided with propagation velocity V of from 10,000 or higher (m/s), temperature coefficient for frequency TCF of from −15 to 15 (ppm/°C.) and effective coupling coefficient $K^2$ of from 0.55 to 1.6 (%). Further, such constitution is advantageous in manufacturing, as discussed in the 31st SAW device.

The two-dimensional Cartesian coordinate graph having abscissa axis of kh1 and ordinate axis of kh2 is shown in FIG. 4. The region ABCDEFGHIJKLMNA and the region AOPKLMNA are also shown in FIG. 4.

A 39th surface acoustic wave device for 2nd mode surface acoustic wave of a wavelength λ (μm) according to the present invention comprises: (i) a diamond layer, (ii) a first short circuit electrode disposed on the diamond layer, (iii) a ZnO layer disposed over the short circuit electrode onto the diamond layer, the ZnO layer having a thickness $t_z$, (iv) an interdigital transducer (IDT) disposed on the ZnO layer, the IDT having a thickness of $t_A$, (v) an SiO$_2$ layer disposed over the interdigital transducer onto the ZnO layer, the SiO$_2$ layer having a thickness of $t_s$, and (vi) a second short circuit electrode disposed on the SiO$_2$ layer; wherein a parameter kh3=2π($t_A$/λ) is: 0.297≦kh3≦0.363, and wherein a parameter kh1=2π($t_z$/λ) and a parameter kh2=2π($t_s$/λ) are given within a region ABCDEFGHIJKLA in a two-dimensional Cartesian coordinate graph having abscissa axis of kh1 and ordinate axis of kh2, the outer edge of the region ABCDEFGHIJKLA being given by a closed chain in the Cartesian coordinate consisting of points A, B, C, D, E, F, G, H, I, J, K and L and lines A–B, B–C, C–D, D–E, E–F, F–G, G–H, H–I, I–J, J–K, K–L and L–A; the point A being given by a coordinate point (kh1=0.30, kh2=1.29); the point B being given by a coordinate point (kh1=0.33, kh2=1.36); the point C being given by a coordinate point (kh1=0.40, kh2=1.60); the point D being given by a coordinate point (kh1=0.71, kh2=1.60); the point E being given by a coordinate point (kh1=0.82, kh2=1.41); the point F being given by a coordinate point (kh1=1.00, kh2=1.22); the point G being given by a coordinate point (kh1=1.27, kh2=0.97); the point E being given by a coordinate point (kh1=1.03, kh2=0.89); the point I being given by a coordinate point (kh1=0.68, kh2=0.78); the point J being given by a coordinate point (kh1=0.52, kh2=0.77); the point K being given by a coordinate point (kh1=0.30, kh2=0.76); and the point L being given by a coordinate point (kh1=0.30, kh2=1.09). The layer structure of this SAW device is schematically illustrated in FIG. 6D, "type D".

The 39th SAW device having above constitution is provided with propagation velocity V of 8,000 (m/s) or higher, temperature coefficient for frequency TCF of from −15 to 15 (ppm/°C.) and effective coupling coefficient $K^2$ of from 0.40 to 1.4 (%). Further, such constitution is advantageous in manufacturing, as mentioned in the 31st SAW device.

A 40th surface acoustic wave device according to the present invention is also a "type D" SAW device, wherein the parameters kh1 and kh2 are given within a region LMJKL in the two-dimensional Cartesian coordinate graph, the outer edge of the region LMJKL being given by a closed chain in the Cartesian coordinate, consisting of the point L, a point M, and the points J and K, and lines L–M, M–J, J–K and K–L, the point M being given by a coordinate point (kh1=0.37, kh2=0.94).

The 40th SAW device having this constitution is provided with propagation velocity V of from 10,000 or higher (m/s), temperature coefficient for frequency TCF of from −15 to 15 (ppm/°C.) and effective coupling coefficient $K^2$ of from 0.60 to 1.4 (%). Further, such constitution is advantageous in manufacturing, as discussed in the 31st SAW device.

The two-dimensional Cartesian coordinate graph having abscissa axis of kh1 and ordinate axis of kh2 is shown in FIG. 5. The region ABCDEFGHIJKLA and the region LMJKL are also shown in FIG. 5.

A 41st surface acoustic wave device for 2nd mode surface acoustic wave of a wavelength λ (μm) according to the present invention comprises: (i) a diamond layer, (ii) an interdigital transducer (IDT) disposed on the diamond layer, the IDT having a thickness of $t_A$, (iii) a ZnO layer disposed over the interdigital transducer onto the diamond layer, the ZnO layer having a thickness $t_z$, (iv) a short circuit electrode disposed on the ZnO layer, and (v) an SiO$_2$ layer disposed over the short circuit electrode onto the ZnO layer, the SiO$_2$ layer having a thickness of $t_s$; wherein a parameter kh3=2π($t_A$/λ) is: 0.033≦kh3≦0.099, and wherein a parameter kh1=2π($t_z$/λ) and a parameter kh2=2π($t_s$/λ) are given within a region ABCDEFGHIJKLA in a two-dimensional Cartesin coordinate graph having abscissa axis of kh1 and ordinate axis of kh2, the outer edge of the region ABCDEFGHIJKLA being given by a closed chain in the Cartesian coordinate consisting of points A, B, C, D, E, F, G, H, I, J, K and L and lines A–B, B–C, C–D, D–E, E–F, F–G, G–H, H–I, I–J, J–K, K–L and L–A; the point A being given by a coordinate point (kh1=0.30, kh2=0.87); the point B being given by a coordinate point (kh1=0.54, kh2=0.87); the point C being given by a coordinate point (kh1=0.60, kh2=0.87); the point D being given by a coordinate point (kh1=0.81, kh2=0.97); the point E being given by a coordinate point (kh1=1.16, kh2=1.20); the point F being given by a coordinate point (kh1=1.52, kh2=0.93); the point G being given by a coordinate point (kh1=1.69, kh2=0.77); the point H being given by a coordinate point (kh1=1.31, kh2=0.59); the point I being given by a coordinate point (kh1=1.04, kh2=0.50); the point J being given by a coordinate point (kh1=0.68, kh2=0.40); the point K being given by a coordinate point (kh1=0.63, kh2=0.33); and the point L being given by a coordinate point (kh1=0.30, kh2=0.63). The layer structure of this SAW device is schematically illustrated in FIG. 6F, "type F".

The 41st SAW device having above constitution is provided with propagation velocity V of 8,000 (m/s) or higher, temperature coefficient for frequency TCF of from −15 to 15 (ppm/°C.) and effective coupling coefficient $K^2$ of from 0.2 to 1.6 (%). Further, such constitution is advantageous in manufacturing, because ZnO having better formability is employed.

A 42nd surface acoustic wave device according to present invention is also a "type F" SAW device, wherein the parameters kh1 and kh2 are given within a region ABIJKLA in the two-dimensional Cartesian coordinate graph, the outer edge of the region ABIJKLA being given by a closed chain in the Cartesian coordinate, consisting of the points A, B, I, J, K and L, and lines A–B, B–I, I–J, J–K, K–L and L–A.

The 42nd SAW device having this constitution is provided with propagation velocity V of from 10,000 or higher (m/s), temperature coefficient for frequency TCF of from −15 to 15 (ppm/°C.) and effective coupling coefficient $K^2$ of from 0.55 to 1.6 (%). Further, such constitution is advantageous in manufacturing, as discussed in the 41st SAW device.

The two-dimensional Cartesian coordinate graph having abscissa axis of kh1 and ordinate axis of kh2 is shown in FIG. 1. The region ABCDEFGHIJKLA and the region ABIJKLA are also shown in FIG. 1.

A 43rd surface acoustic wave device for 2nd mode surface acoustic wave of a wavelength λ (µm) according to the present invention comprises: (i) a diamond layer, (ii) an interdigital transducer (IDT) disposed on the diamond layer, the IDT having a thickness of $t_A$, (iii) a ZnO layer disposed over the interdigital transducer onto the diamond layer, the ZnO layer having a thickness $t_z$, (iv) a short circuit electrode disposed on the ZnO layer, and (v) an $SiO_2$ layer disposed over the short circuit electrode onto the ZnO layer, the $SiO_2$ layer having a thickness of $t_s$; wherein a parameter kh3=2π$(t_A/λ)$ is: 0.099≦kh3≦0.165, and wherein a parameter kh1= 2π$(t_z/λ)$ and a parameter kh2=2π$(t_s/λ)$ are given within a region ABCDEFGHIJKLMA in a two-dimensional Cartesian coordinate graph having abscissa axis of kh1 and ordinate axis of kh2, the outer edge of the region ABCDEFGHIJKLMA being given by a closed chain in the Cartesian coordinate consisting of points A, B, C, D, E, F, G, H, I, J, K, L and M and lines A–B, B–C, C–D, D–E, E–F, F–G, G–H, H–I, I–J, J–K, K–L, L–M and M–A; the point A being given by a coordinate point (kh1=0.30, kh2=0.98); the point B being given by a coordinate point (kh1=0.40, kh2=0.95); the point C being given by a coordinate point (kh1=0.45, kh2=0.96); the point D being given by a coordinate point (kh1=0.60, kh2=1.00); the point E being given by a coordinate point (kh1=1.04, kh2=1.25); the point F being given by a coordinate point (kh1=1.53, kh2=0.89); the point G being given by a coordinate point (kh1=1.60, kh2=0.80); the point H being given by a coordinate point (kh1=1.22, kh2=0.63); the point I being given by a coordinate point (kh1=1.00, kh2=0.59); the point J being given by a coordinate point (kh1=0.89, kh2=0.57); the point K being given by a coordinate point (kh1=0.53, kh2=0.52); the point L being given by a coordinate point (kh1=0.53, kh2=0.45); and the point M being given by a coordinate point (kh1=0.30, kh2=0.65). The layer structure of this SAW device is schematically illustrated in FIG. 6F, "type F".

The 43rd SAW device having above constitution is provided with propagation velocity V of 8,000 (m/s) or higher, temperature coefficient for frequency TCF of from −15 to 15 (ppm/°C.) and effective coupling coefficient $K^2$ of from 0.25 to 1.6 (%). Further, such constitution is advantageous in manufacturing, as mentioned in the 41st SAW device.

A 44th surface acoustic wave device according to the present invention is also a "type F" SAW device, wherein the parameters kh1 and kh2 are given within a region ABCN-JKLMA in the two-dimensional Cartesian coordinate graph, the outer edge of the region ABCNJKLMA being given by a closed chain in the Cartesian coordinate, consisting of the points A, B and C, a point N, and the points J, K, L, and M, and lines A–B, B–C, C–N, N–J, J–K, K–L, L–M and M–A, the point N being given by a coordinate point (kh1=0.62, kh2=0.77).

The 44th SAW device having this constitution is provided with propagation velocity V of from 10,000 or higher (m/s), temperature coefficient for frequency TCF of from −15 to 15 (ppm/°C.) and effective coupling coefficient $K^2$ of from 0.80 to 1.6 (%). Further, such constitution is advantageous in manufacturing, as discussed in the 41st SAW device.

The two-dimensional Cartesian coordinate graph having abscissa axis of kh1 and ordinate axis of kh2 is shown in FIG. 2. The region ABCDEFGHIJKLMA and the region ABCNJKLMA are also shown in FIG. 2.

A 45th surface acoustic wave device for 2nd mode surface acoustic wave of a wavelength λ (µm) according to the present invention comprises: (i) a diamond layer, (ii) an interdigital transducer (IDT) disposed on the diamond layer, the IDT having a thickness of $t_A$, (iii) a ZnO layer disposed over the interdigital transducer onto the diamond layer, the ZnO layer having a thickness $t_z$, (iv) a short circuit electrode disposed on the ZnO layer, and (v) an $SiO_2$ layer disposed over the short circuit electrode onto the ZnO layer, the $SiO_2$ layer having a thickness of $t_s$; wherein a parameter kh3=2π$(t_A/λ)$ is: 0.165≦kh3≦0.231, and wherein a parameter kh1= 2π$(t_z/λ)$ and a parameter kh2=2π$(t_s/λ)$ are given within a region ABCDEFGHIJKLMA in a two-dimensional Cartesian coordinate graph having abscissa axis of kh1 and ordinate axis of kh2, the outer edge of the region ABCDEFGHIJKLMA being given by a closed chain in the Cartesian coordinate consisting of points A, B, C, D, E, F, G, H, I, J, K, L and M and lines A–B, B–C, C–D, D–E, E–F, F–G, G–H, H–I, I–J, J–K, K–L, L–M and M–A; the point A being given by a coordinate point (kh1=0.30, kh2=1.07); the point B being given by a coordinate point (kh1=0.36, kh2=1.07); the point C being given by a coordinate point (kh1=0.43, kh2=1.07); the point D being given by a coordinate point (kh1=0.90, kh2=1.37); the point E being given by a coordinate point (kh1=1.05, kh2=1.20); the point F being given by a coordinate point (kh1=1.52, kh2=0.85); the point G being given by a coordinate point (kh1=1.34, kh2=0.79); the point H being given by a coordinate point (kh1=1.05, kh2=0.72); the point I being given by a coordinate point (kh1=0.85, kh2=0.68); the point J being given by a coordinate point (kh1=0.71, kh2=0.68); the point K being given by a coordinate point (kh1=0.38, kh2=0.68); the point L being given by a coordinate point (kh1=0.42, kh2=0.55); and the point M being given by a coordinate point (kh1=0.30, kh2=0.65). The layer structure of this SAW device is schematically illustrated in FIG. 6F, "type F".

The 45th SAW device having above constitution is provided with propagation velocity V of 8,000 (m/s) or higher, temperature coefficient for frequency TCF of from −15 to 15 (ppm/°C.) and effective coupling coefficient $K^2$ of from 0.25 to 1.6 (%). Further, such constitution is advantageous in manufacturing, as mentioned in the 41st SAW device.

A 46th surface acoustic wave device according to the present invention is also a "type F" SAW device, wherein the parameters kh1 and kh2 are given within a region ABNOJKLMA in the two-dimensional Cartesian coordinate graph, the outer edge of the region ABCNJKLMA being given by a closed chain in the Cartesian coordinate, consisting of the points A, B and C, a point N, a point O, and the points J, K, L, and M, and lines A–B, B–C, C–N, N–J, J–K, K–L, L–M and M–A, the point N being given by a coordinate point (kh1=0.43, kh2=0.95); and the point O being given by a coordinate point (kh1=0.61, kh2=0.75).

The 46th SAW device having this constitution is provided with propagation velocity V of from 10,000 or higher (m/s), temperature coefficient for frequency TCF of from −15 to 15 (ppm/°C.) and effective coupling coefficient $K^2$ of from 0.65 to 1.6 (%). Further, such constitution is advantageous in manufacturing, as discussed in the 41st SAW device.

The two-dimensional Cartesian coordinate graph having abscissa axis of kh1 and ordinate axis of kh2 is shown in FIG. 3. The region ABCDEFGHIJKLMA and the region ABNOJKLMA are also shown in FIG. 3.

A 47th surface acoustic wave device for 2nd mode surface acoustic wave of a wavelength λ (μm) according to the present invention comprises: (i) a diamond layer, (ii) an interdigital transducer (IDT) disposed on the diamond layer, the IDT having a thickness of $t_A$, (iii) a ZnO layer disposed over the interdigital transducer onto the diamond layer, the ZnO layer having a thickness $t_z$, (iv) a short circuit electrode disposed on the ZnO layer, and (v) an $SiO_2$ layer disposed over the short circuit electrode onto the ZnO layer, the $SiO_2$ layer having a thickness of $t_s$; wherein a parameter kh3=2π$(t_A/λ)$ is: 0.231≦kh3≦0.297, and wherein a parameter kh1=2π$(t_z/λ)$ and a parameter kh2=2π$(t_s/λ)$ are given within a region ABCDEFGHIJKLMNA in a two-dimensional Cartesian coordinate graph having abscissa axis of kh1 and ordinate axis of kh2, the outer edge of the region ABCDEFGHIJKLMNA being given by a closed chain in the Cartesian coordinate consisting of points A, B, C, D, E, F, G, H, I, J, K, L, M and N and lines A–B, B–C, C–D, D–E, E–F, F–G, G–H, H–I, I–J, J–K, K–L, L–M, M–N and N–A; the point A being given by a coordinate point (kh1=0.30, kh2=1.15); the point B being given by a coordinate point (kh1=0.38, kh2=1.20); the point C being given by a coordinate point (kh1=0.46, kh2=1.32); the point D being given by a coordinate point (kh1=0.60, kh2=1.52); the point E being given by a coordinate point (kh1=0.73, kh2=1.60); the point F being given by a coordinate point (kh1=0.81, kh2=1.44); the point G being given by a coordinate point (kh1=1.00, kh2=1.20); the point H being given by a coordinate point (kh1=1.40, kh2=0.91); the point I being given by a coordinate point (kh1=1.14, kh2=0.83); the point J being given by a coordinate point (kh1=0.83, kh2=0.76); the point K being given by a coordinate point (kh1=0.60, kh2=0.73); the point L being given by a coordinate point (kh1=0.35, kh2=0.73); the point M being given by a coordinate point (kh1=0.38, kh2=0.63); and the point N being given by a coordinate point (kh1=0.30, kh2=0.65). The layer structure of this SAW device is schematically illustrated in FIG. 6F, "type F".

The 47th SAW device having above constitution is provided with propagation velocity V of 8,000 (m/s) or higher, temperature coefficient for frequency TCF of from −15 to 15 (ppm/°C.) and effective coupling coefficient $K^2$ of from 0.3 to 1.45 (%). Further, such constitution is advantageous in manufacturing, as mentioned in the 41st SAW device.

A 48th surface acoustic wave device according to the present invention is also a "type F" SAW device, wherein the parameters kh1 and kh2 are given within a region AOPKLMNA in the two-dimensional Cartesian coordinate graph, the outer edge of the region AOPKLMNA being given by a closed chain in the Cartesian coordinate, consisting of the point A, a point O, a point P, and the points K, L, M and N, and lines A–O, O–P, P–K, K–L, L–M, M–N and N–A, the point O being given by a coordinate point (kh1=0.36, kh2=1.00); and the point P being given by a coordinate point (kh1=0.48, kh2=0.83).

The 48th SAW device having this constitution is provided with propagation velocity V of from 10,000 or higher (m/s), temperature coefficient for frequency TCF of from −15 to 15 (ppm/°C.) and effective coupling coefficient $K^2$ of from 0.55 to 1.45 (%). Further, such constitution is advantageous in manufacturing, as discussed in the 41st SAW device.

The two-dimensional Cartesian coordinate graph having abscissa axis of kh1 and ordinate axis of kh2 is shown in FIG. 4. The region ABCDEFGHIJKLMNA and the region AOPKLMNA are also shown in FIG. 4.

A 49th surface acoustic wave device for 2nd mode surface acoustic wave of a wavelength λ (μm) comprising: (i) a diamond layer, (ii) an interdigital transducer (IDT) disposed on the diamond layer, the IDT having a thickness of $t_A$, (iii) a ZnO layer disposed over the interdigital transducer onto the diamond layer, the ZnO layer having a thickness $t_z$, (iv) a short circuit electrode disposed on the ZnO layer, and (v) an $SiO_2$ layer disposed over the short circuit electrode onto the ZnO layer, the $SiO_2$ layer having a thickness of $t_s$; wherein a parameter kh3=2π$(t_A/λ)$ is: 0.297≦kh3≦0.363, and wherein a parameter kh1=2π$(t_z/λ)$ and a parameter kh2=2π$(t_s/λ)$ are given within a region ABCDEFGHIJKLA in a two-dimensional Cartesian coordinate graph having abscissa axis of kh1 and ordinate axis of kh2, the outer edge of the region ABCDEFGHIJKLA being given by a closed chain in the Cartesian coordinate consisting of points A, B, C, D, E, F, G, H, I, J, K and L and lines A–B, B–C, C–D, D–E, E–F, F–G, G–H, H–I, I–J, J–K, K–L and L–A; the point A being given by a coordinate point (kh1=0.30, kh2=1.29); the point B being given by a coordinate point (kh1=0.33, kh2=1.36); the point C being given by a coordinate point (kh1=0.40, kh2=1.60); the point D being given by a coordinate point (kh1=0.71, kh2=1.60); the point E being given by a coordinate point (kh1=0.82, kh2=1.41); the point F being given by a coordinate point (kh1=1.00, kh2=1.22); the point G being given by a coordinate point (kh1=1.27, kh2=0.97); the point H being given by a coordinate point (kh1=1.03, kh2=0.89); the point I being given by a coordinate point (kh1=0.68, kh2=0.78); the point J being given by a coordinate point (kh1=0.52, kh2=0.77); the point K being given by a coordinate point (kh1=0.30, kh2=0.76); and the point L being given by a coordinate point (kh1=0.30, kh2=1.09). The layer structure of this SAW device is schematically illustrated in FIG. 6F, "type F".

The 49th SAW device having above constitution is provided with propagation velocity V of 8,000 (m/s) or higher, temperature coefficient for frequency TCF of from −15 to 15 (ppm/°C.) and effective coupling coefficient $K^2$ of from 0.35 to 1.35 (%). Further, such constitution is advantageous in manufacturing, as mentioned in the 41st SAW device.

A 50th surface acoustic wave device according to the present invention is also a "type F" SAW device, wherein the parameters kh1 and kh2 are given within a region LMJKL in the two-dimensional Cartesian coordinate graph, the outer edge of the region LMJKL being given by a closed chain in the Cartesian coordinate, consisting of the point L, a point M, and the points J and K, and lines L-M, M-J, J-K and K-L, the point M being given by a coordinate point (kh1= 0.37, kh2=0.94).

The 50th SAW device having this constitution is provided with propagation velocity V of from 10,000 or higher (m/s), temperature coefficient for frequency TCF of from −15 to 15 (ppm/°C.) and effective coupling coefficient $K^2$ of from 0.70 to 1.35 (%). Further, such constitution is advantageous in manufacturing, as discussed in the 41st SAW device.

The two-dimensional Cartesian coordinate graph having abscissa axis of kh1 and ordinate axis of kh2 is shown in FIG. 5. The region ABCDEFGHIJKLA and the region LMJKL are also shown in FIG. 5.

All of the first to 50th SAW devices according to the present invention also have less propagation loss when these utilize 2nd mode SAW than in the case when these devices utilize 1st mode SAW. The first to 50th SAW devices according to the present invention can achieve propagation loss of 0.03 dB/λ for 2 GHz when these devices utilize 2nd mode SAW, although these devices achieve propagation loss of 0.05 dB/λ for 2 GHz when these devices utilize 1st mode SAW.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
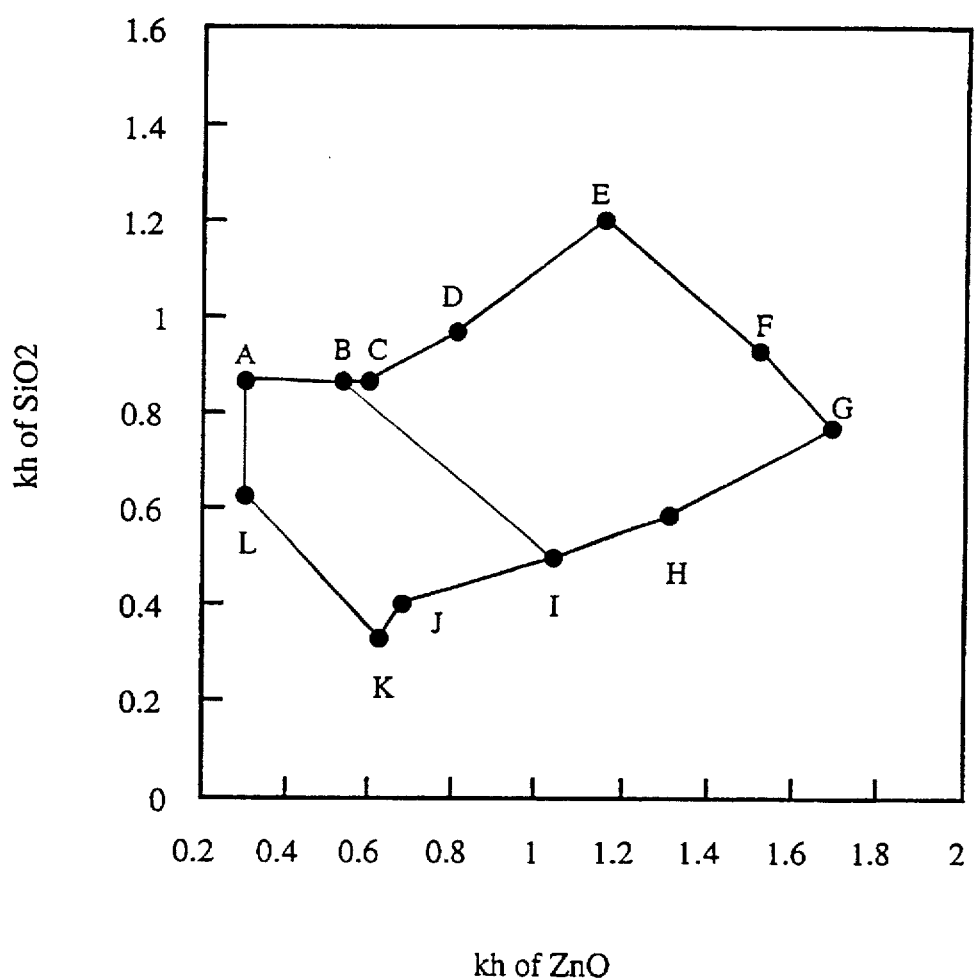
FIG. 1 is a graph in the two-dimensional Cartesian coordinate having abscissa axis of kh1(kh of ZnO) and ordinate axis of kh2(kh of $SiO_2$), illustrating the region ABCDEFGHIJKLA and the region ABIJKLA for $0.033 \leq kh3 \leq 0.099$.

The present invention will be described in detail as following, with reference to the accompanying drawings.
(Diamond)

The diamond material preferable for the use in the present invention may be either natural diamond or synthetic diamond. The diamond may be single crystalline diamond or polycrystalline diamond. The diamond plate/substrate itself can be used for fabricating SAW devices according to the present invention. Diamond layer/film formed on the other base material can also be employed.

The base material used for forming diamond film is not particularly limited, but may appropriately be selected depending on the usage of the SAW device. For example, the base material to be available in the present invention may comprise semiconductor materials such as crystalline silicon, amorphus silicon, metals, glass and ceramics. The process may appropriately be selected from known synthesis processes such as CVD(Chemical Vapor Deposition) including microwave plasma CVD, plasma enhanced CVD, PVD (Physical Vapor Deposition), sputtering, ion plating, plasma jet method, flame method and hot filament method.

In the case where the diamond film formed on the base material is employed for fabrication of SAW device according to the present invention, a parameter kh$_d$, which is defined as kh$_d$=2πt$_d$/λ, where t$_d$ is a thickness of the diamond film/layer and λ is a wavelength of SAW, is preferably 4 or higher, and more preferably khd is 8 or higher, because such thicker diamond film can provides less fluctuation in operating performances of the SAW device.

The plane orientation of the diamond may be any of (111), (100) and (110), etc., or may be any combination of these plane orientations.
(ZnO Layer)

ZnO layer, that is disposed on the diamond and functions as piezoelectric layer of the SAW device according to the present invention, is preferably polycrystalline, and c-axis oriented, in view of piezoelectric property. By "c-axis oriented", it is meant that ZnO layer have a (001) plane that is parallel to a base layer, such as diamond layer, on which the ZnO layer is disposed.
(SiO$_2$ Layer)

SiO$_2$ layer, that is formed on the ZnO layer and functions as protecting or passivating material for the ZnO layer and IDT according to the present invention, is preferably an amorphous SiO$_2$ layer because of its better formability and processibility.

When device temperature increases, the SAW propagation velocity through SiO$_2$ layer increases while the SAW propagation velocities through diamond and ZnO layer decrease. Thus, SiO$_2$ layer can compensate the variation of the SAW propagation velocity through diamond and ZnO layers to provide the operation stability for temperature variation.
(IDT)

In the present invention, a pair of IDTs are disposed at input side and output side. Any of electric conductive materials can be used for interdigital transducer for the SAW device of the present invention. In view of processibility, aluminum (Al) may preferably be used as the material for the IDT.

When device temperature increases, the SAW propagation velocity through diamond layer, aluminum IDT and ZnO layer decreases while the SAW propagation velocities through and SiO$_2$ layer increase.

The planar or projected shape of the IDT for the SAW device of the present invention is not limited. Electrode called "single-type" electrode as shown in the schematic plan view of FIG. 26A or electrode called "double-type" electrode as shown in the schematic plan view of FIG. 26B may typically be used for the present invention.
(Short-Circuiting Electrode)

The short-circuiting electrode to be disposed as desired, is an electrode having a function of providing an equipotential state to an electric field so as to change the SAW characteristics of the device. This electrode may preferably comprise a (thin) film of a metal such as Al, Au or Al—Cu. Since the short-circuiting electrode has different function from that of the IDT, the material of the short-circuiting electrode may not be same as that of the IDT.

The thickness of the short-circuiting electrode is not particularly limited, as long as it can function as a short-circuiting electrode of a SAW device. The thickness of the short-circuiting electrode may preferably be in the range of about 50 to 3,000 Å (more preferably, about 100 to 500 Å). When the thickness is less than 50 Å, it is difficult to obtain an equipotential state as described above. On the other hand, when the thickness exceeds 3,000 Å, it may affect the reflection of SAW.

For example, the short-circuiting electrode may preferably has a planner shape of a "solid electrode" having an area substantially equal to that of the IDT to be used in combination therewith.

EXAMPLES

The following examples were carried out to determine optimum kh1 and kh2, which provide propagation velocity (V), electrical-mechanical coupling coefficient (K$^2$), temperature coefficient for frequency (TCF) and propagation loss, by focusing a thickness of aluminum IDT.

Example 1

Figure 6A:
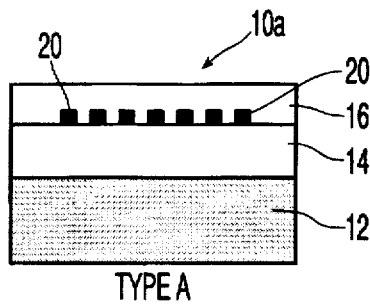
FIGS. 6A to 6G are schematic sectional views illustrating layer structures (type A to type G) according to the present invention.

The "type A" of SAW devices, illustrated in FIG. 6A, having different thickness of layers 14 and 16 and IDT, were prepared, and the desired thickness of ZnO and SiO$_2$ layers were evaluated for 2nd SAW mode so as to provide improved propagation velocity (V), effective coupling coefficient K$^2$, temperature coefficient for frequency TCF and propagation loss.

More specifically, each of the SAW devices of Examples 1 includes: a 20 µm thick of diamond 20; one of twenty different thicknesses within the range of 0.20 to 2.5 µm, of ZnO layer; one of twenty different thicknesses within the range of 210 to 4600 angstrom for single and double types of Al IDT; and one of twenty different thicknesses within the range of 0.15 to 2.0 µm, of SiO$_2$. The desired thicknesses of ZnO and SiO$_2$ layers and Al IDT are expressed by the parameters kh1, kh2 and kh3 for 2nd mode SAW having wavelength λ:

kh1=2π(t$_z$/λ), t$_z$:thickness of ZnO layer;
kh2=2π(t$_s$/λ), t$_s$:thickness of SiO$_2$ layer; and
kh3=2π(t$_A$/λ), t$_A$:thickness of aluminum IDT.

A polycrystalline diamond film was formed on a (100) plane of monocrystalline silicon having dimension of 10×10×1 (mm), via microwave plasma CVD process. The Silicon substrate was placed within a vacuum CVD chamber of a microwave plasma CVD apparatus, and the CVD chamber was evacuated. Then a reactant gas which contains CH$_4$ and H$_2$(volumetric flow rate ratio; CH$_4$:H$_2$=1:200) was introduced. Diamond layer 12 having thickness of 20 μm was then deposited in the plasma created under the condition of:microwave power of 400 W, pressure of about 40 Torr and temperature of 850° C. The deposition rate of the diamond was about 1.0 μm/hr. The deposited diamond layer was allowed to stand for 10 minutes in the air of 450° C., to enhance the resistance of diamond layer.

After the deposited diamond surface was polished, the Si substrate having diamond layer thereon was transferred to a vacuum chamber of a magnetron sputtering apparatus to deposit ZnO layer 14 onto the diamond layer 12. A polycrystalline ZnO target was included within the chamber. The ZnO target was sputtered with flowing a sputtering gas containing Ar and O$_2$ (Ar:O$_2$=1:1) through the chamber, under the sputtering condition of: sputtering power of 150 W and substrate temperature of 380° C. The deposition rate of the ZnO layer was 1.8 μm/hr. The thickness of ZnO layer could be controlled by adjusting the deposition duration under the constant deposition rate (1.8 μm/hr).

Figure 26A:
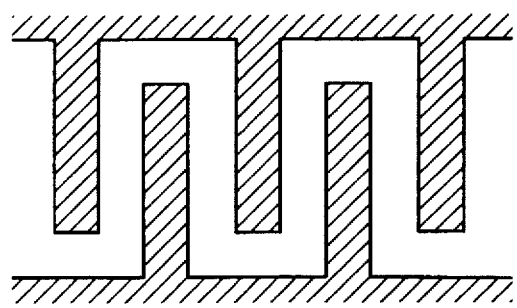
FIG. 26A schematically illustrates a planar shape of an IDT (single-type electrode)
Figure 26B:
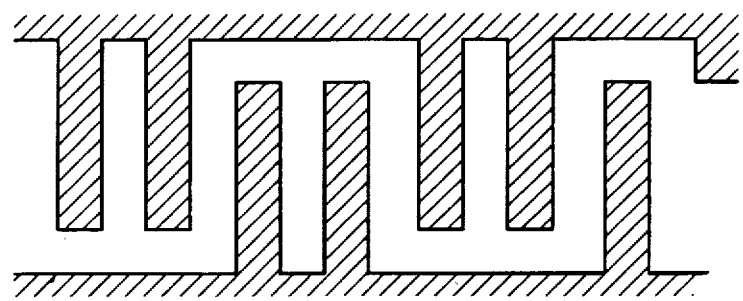
FIG. 26B schematically illustrates a planar shape of an IDT (double-type electrode)

Aluminum IDTs 20 having planer shape of one of single-type and double-type electrodes as shown in FIGS. 26A and 26B, respectively (electrode element width d=1 μm; crossing width (pitch)=200 μm so as to provide wavelength=4 82 m for single type IDT, crossing width (pitch)=400 μm so as to provide wavelength=8 μm for double type IDT) was formed on ZnO layer 14 by resistance heating processing and subsequent etching. Thus, the SAW devices having single type IDT and the SAW devices having double type IDT were formed. The thickness of Al IDT could be controlled by adjusting the duration of the resistance heating processing.

Then, after ZnO target in the apparatus was replaced by Si target, an SiO$_2$ layer 16 having predetermined thickness was formed over the IDTs via RF sputtering process under the condition of: pressure of 1×10$^{-2}$ Torr, substrate temperature of 150° C. and Ar:O$_2$=1:1, RF power of 200 W. The deposition rate of the SiO$_2$ layer was 0.54 μm/hr. The thickness of SiO$_2$ layer could be controlled by adjusting the deposition duration under the constant deposition rate (0.54 μm/hr).

With respect to each of the SAW devices illustrated in FIG. 6A, radio frequency (RF) power was applied to the input IDT to generate SAW of 2nd mode. The propagation velocities V (m/s) of the generated SAW of 2nd mode were determined depending on a relationship of V=f×λ (f: center frequency, λ=4d=4 μm for single type IDT, λ=8d=8 μm for double type IDT). The effective coupling coefficient (K$^2$) was also evaluated by measuring the radiation conductance (wherein the real part is denoted by "G") of the IDT by using a network analyzer ("Network Analyzer 8719A", commercially available from Yokogawa Hewlett Packard (YHP), Japan), and by using following formula:

$$K^2 = (G/8) \cdot f_0 \cdot C \cdot N$$

(f$_0$: center frequency, C: total electrostatic capacitance of IDT, N: number of electrode element pairs of IDT).

TCF measurement was carried out by the following manner: SAW device was heated by an external heater from room temperature to 70° C. The central frequency F$_0$ was measured at every 10° C. from the room temperature to 70° C. Proportional relationship between the central frequency and the device temperature. TCF was given by the slope of the relationship.

Further, propagation loss was evaluated by the following manner: SAW devices having same layer/electrode constitution but different spacing between input IDT and output IDT (e.g., 50 wavelength, 100 wavelength and 150 wave length) were fabricated. A relationship of insertion loss with the spacing was evaluated to be proportional. Then the propagation loss was obtained by the slop of the relationship.

The thickness t$_z$ (μm) of the ZnO layers of each SAW devices, and the thickness t$_s$ (μm) of the SiO$_2$ layers of each SAW device were measured by cutting off the device after the measurement of device performances as described above, and observing the resultant section of the device with a scanning electron microscope (SEM) at a magnification of 1000–5000×. Thus, the values of the parameters of kh1=2π(t$_z$/λ) and kh2=2π(t$_s$/λ) were determined for each of the SAW devices.

Figure 7:
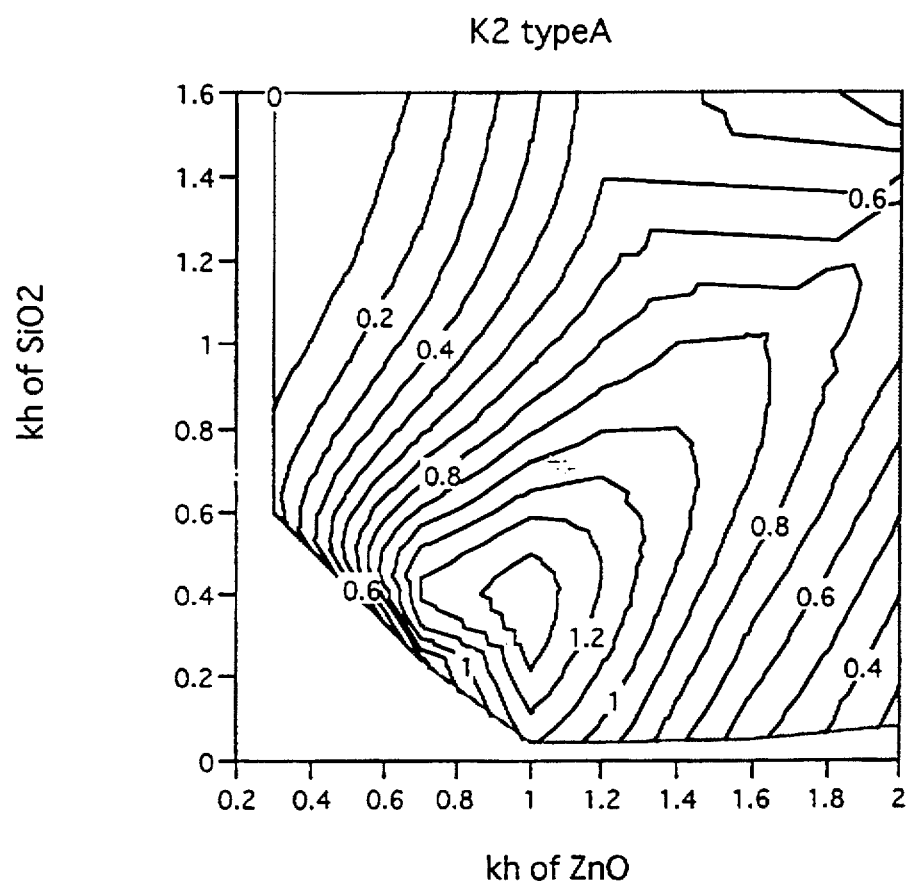
FIG. 7 is a graph showing relationship of parameters kh1 and kh2 for the SAW device of "type A" at various effective coupling coefficients $K^2$s, which was obtained in Example 1.

Variation of the effective coupling coefficient K$^2$ with the thickness of ZnO layer 14 and SiO$_2$ layer is illustrated in FIG. 7. FIG. 7 is a graph having abscissa axis of kh1 and ordinate axis of kh2, showing the relationship of the parameters kh1 and kh2 at the given effective coupling coefficient K$^2$. The numerical value at each curve is the value of K$^2$ in %. The K$^2$ value in FIG. 3 do not depends on value of kh3.

Figure 14:
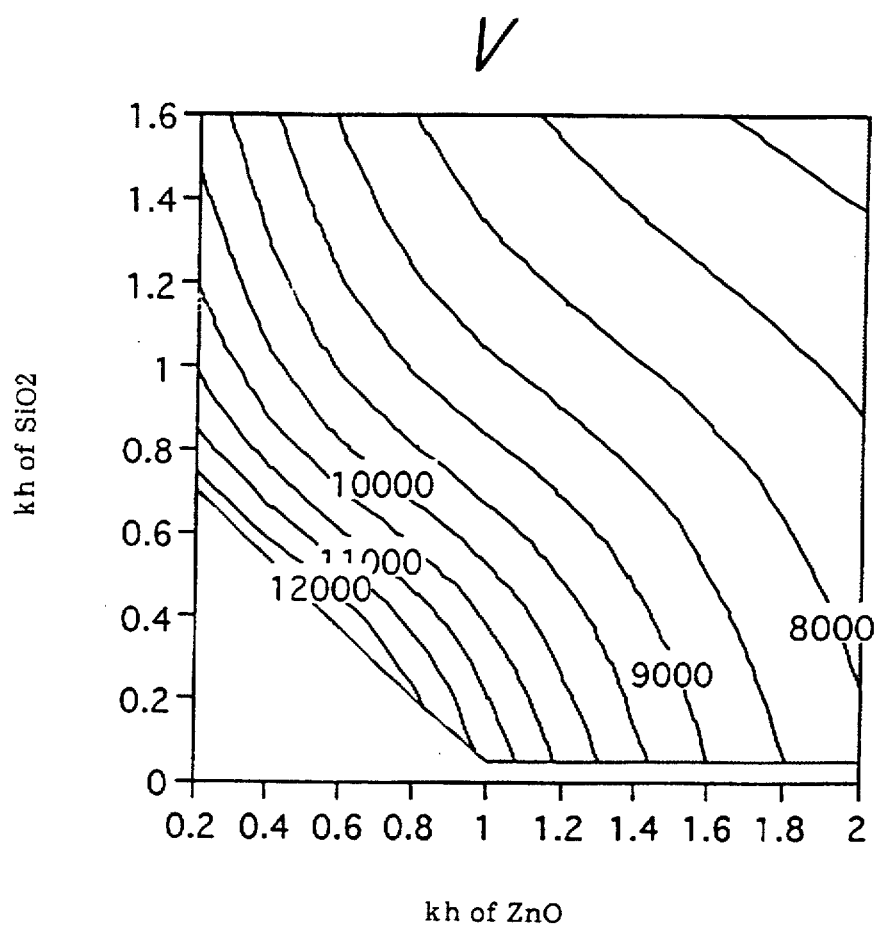
FIG. 14 is a graph showing relationship of parameters kh1 and kh2 for the SAW device of "type A", "type B", "type C", "type D", "type E", "type F" and "type G", at various propagation velocities Vs, in the case of kh3=0.066.
Figure 15:
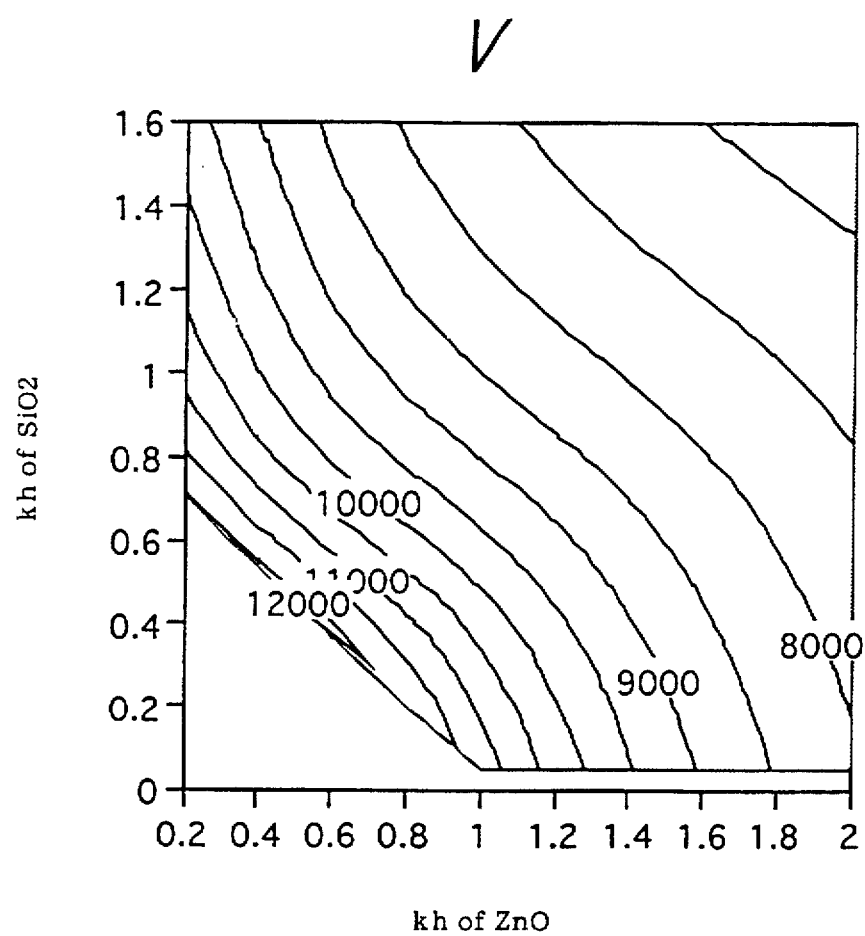
FIG. 15 is a graph showing relationship of parameters kh1 and kh2 for the SAW device of "type A", "type B", "type C", "type D", "type E", "type F" and "type G", at various propagation velocities Vs, in the case of kh3=0.132.
Figure 16:
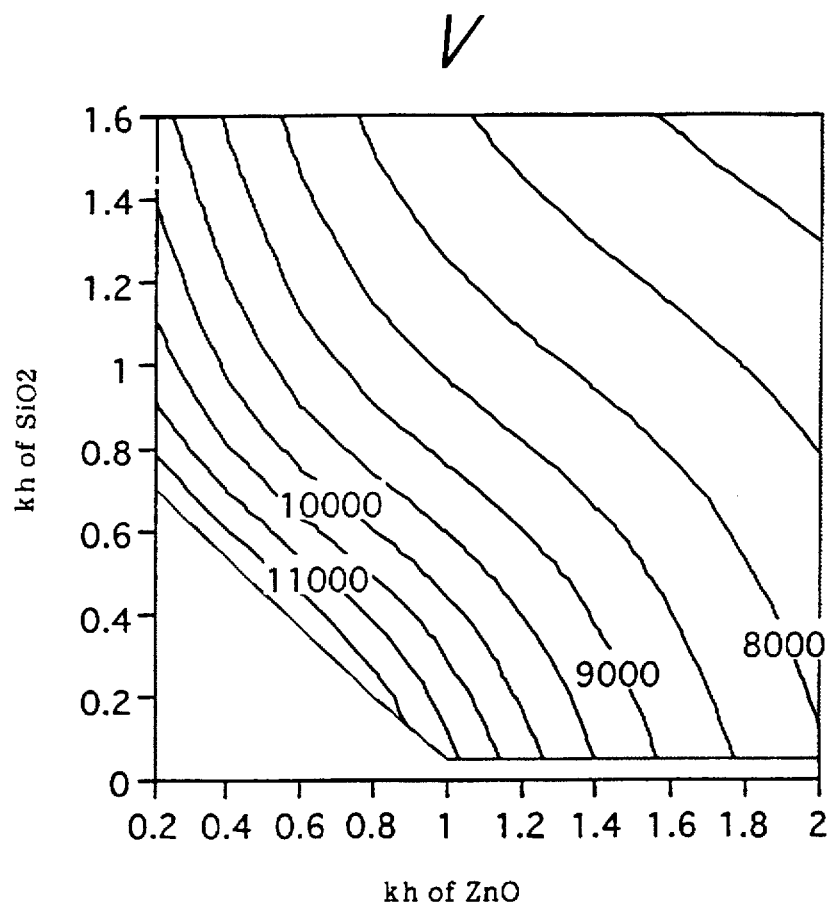
FIG. 16 is a graph showing relationship of parameters kh1 and kh2 for the SAW device of "type A", "type B", "type C", "type D", "type E", "type F" and "type G", at various propagation velocities Vs, in the case of kh3=0.198.
Figure 17:
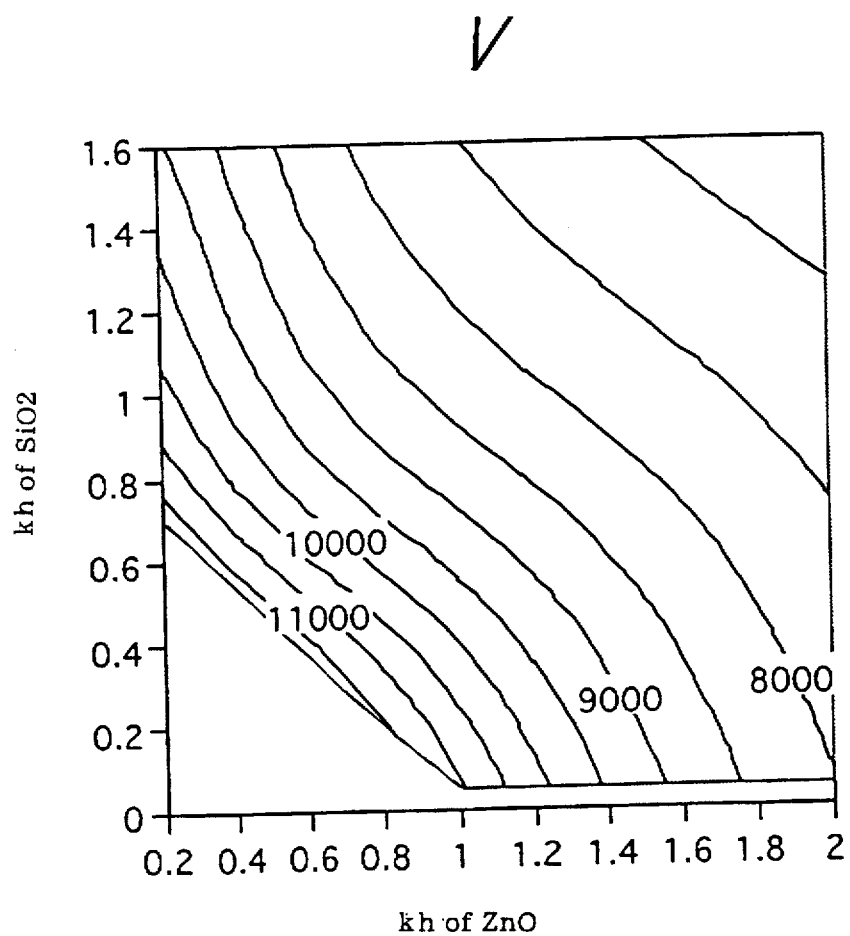
FIG. 17 is a graph showing relationship of parameters kh1 and kh2 for the SAW device of "type A", "type B", "type C", "type D", "type E", "type F" and "type G", at various propagation velocities Vs, in the case of kh3=0.264.
Figure 18:
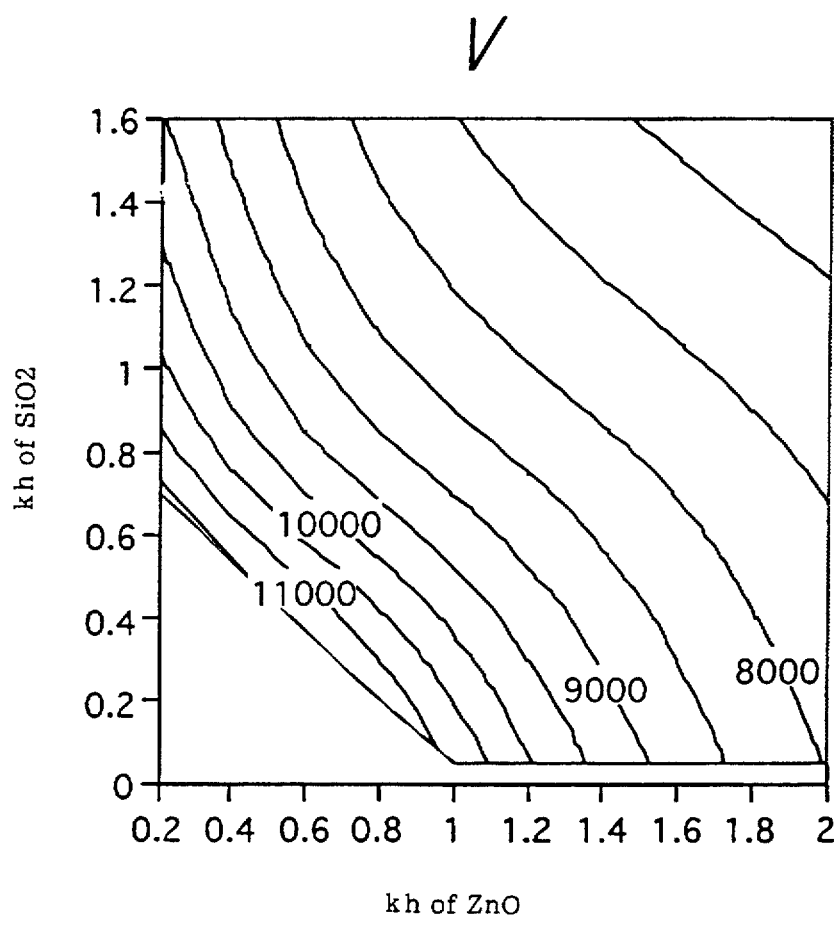
FIG. 18 is a graph showing relationship of parameters kh1 and kh2 for the SAW device of "type A", "type B", "type C", "type D", "type E", "type F" and "type G", at various propagation velocities Vs, in the case of kh3=0.330.
Figure 19:
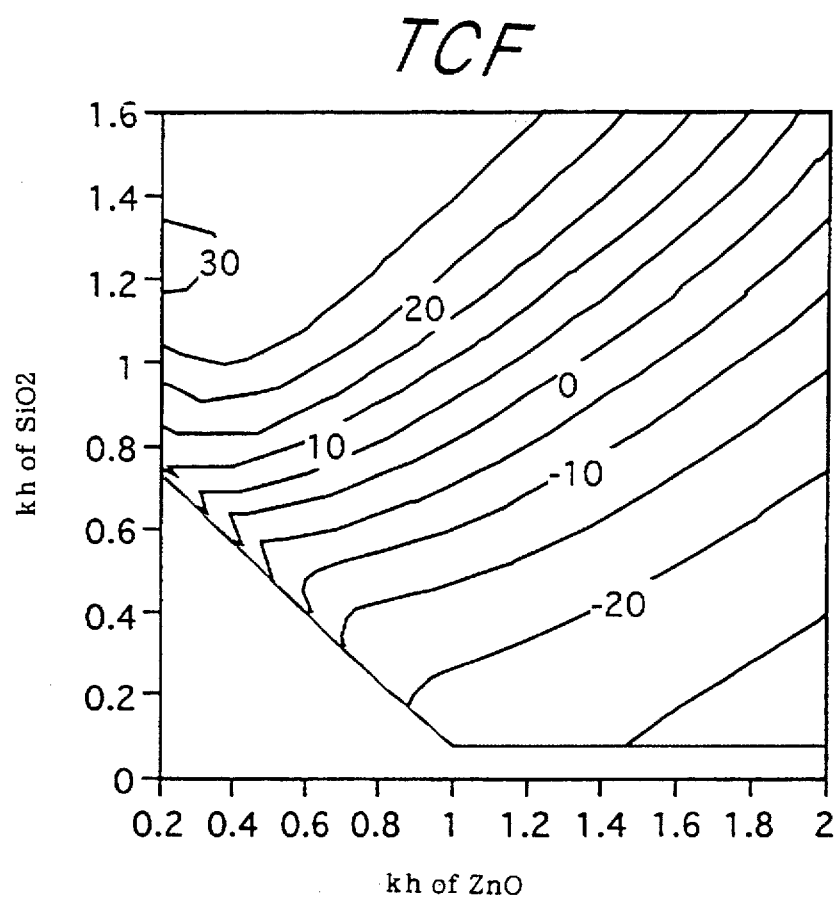
FIG. 19 is a graph showing relationship of parameters kh1 and kh2 for the SAW device of "type A", "type B", "type C", "type D", "type E", "type F" and "type G", at various TCFs in the case of kh3=0.066.
Figure 20:
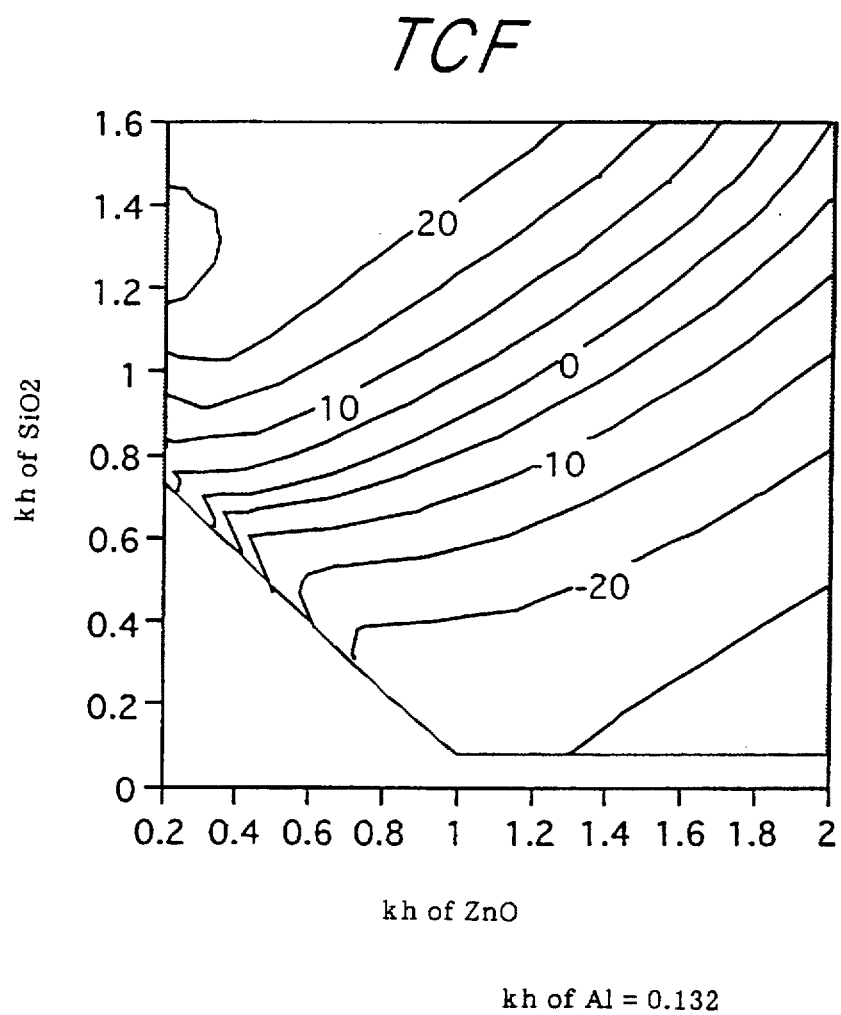
FIG. 20 is a graph showing relationship of parameters kh1 and kh2 for the SAW device of "type A", "type B", "type C", "type D", "type E", "type F" and "type G", at various TCFs in the case of kh3=0.132.
Figure 21:
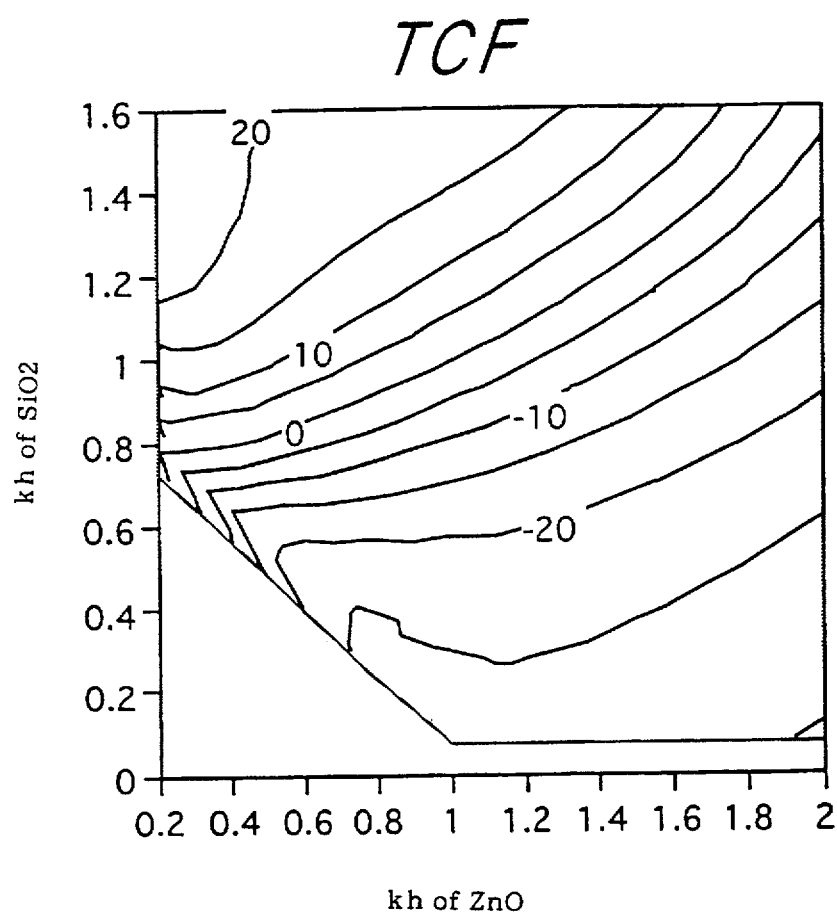
FIG. 21 is a graph showing relationship of parameters kh1 and kh2 for the SAW device of "type A", "type B", "type C", "type D", "type E", "type F" and "type G", at various TCFs in the case of kh3=0.198.
Figure 22:
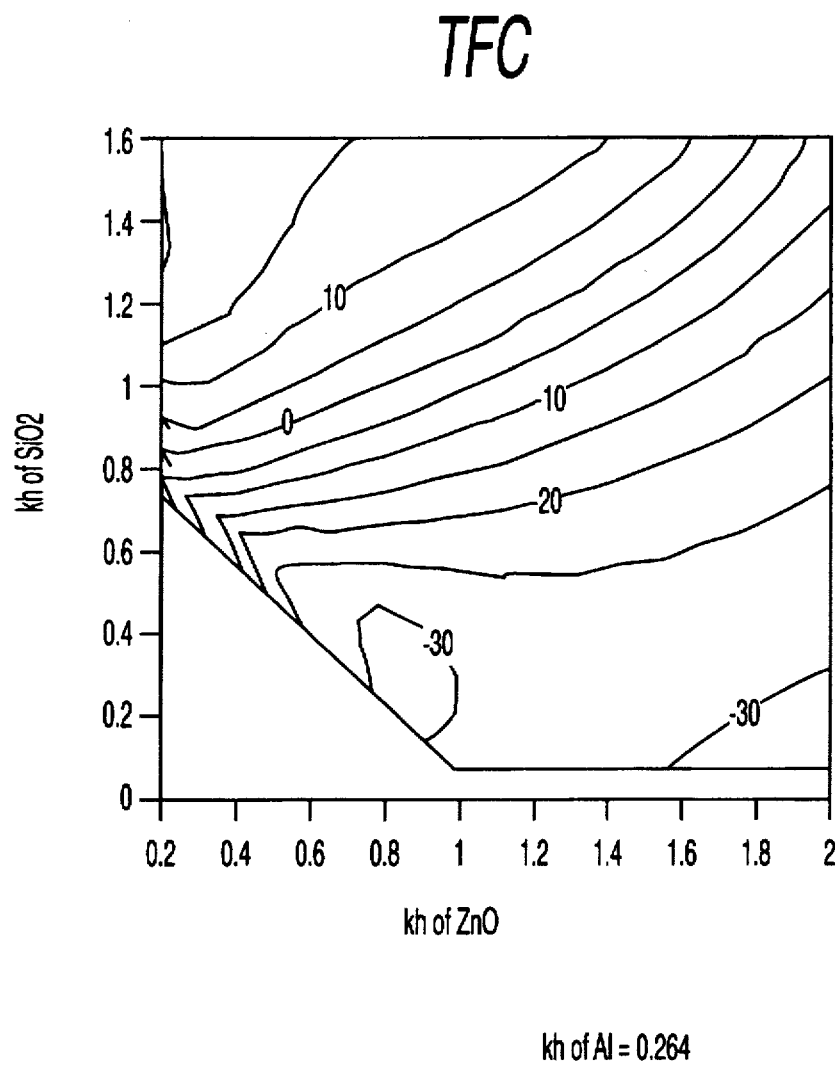
FIG. 22 is a graph showing relationship of parameters kh1 and kh2 for the SAW device of "type A", "type B", "type C", "type D", "type E", "type F" and "type G", at various TCFs in the case of kh3=0.264.
Figure 23:
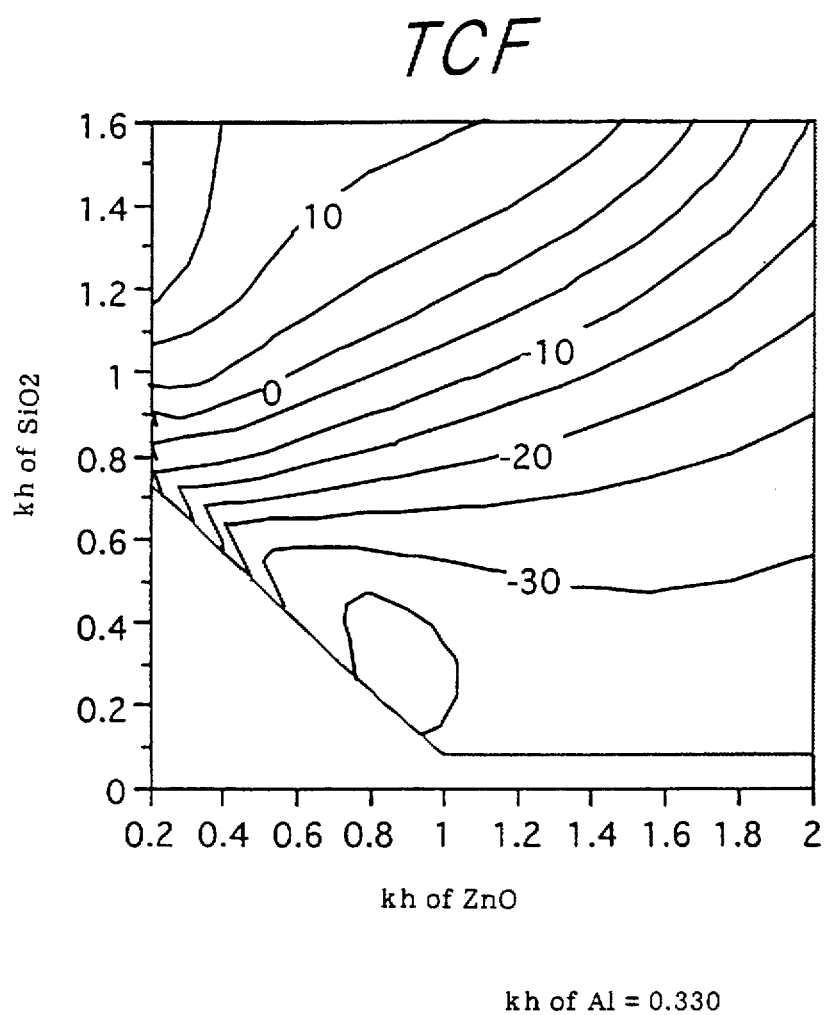
FIG. 23 is a graph showing relationship of parameters kh1 and kh2 for the SAW device of "type A", "type B", "type C", "type D", "type E", "type F" and "type G", at various TCFs in the case of kh3=0.330.
Figure 24:
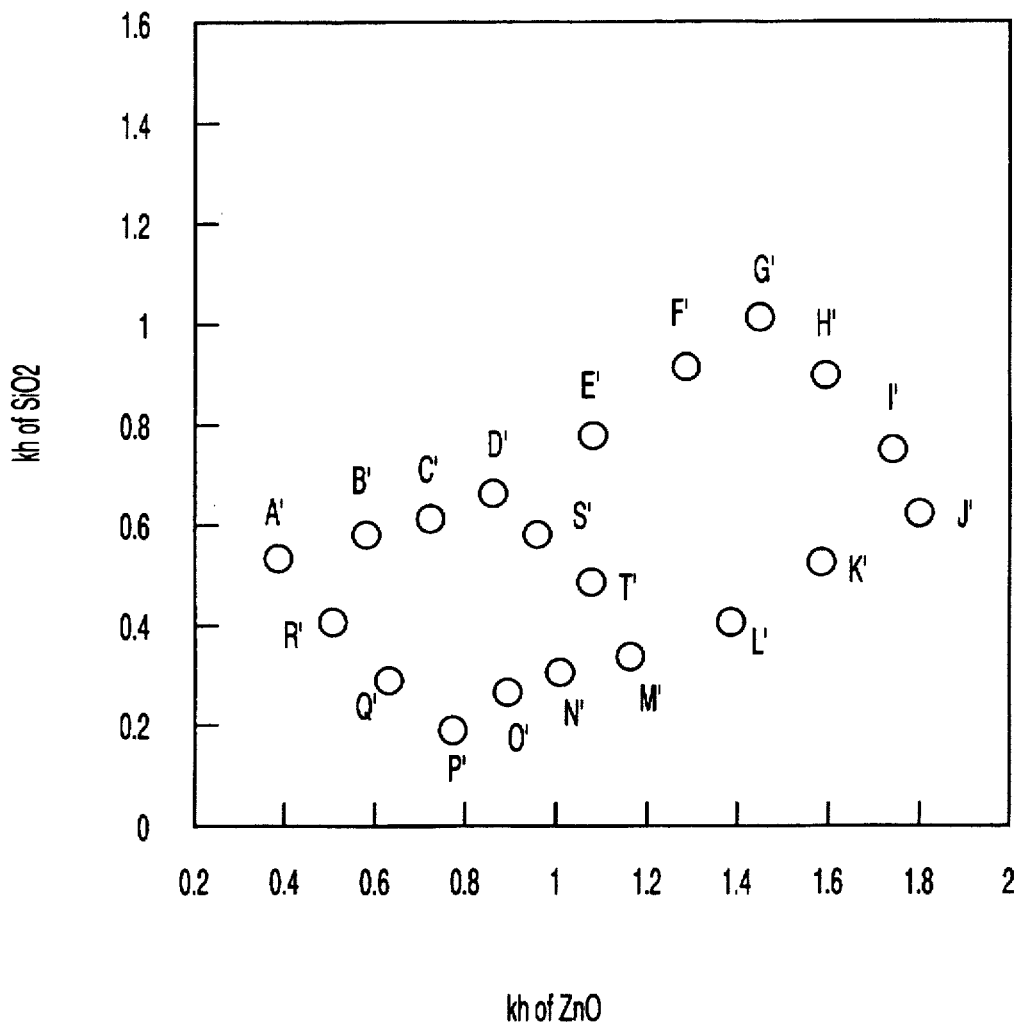
FIG. 24 is a graph in the two-dimensional Cartesian coordinate having abscissa axis of kh1(kh of ZnO) and ordinate axis of kh2(kh of $SiO_2$), illustrating the region A'B'C'D'E'F'G'H'T'J'K'L'M'N'O'P'Q'R'A' and the region A'B'C'D'S'T'M'N'O'P'Q'R'A', which are obtained in the first preliminary evaluation.
Figure 25:
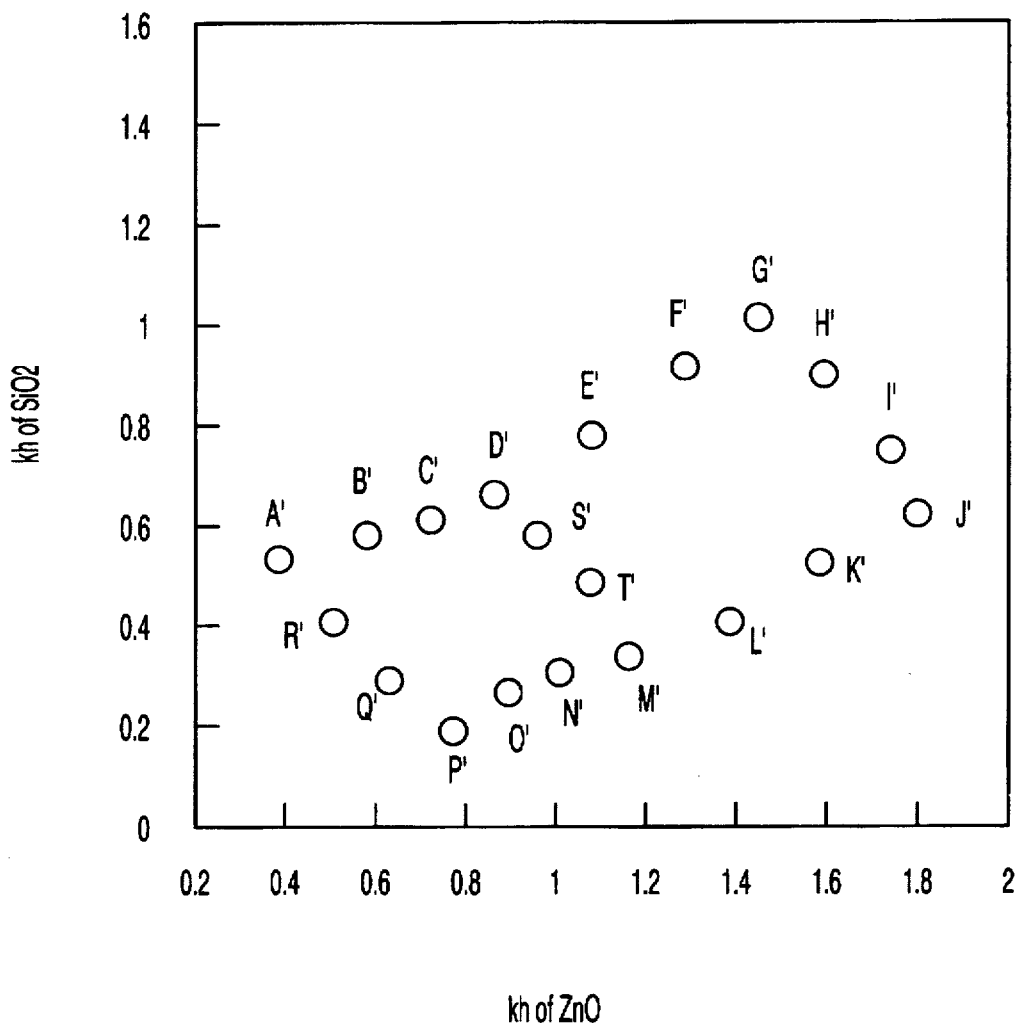
FIG. 25 is a graph in the two-dimensional Cartesian coordinate having abscissa axis of kh1(kh of ZnO) and ordinate axis of kh2(kh of SiO$_2$), illustrating the region abcdefghijklmnopqra and the region abcdstmnopqra, which are obtained in the second preliminary evaluation.

Similarly, the relationship of propagation velocity (V) and TCF with t$_z$ and t$_s$ were evaluated. V and TCF, unlike K$^2$, vary with a value of kh3, and the exemplary results for specific kh3 are shown. The propagation velocity V (m/sec) with the parameters kh1=2π(t$_z$/λ) and kh2=2π(t$_s$/λ) in the case of kh3=0.066, is shown in FIG. 14. V (m/sec) with the parameters kh1(kh os ZnO) and kh2(kh of SiO$_2$) in the case of kh3=0.132, is shown in FIG. 15. Similarly, V in the case of kh3=0.198, is shown in FIG. 16, V in the case of kh3=0.264, is shown in FIG. 17, and V in the case of kh3=0.330, is shown in FIG. 18. The relationship of TCF (ppm/°C.) with kh1 and kh2 for kh3=0.066 is also shown in FIG. 19. Similarly, TCF in the case of kh3=0.198, is shown in FIG. 20, TCF in the case of kh3=0.264, is shown in FIG. 21, and TCF in the case of kh3=0.330, is shown in FIG. 22.

Further, measured propagation loss was 0.05 dB/wavelength for 1st mode SAW, and 0.03 dB/wavelength for 2nd mode SAW.

Examples 2–7

Figure 6B:
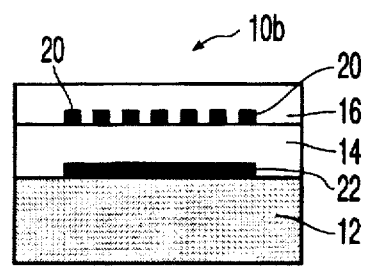
Figure 6C:
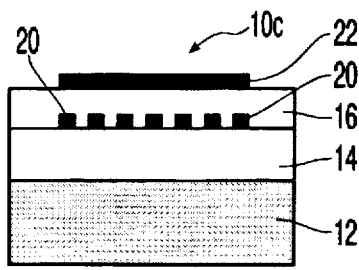
Figure 6D:
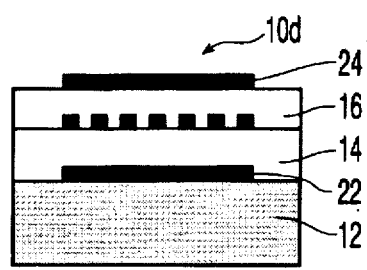
Figure 6E:
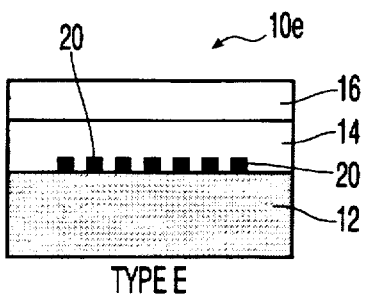
Figure 6F:
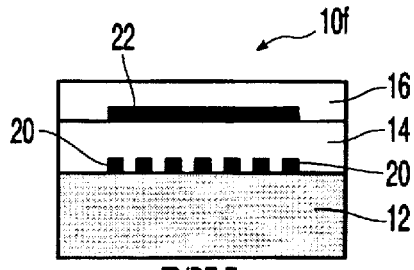
Figure 6G:
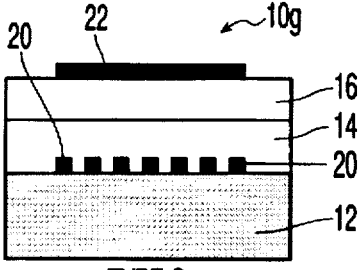

In Examples 2–7, following SAW devices were fabricated by similar fabricating processes as used in Example 1: "type B" SAW device 10b (FIG. 6B) was made in Example 2; "type C" SAW device 10c (FIG. 6C) was made in Example 3; "type D" SAW device 10d (FIG. 6D) was made in Example 4; "type E" SAW device 10e (FIG. 6E) was made in Example 5; "type F" SAW device 10f (FIG. 6F) was made in Example 6; and "type G" SAW device 10g (FIG. 6G) was made in Example 7.

As seen in these figures, the arrangement of IDT is different by Examples. In Example 2 (type B), Example 3 (type C) and Example 4 (type D), IDT 20 was formed onto ZnO layer 14 after ZnO layer 14 had been deposited, as described in Example 1. In Example 5 (type E), Example 6

(type F) and Example 7 (type G). IDT 20 was formed by the same forming process as used in Example 1, after polishing the surface of diamond layer 12 and before depositing ZnO layer; and then ZnO layer 14 was deposited onto diamond layer 12 to cover IDT 20.

In Example 2 (type B), Example 3 (type C), Example 4 (type D), Example 6 (type F) and Example 7 (type G), short circuiting electrodes 22 and 24 are included in the SAW device. The formation of the short circuiting electrodes 22 and 24 was carried out by the following manner: in Examples 2 (B) and 6 (F), after diamond 12 was deposited and polished, an aluminum layer having thickness of 50 to 250 angstrom was formed by resistive heating method. Then the aluminum layer was patterned via conventional photolithography to form short circuiting electrode 22, which has a geometrically corresponding to the location of IDT 20. In Example 3 (C) and Example 7 (G), short circuiting electrode 22, which has a geometry corresponding to the location of IDT 20, was formed on $SiO_2$ layer 16 via similar process as used in Examples 2 and 6, after depositing $SiO_2$ layer 16. In Example 4, short circuiting electrode 22 was formed onto diamond 12, and short circuiting electrode 24 was formed onto ZnO layer 14. In both formation processes for electrodes 2 and 24, similar processing as used in Examples 2 and 3 was employed. Each of electrodes 22 and 24 has a geometry corresponding to the location of IDT 20.

As carried out in Example 1, plurality of SAW devices having different thickness of layers 14 and 16, were prepared in each Example, and the desired thickness of ZnO and $SiO_2$ layers were evaluated for 2nd SAW mode so as to provide improved propagation velocity (V), effective coupling coefficient $K^2$, temperature coefficient for frequency TCF and propagation loss.

More specifically, each of the SAW devices of each of the Examples 2–7 includes: a 20 μm thick of diamond 20; one of twenty different thicknesses within the range of 210 to 4600 angstrom, of Al IDT; one of twenty different thicknesses within the range of 0.20 to 2.5 μm of ZnO layer; and one of twenty different thicknesses within the range of 0.15 to 2.0 μm of $SiO_2$. In the Examples 2–7, each of the thicknesses of the layers and IDT were controlled by adjusting the deposition duration (deposition time) under constant deposition rate. The desired thicknesses of ZnO and $SiO_2$ layers are expressed by the parameters kh1 and kh2 for 2nd mode SAW having wavelength λ, as in Example 1:

kh1=$2\pi(t_z/\lambda)$, $t_z$:thickness of ZnO layer;

kh2=$2\pi(t_s/\lambda)$, $t_s$:thickness of $SiO_2$ layer; and kh3=$2\pi(t_A/\lambda)$, $t_A$:thickness of Al IDT.

Effective coupling coefficient $K^2$ of each of the SAW devices was evaluated by similar manner as used in Example 1.

Figure 8:
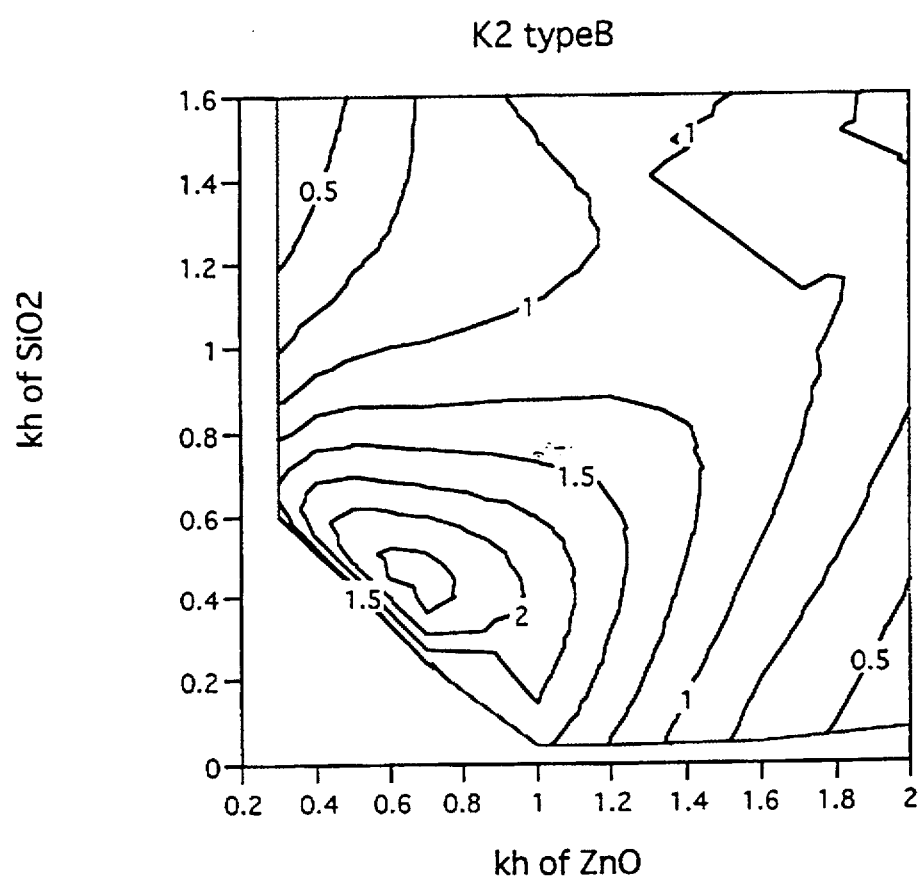
FIG. 8 is a graph showing relationship of parameters kh1 and kh2 for the SAW device of "type B" at various effective coupling coefficients $K^2$s which was obtained in Example 2.
Figure 9:
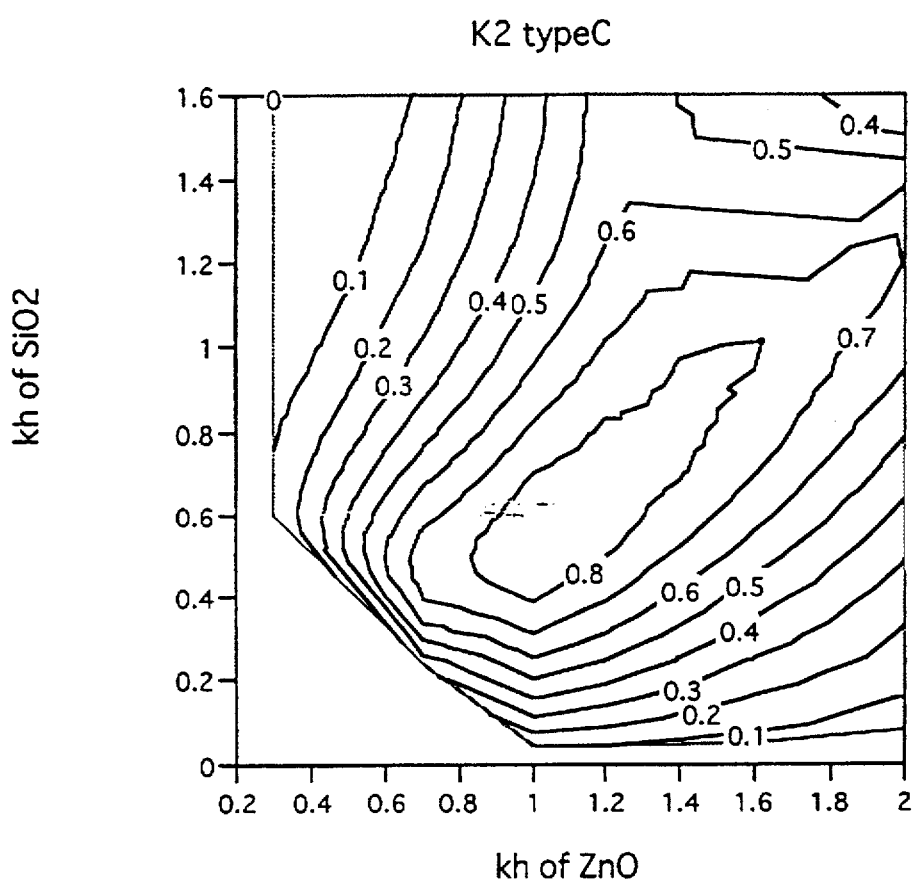
FIG. 9 is a graph showing relationship of parameters kh1 and kh2 for the SAW device of "type C" at various effective coupling coefficients $K^2$s which was obtained in Example 3.
Figure 10:
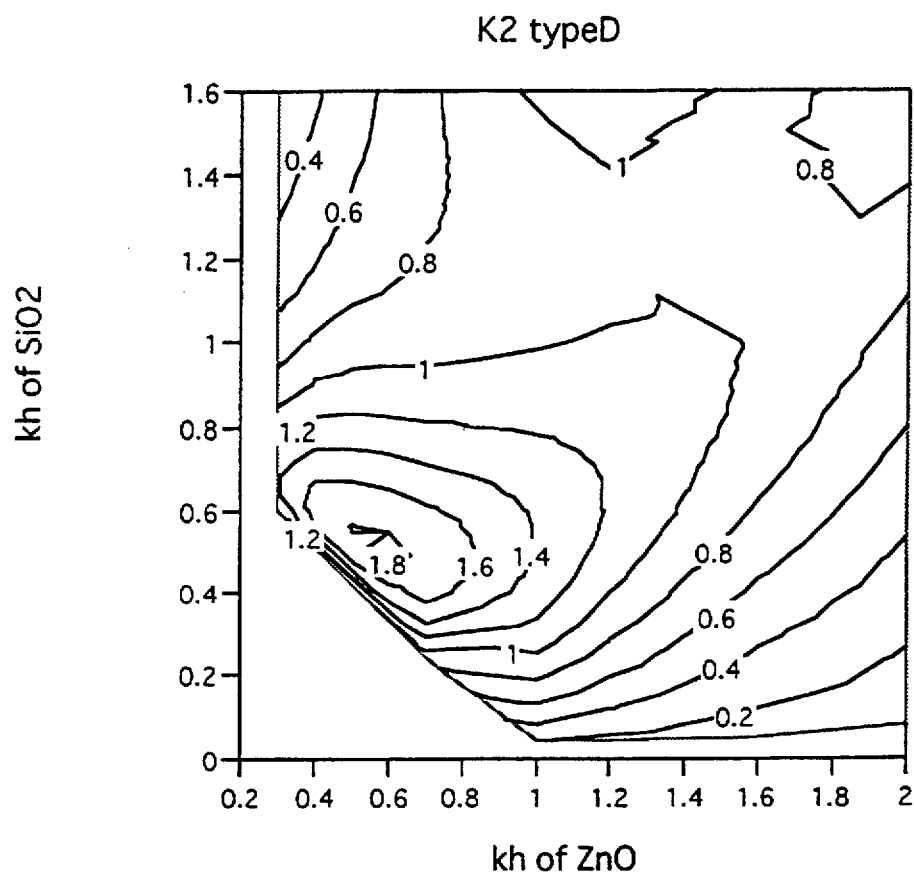
FIG. 10 is a graph showing relationship of parameters kh1 and kh2 for the SAW device of "type D" at various effective coupling coefficients $K^2$s, which was obtained in Example 4.
Figure 11:
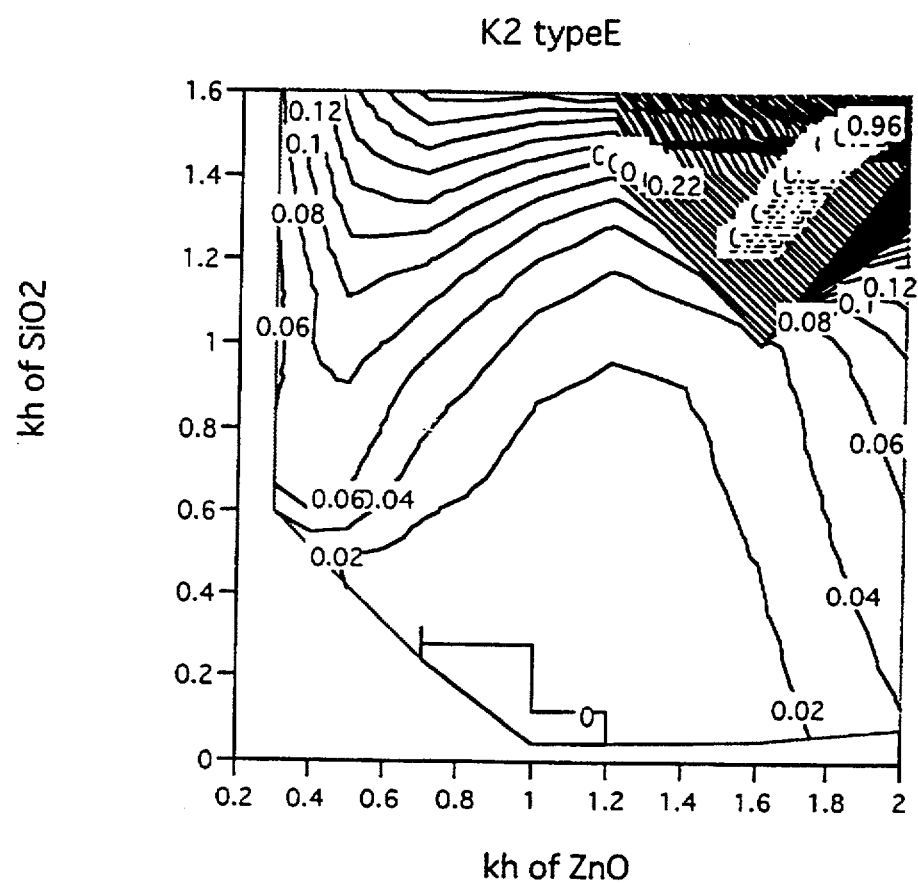
FIG. 11 is a graph showing relationship of parameters kh1 and kh2 for the SAW device of "type E" at various effective coupling coefficients $K^2$s, which was obtained in Example 5.
Figure 12:
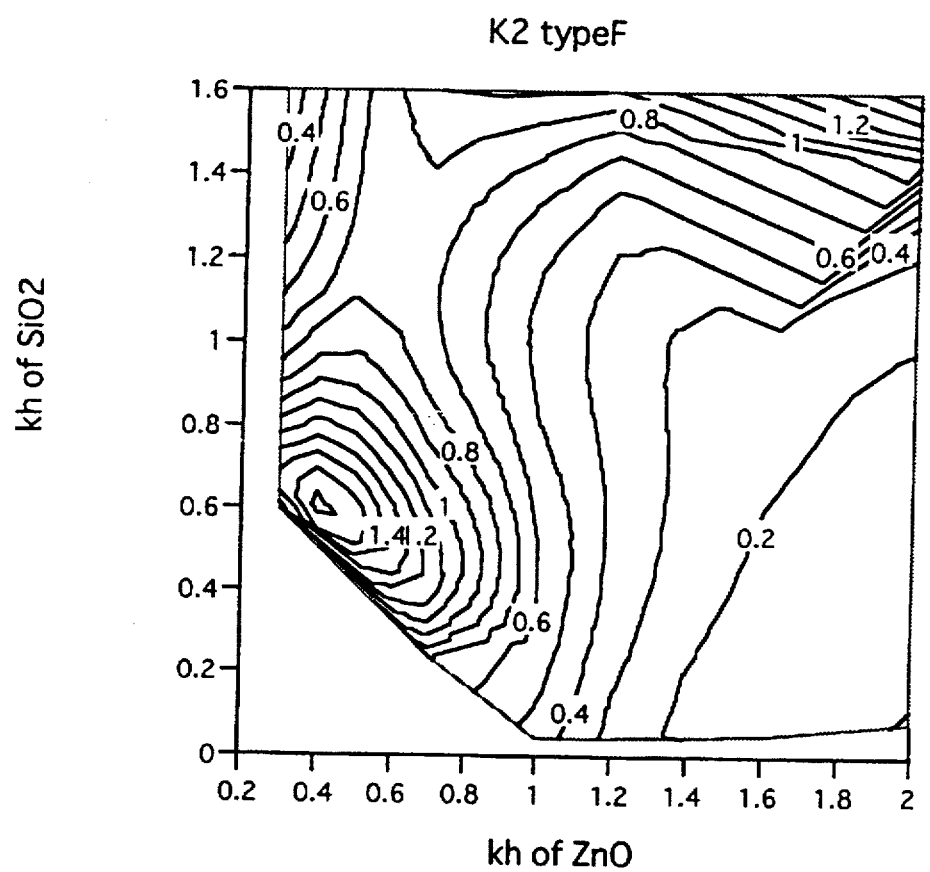
FIG. 12 is a graph showing relationship of parameters kh1 and kh2 for the SAW device of "type F" at various effective coupling coefficients $K^2$s, which was obtained in Example 6.
Figure 13:
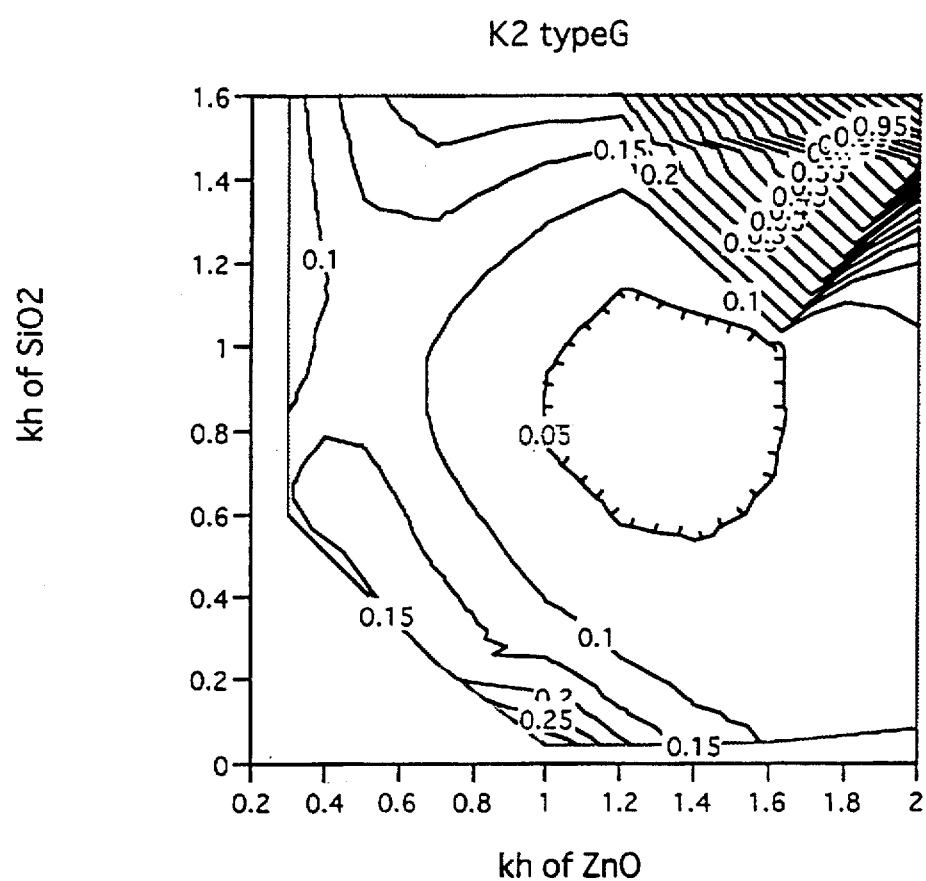
FIG. 13 is a graph showing relationship of parameters kh1 and kh2 for the SAW device of "type G" at various effective coupling coefficients $K^2$s, which was obtained in Example 7.

Variation of the effective coupling coefficient $K^2$ (%) with the thickness of ZnO layer 14 and $SiO_2$ layer is illustrated in FIGS. 8 to 13. FIGS. 8 to 13 are graph having abscissa axis of kh1 and ordinate axis of kh2, showing the relationship of the parameters kh1 and kh2 at the given effective coupling coefficient $K^2$ in Examples 2 to 7, respectively. The numerical value at each curve is the value of $K^2$ in %. FIG. 8 illustrates the relationship obtained in Example 2; FIG. 9 shows the results of Example 3; FIG. 10 shows the results of Example 4; FIG. 11 shows the results of Example 5; FIG. 12 shows the results of Example 6; and FIG. 13 shows the results of Example 7.

Propagation velocity V (m/sec) and TCF (ppm/°C.) of each of the SAW devices were obtained by similar manner as used in Example 1. The same result as in Example 1 in relationship of V with kh1 and kh2, is obtained in each of Example 2–7. Thus, the relationship of the propagation velocity V (m/sec) with the parameters kh1=$2(t_z/\lambda)$ and kh2=$2\pi(t_s/\lambda)$ in Each of Example 2–7 is shown in FIGS. 14 to 18. In TCF, the same result as in Example 1 is also obtained in each of Example 2–7. Thus, the relationship of TCF (ppm/°C.) with these parameters is also shown in FIGS. 19 to 23.

Further, measured propagation loss was 0.05 dB/wavelength for 1st mode SAW, and 0.03 dB/wavelength for 2nd mode SAW, in each of Examples 2–7.

Evaluation of the obtained result in Examples 1–7

As described in above Examples 1 to 7, a series of efforts to optimize the thickness of piezoelectric ZnO layer 14 and passivating $SiO_2$ layer 16 for each thickness of IDT, were carried out for the SAW devices of various device constitutions as illustrated in FIGS. 6A to 6G. A number of obtained results were collectively analyzed and evaluated to provide the optimized relationships of kh1 and kh2 for each constitution of SAW devices according to the present invention. Thus, dimensionless thicknesses of ZnO and $SiO_2$ layers 14 and 16 for each constitution of SAW devices according to the present invention were obtained for given wavelength of SAW. In the evaluation on the basis of the obtained results of Examples, significant improvement in device performances was achieved by optimizing dimensionless thicknesses kh1 and kh2 for the SAW devices having layer/electrode constitutions of "type A", "type B", "type C", "type D" and "type F".

Figure 2:
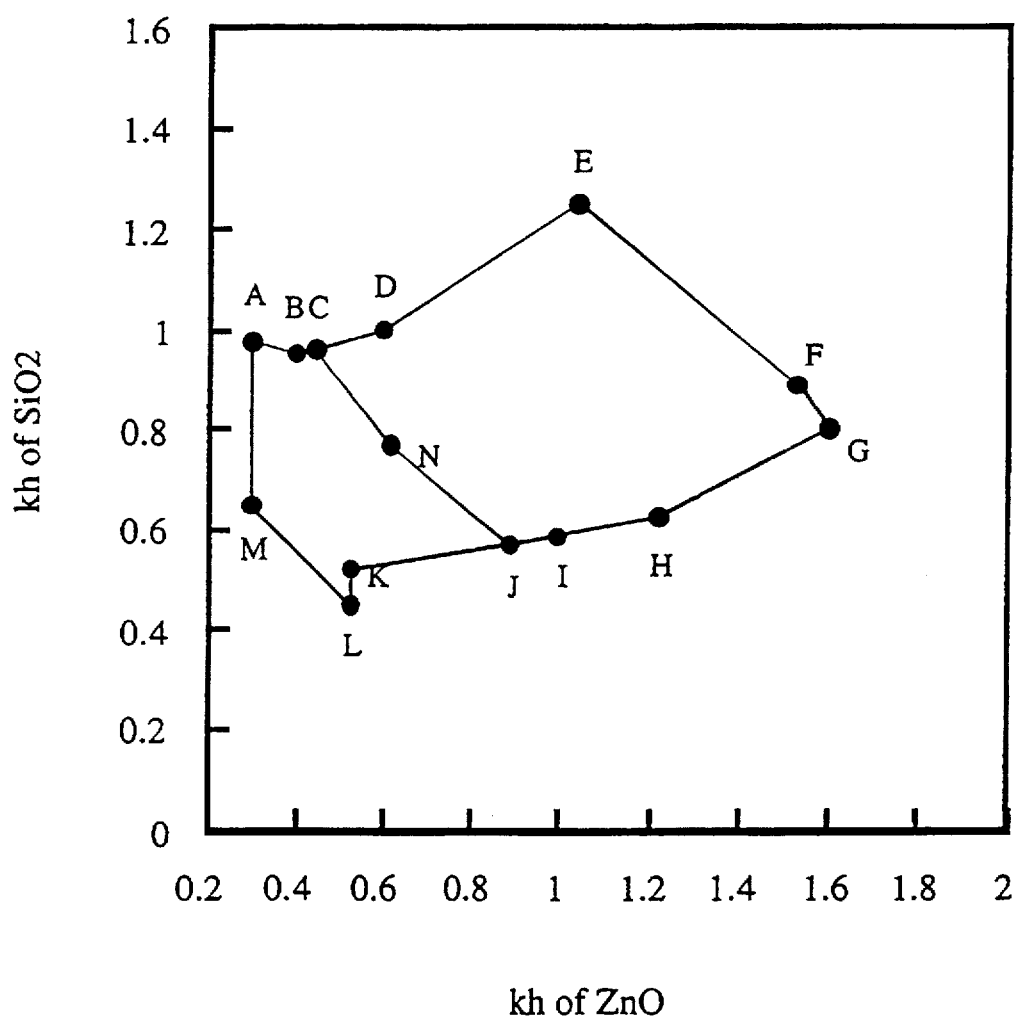
FIG. 2 is a graph in the two-dimensional Cartesian coordinate having abscissa axis of kh1(kh of ZnO) and ordinate axis of kh2(kh of $SiO_2$), illustrating the region ABCDEFGHIJKLMA and the region ABCNJKLMA for $0.099 \leq kh3 \leq 0.165$.
Figure 3:
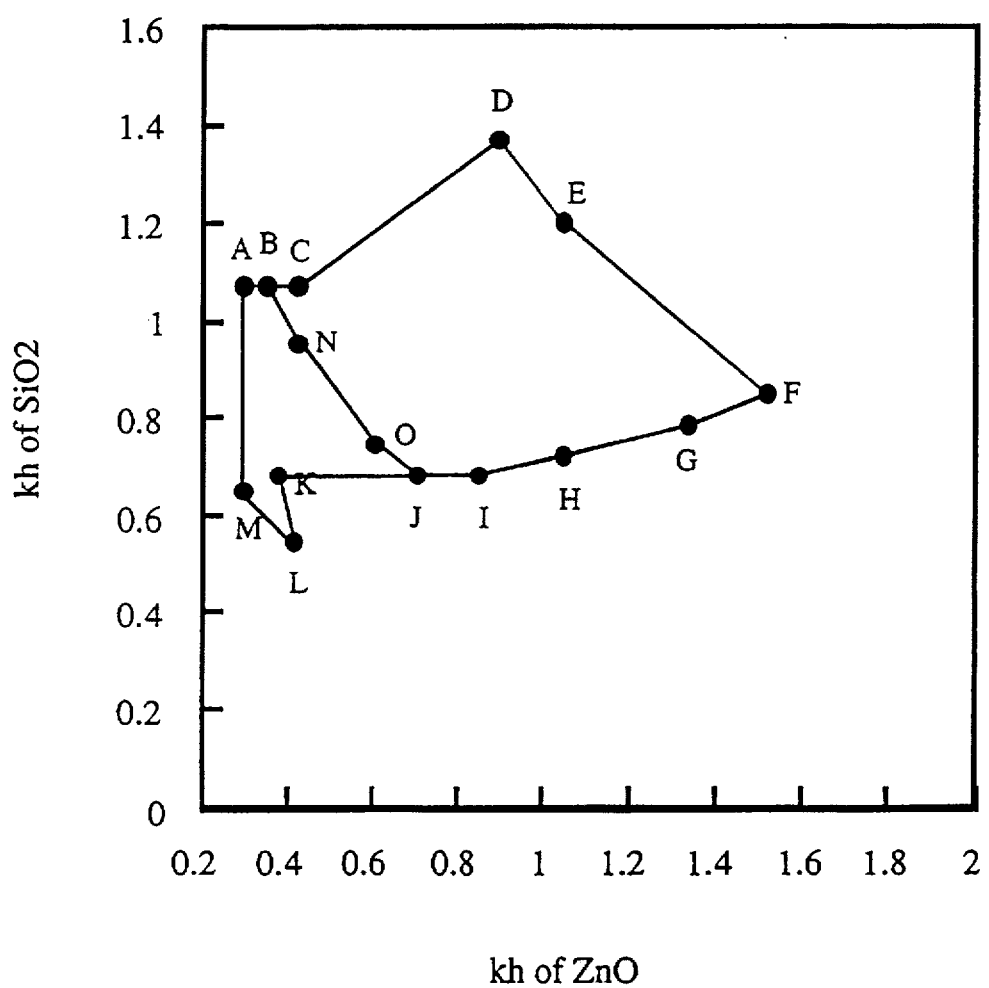
FIG. 3 is a graph in the two-dimensional Cartesian coordinate having abscissa axis of kh1(kh of ZnO) and ordinate axis of kh2(kh of $SiO_2$), illustrating the region ABCDEFGHIJKLMA and the region ABNOJKLMA for $0.165 \leq kh3 \leq 0.231$.
Figure 4:
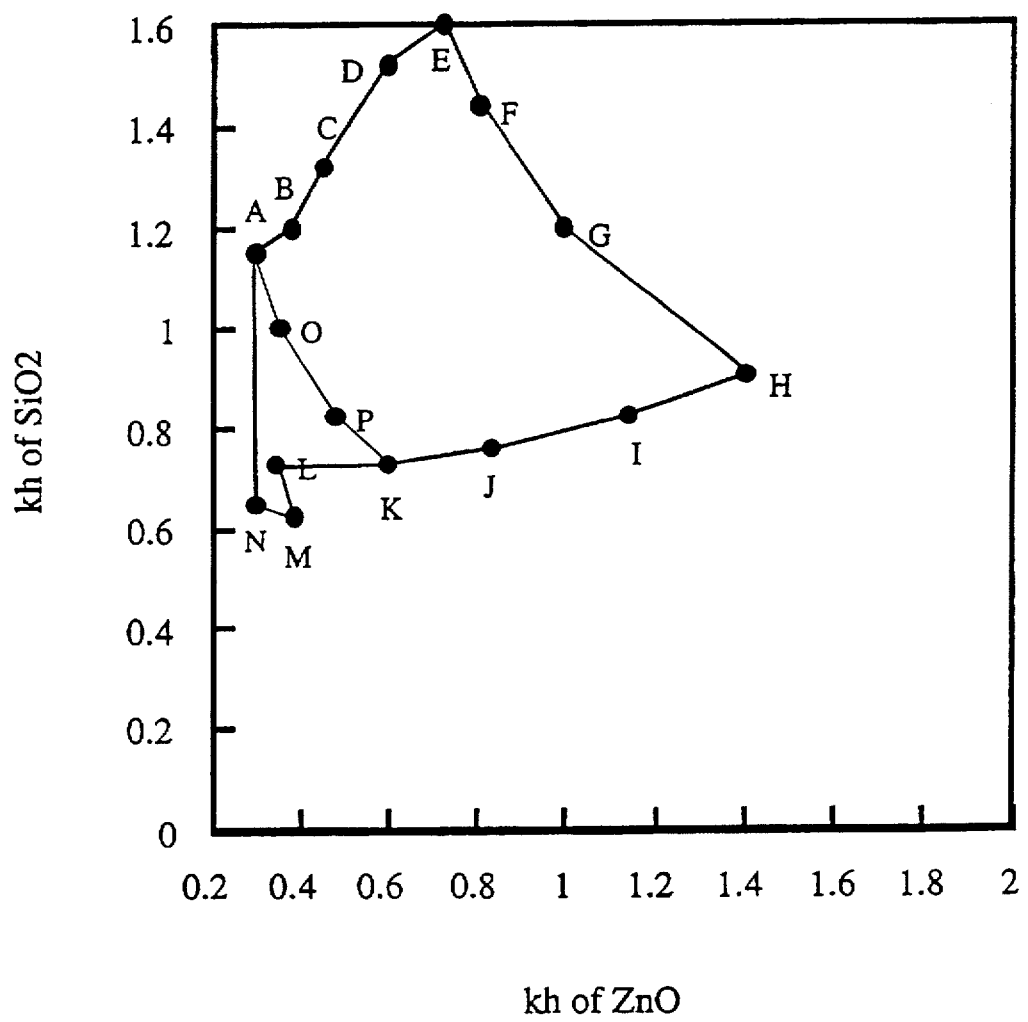
FIG. 4 is a graph in the two-dimensional Cartesian coordinate having abscissa axis of kh1(kh of ZnO) and ordinate axis of kh2(kh of $SiO_2$), illustrating the region ABCDEFGHIJKLMNA and the region AOPKLMNA for $0.231 \leq kh3 \leq 0.297$.
Figure 5:
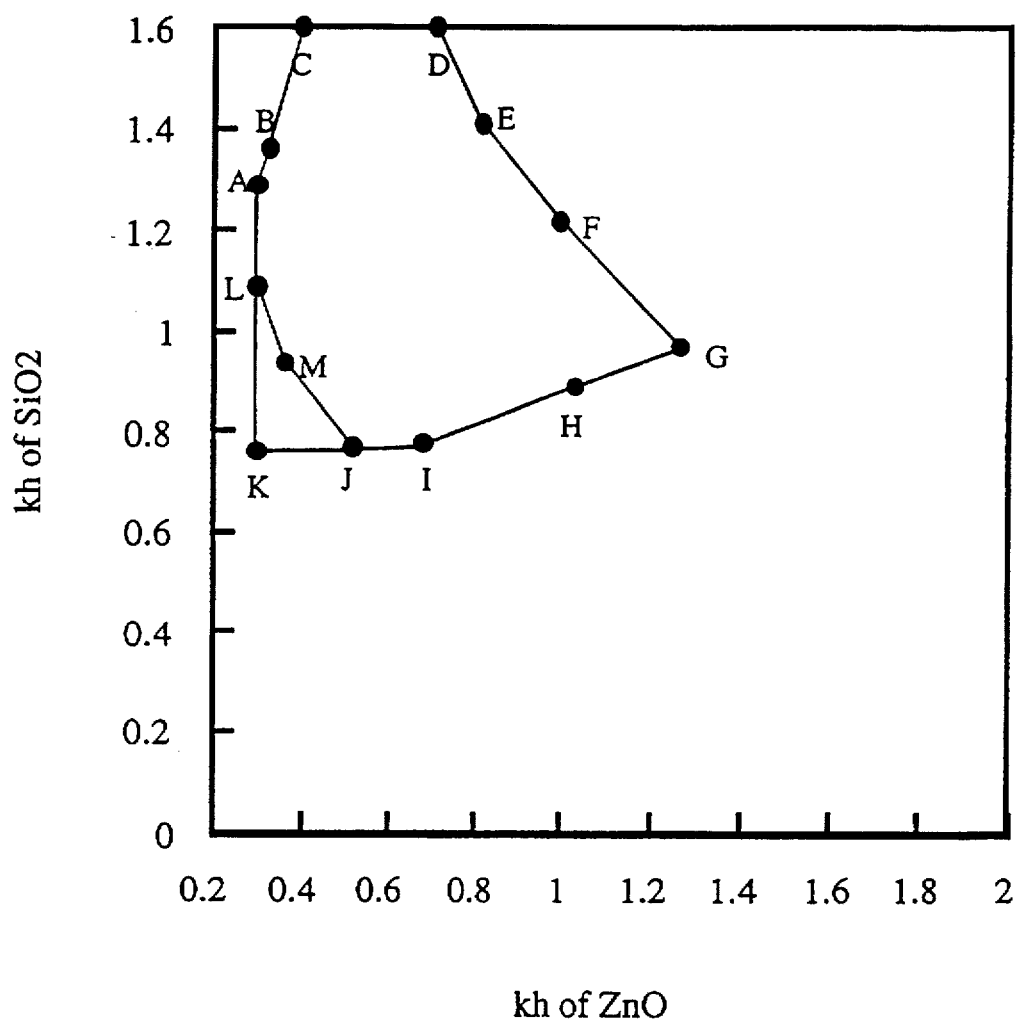
FIG. 5 is a graph in the two-dimensional Cartesian coordinate having abscissa axis of kh1(kh of ZnO) and ordinate axis of kh2(kh of $SiO_2$), illustrating the region ABCDEFGHIJKLA and the region LMJKL for $0.297 \leq kh3 \leq 0.363$.

The distribution of the optimized values of kh1 and kh2, which is obtained by the evaluation of results of Examples 1 to 7 (shown in FIGS. 7 to 23), is shown in FIGS. 1 to 5 by kh3 range. FIG. 1 shows an optimum range of kh1 (kh of ZnO) and kh2 (kh of $SiO_2$) for $0.033 \leq kh3 \leq 0.099$. FIG. 2 shows an optimum range of kh1 and kh2 for $0.099 \leq kh3 \leq 0.165$. FIG. 3 shows an optimum range of kh1 and kh2 for $0.165 \leq kh3 \leq 0.231$. FIG. 4 shows an optimum range of kh1 and kh2 for $0.231 \leq kh3 \leq 0.297$. FIG. 5 shows an optimum range of kh1 and kh2 for $0.297 \leq kh3 \leq 0.363$.

It was found that, in the case of $0.033 \leq kh3 \leq 0.099$, the SAW device having improved performances can be fabricated to have ZnO and $SiO_2$ layers, that have the optimized dimensionless thickness kh1 and kh2 given within the region ABCDEFGHIJKLA shown in FIG. 1. More preferably, SAW device having more improved performances can be fabricated to have kh1 and kh2 given within the region ABIJKLA shown in FIG. 1.

In the case of $0.099 \leq kh3 \leq 0.165$, the SAW device having improved performances can be fabricated to have ZnO and $SiO_2$ layers, that have the optimized dimensionless thickness kh1 and kh2 given within the region ABCDEFGHIJKLMA shown in FIG. 2. More preferably, SAW device having more improved performances can be fabricated to have kh1 and kh2 given within the region ABCNJKLMA shown in FIG. 2.

In the case of $0.165 \leq kh3 \leq 0.231$, the SAW device having improved performances can be fabricated to have ZnO and $SiO_2$ layers, that have the optimized dimensionless thickness kh1 and kh2 given within the region ABCDEFGHIJKLMA shown in FIG. 3. More preferably, SAW device having more improved performances can be fabricated to have kh1 and kh2 given within the region ABNOJKLMA shown in FIG. 3.

In the case of $0.231 \leq kh3 \leq 0.297$, the SAW device having improved performances can be fabricated to have ZnO and $SiO_2$ layers, that have the optimized dimensionless thickness kh1 and kh2 given within the region ABCDEF-GHIJKLMNA shown in FIG. 4. More preferably, SAW device having more improved performances can be fabricated to have kh1 and kh2 given within the region AOPKLMNA shown in FIG. 4.

In the case of 0.297≦kh3≦0.363, the SAW device having improved performances can be fabricated to have ZnO and SiO₂ layers, that have the optimized dimensionless thickness kh1 and kh2 given within the region ABCDEFGHIJKLA shown in FIG. 5. More preferably, SAW device having more improved performances can be fabricated to have kh1 and kh2 given within the region LMJKL shown in FIG. 5.

The improved performances V, TCF and K can be seen with reference to FIGS. 7 to 23. The detailed improvement have been described in the above "SUMMARY OF THE INVENTION" for SAW devices of types A, B, C, D and F.

Figure 27A:
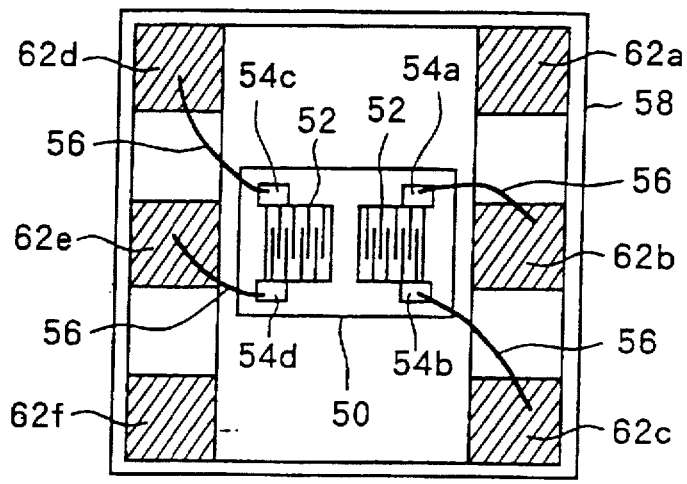
FIG. 27A is a schematic plan view of a exemplary packaged SAW device.
Figure 27B:
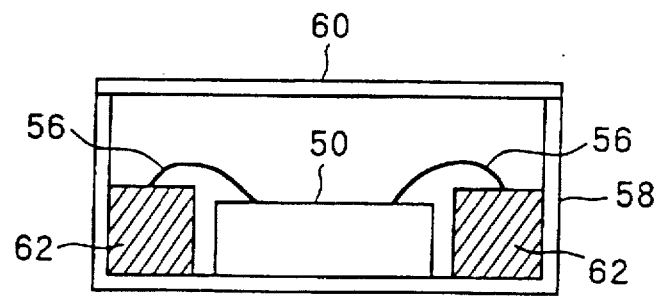
FIG. 27B is a schematic side cross sectional view of the packaged SAW device.
Figure 27C:
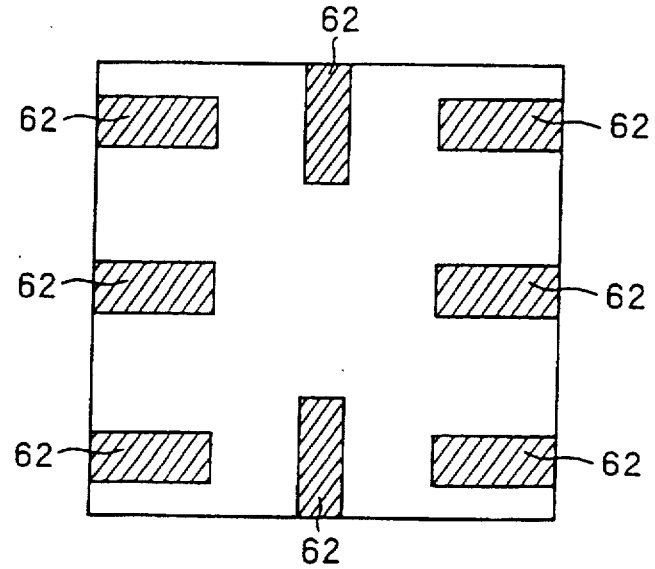
FIG. 27C is a bottom view of the package.

FIGS. 27A to 27C shows an exemplary packaged SAW devices according to the present invention. FIG. 27A is a plan view of a package 58 without lid 60. FIG. 27B is a side cross sectional view of the package, and FIG. 27C is a bottom view of the package. Package 58 is provided with pads 62a–62f for electrodes. A SAW device 50 of the present invention is centrally positioned on the bottom of package 58. Electrodes 54a, 54b, 54c and 54d are provided for the purpose of input to and output from a IDT 52 of SAW device 50. Electrodes 54a, 54b, 54c and 54d are connected to each of pads 62 via wires 56. Lid 60 is welded to package 58, as shown in FIG. 27B.

The packaged SAW device shown in FIGS. 27A to 27C is typically used for various applications, and, for example, used for filters which is typically used in optical communication equipments.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Applications No. 8-295183 (295183/1996) filed on Nov. 7, 1996, No. 7-202114 (202114/1995) filed on Aug. 8, 1995, and No. 9-14158 (14158/1997) filed on Jan. 28, 1997, are hereby incorporated by reference.

What is claimed is:

1. A surface acoustic wave device for 2nd mode surface acoustic wave of a wavelength λ (μm) comprising:

(i) a diamond layer,
(ii) a ZnO layer disposed on said diamond layer, said ZnO layer having a thickness $t_z$,
(iii) an interdigital transducer (IDT) disposed on said ZnO layer, said IDT having a thickness of $t_A$, and
(iv) a SiO₂ layer disposed over said interdigital transducer onto said ZnO layer, said SiO₂ layer having a thickness of $t_s$;

wherein a parameter kh3=2π($t_A$/λ) is:
0.033≦kh3≦0.099, and wherein a parameter kh1=2π($t_z$/λ) and a parameter kh2=2π($t_s$/λ) are given within a region ABCDEF-GHIJKLA in a two-dimensional Cartesin coordinate graph having abscissa axis of kh1 and ordinate axis of kh2, the outer edge of said region ABCDEFGHIJKLA being given by a closed chain in said Cartesian coordinate consisting of points A, B, C, D, E, F, G, H, I, J, K and L and lines A–B, B–C, C–D, D–E, E–F, F–G, G–H, H–I, I–J, J–K, K–L and L–A;

said point A being given by a coordinate point (kh1=0.30, kh2=0.87);
said point B being given by a coordinate point (kh1=0.54, kh2=0.87);
said point C being given by a coordinate point (kh1=0.60, kh2=0.87);
said point D being given by a coordinate point (kh1=0.81, kh2=0.97);
said point E being given by a coordinate point (kh1=1.16, kh2=1.20);
said point F being given by a coordinate point (kh1=1.52, kh2=0.93);
said point G being given by a coordinate point (kh1=1.69, kh2=0.77);
said point H being given by a coordinate point (kh1=1.31, kh2=0.59);
said point I being given by a coordinate point (kh1=1.04, kh2=0.50);
said point J being given by a coordinate point (kh1=0.68, kh2=0.40);
said point K being given by a coordinate point (kh1=0.63, kh2=0.33); and
said point L being given by a coordinate point (kh1=0.30, kh2=0.63).

2. A surface acoustic wave device according to claim 1, wherein said parameters kh1 and kh2 are given within a region ABIJKLA in said two-dimensional Cartesian coordinate graph, the outer edge of said region ABIJKLA being given by a closed chain in said Cartesian coordinate, consisting of said points A, B, I, J, K and L, and lines A–B, B–I, I–J, J–K, K–L and L–A.

3. A surface acoustic wave device for 2nd mode surface acoustic wave of a wavelength λ (μm) comprising:

(i) a diamond layer,
(ii) a ZnO layer disposed on said diamond layer, said ZnO layer having a thickness $t_z$,
(iii) an interdigital transducer (IDT) disposed on said ZnO layer, said IDT having a thickness of $t_A$, and
(iv) a SiO₂ layer disposed over said interdigital transducer onto said ZnO layer, said SiO₂ layer having a thickness of $t_s$;

wherein a parameter kh3=2π($t_A$/λ) is:
0.099≦kh3≦0.165, and wherein a parameter kh1=2π($t_z$/λ) and a parameter kh2=2π($t_s$/λ) are given within a region ABCDEF-GHIJKLMA in a two-dimensional Cartesian coordinate graph having abscissa axis of kh1 and ordinate axis of kh2, the outer edge of said region ABCDEFGHIJKLMA being given by a closed chain in said Cartesian coordinate consisting of points A, B, C, D, E, F, G, H, I, J, K, L and M and lines A–B, B–C, C–D, D–E, E–F, F–G, G–H, H–I, I–J, J–K, K–L, L–M and M–A;

said point A being given by a coordinate point (kh1=0.30, kh2=0.98);
said point B being given by a coordinate point (kh1=0.40, kh2=0.95);
said point C being given by a coordinate point (kh1=0.45, kh2=0.96);
said point D being given by a coordinate point (kh1=0.60, kh2=1.00);
said point E being given by a coordinate point (kh1=1.04, kh2=1.25);

said point F being given by a coordinate point (kh1=1.53, kh2=0.89);

said point G being given by a coordinate point (kh1=1.60, kh2=0.80);

said point H being given by a coordinate point (kh1=1.22, kh2=0.63);

said point I being given by a coordinate point (kh1=1.00, kh2=0.59);

said point J being given by a coordinate point (kh1=0.89, kh2=0.57);

said point K being given by a coordinate point (kh1=0.53, kh2=0.52);

said point L being given by a coordinate point (kh1=0.53, kh2=0.45); and said point M being given by a coordinate point (kh1=0.30, kh2=0.65).

4. A surface acoustic wave device according to claim 2, wherein said parameters kh1 and kh2 are given within a region ABCNJKLMA in said two-dimensional Cartesian coordinate graph, the outer edge of said region ABCNJKLMA being given by a closed chain in said Cartesian coordinate, consisting of said points A, B and C, a point N, and said points J, K, L, and M, and lines A–B, B–C, C–N, N–J, J–K, K–L, L–M and M–A, said point N being given by a coordinate point (kh1=0.62, kh2=0.77).

5. A surface acoustic wave device for 2nd mode surface acoustic wave of a wavelength λ (μm) comprising:

(i) a diamond layer, (ii) a ZnO layer disposed on said diamond layer, said ZnO layer having a thickness $t_z$, (iii) an interdigital transducer (IDT) disposed on said ZnO layer, said IDT having a thickness of $t_A$, and (iv) a SiO$_2$ layer disposed over said interdigital transducer onto said ZnO layer, said SiO$_2$ layer having a thickness of $t_s$;

wherein a parameter kh3=2π($t_A$/λ) is:
0.165≦kh3≦0.231, and wherein a parameter kh1=2π($t_z$/λ) and a parameter kh2=2π($t_s$/λ) are given within a region ABCDEFGHIJKLMA in a two-dimensional Cartesian coordinate graph having abscissa axis of kh1 and ordinate axis of kh2, the outer edge of said region ABCDEFGHIJKLMA being given by a closed chain in said Cartesian coordinate consisting of points A, B, C, D, E, F, G, H, I, J, K, L and M and lines A–B, B–C, C–D, D–E, E–F, F–G, G–H, H–I, I–J, J–K, K–L, L–M and M–A;

said point A being given by a coordinate point (kh1=0.30, kh2=1.07);

said point B being given by a coordinate point (kh1=0.36, kh2=1.07);

said point C being given by a coordinate point (kh1=0.43, kh2=1.07);

said point D being given by a coordinate point (kh1=0.90, kh2=1.37);

said point E being given by a coordinate point (kh1=1.05, kh2=1.20);

said point F being given by a coordinate point (kh1=1.52, kh2=0.85);

said point G being given by a coordinate point (kh1=1.34, kh2=0.79);

said point H being given by a coordinate point (kh1=1.05, kh2=0.72);

said point I being given by a coordinate point (kh1=0.85, kh2=0.68);

said point J being given by a coordinate point (kh1=0.71, kh2=0.68);

said point K being given by a coordinate point (kh1=0.38, kh2=0.68);

said point L being given by a coordinate point (kh1=0.42, kh2=0.55); and said point M being given by a coordinate point (kh1=0.30, kh2=0.65).

6. A surface acoustic wave device according to claim 5, wherein said parameters kh1 and kh2 are given within a region ABNOJKLMA in said two-dimensional Cartesian coordinate graph, the outer edge of said region ABCNJKLMA being given by a closed chain in said Cartesian coordinate, consisting of said points A, B and C, a point N, a point O, and said points J, K, L, and M, and lines A–B, B–C, C–N, N–J, J–K, K–L, L–M and M–A, said point N being given by a coordinate point (kh1=0.43, kh2=0.95); and said point O being given by a coordinate point (kh1=0.61, kh2=0.75).

7. A surface acoustic wave device for 2nd mode surface acoustic wave of a wavelength λ (μm) comprising:

(i) a diamond layer, (ii) a ZnO layer disposed on said diamond layer, said ZnO layer having a thickness $t_z$, (iii) an interdigital transducer (IDT) disposed on said ZnO layer, said IDT having a thickness of $t_A$, and (iv) a SiO$_2$ layer disposed over said interdigital transducer onto said ZnO layer, said SiO$_2$ layer having a thickness of $t_s$;

wherein a parameter kh3=2π($t_A$/λ) is:
0.231≦kh3≦0.297, and wherein a parameter kh1=2π($t_z$/λ) and a parameter kh2=2π($t_s$/λ) are given within a region ABCDEFGHIJKLMNA in a two-dimensional Cartesian coordinate graph having abscissa axis of kh1 and ordinate axis of kh2, the outer edge of said region ABCDEFGHIJKLMNA being given by a closed chain in said Cartesian coordinate consisting of points A, B, C, D, E, F, G, H, I, J, K, L, M and N and lines A–B, B–C, C–D, D–E, E–F, F–G, G–H, H–I, I–J, J–K, K–L, L–M, M–N and N–A;

said point A being given by a coordinate point (kh1=0.30, kh2=1.15);

said point B being given by a coordinate point (kh1=0.38, kh2=1.20);

said point C being given by a coordinate point (kh1=0.46, kh2=1.32);

said point D being given by a coordinate point (kh1=0.60, kh2=1.52);

said point E being given by a coordinate point (kh1=0.73, kh2=1.60);

said point F being given by a coordinate point (kh1=0.81, kh2=1.44);

said point G being given by a coordinate point (kh1=1.00, kh2=1.20);

said point H being given by a coordinate point (kh1=1.40, kh2=0.91);

said point I being given by a coordinate point (kh1=1.14, kh2=0.83);

said point J being given by a coordinate point (kh1=0.83, kh2=0.76);

said point K being given by a coordinate point (kh1=0.60, kh2=0.73);

said point L being given by a coordinate point (kh1=0.35, kh2=0.73);

said point M being given by a coordinate point (kh1=0.38, kh2=0.63); and said point N being given by a coordinate point (kh1=0.30, kh2=0.65).

8. A surface acoustic wave device according to claim 7, wherein said parameters kh1 and kh2 are given within a region AOPKLMNA in said two-dimensional Cartesian coordinate graph, the outer edge of said region AOPKLMNA being given by a closed chain in said Cartesian coordinate, consisting of said point A, a point O, a point P, and said points K, L, M and N, and lines A–O, O–P, P–K, K–L, L–M, M–N and N–A, said point O being given by a coordinate point (kh1=0.36, kh2=1.00); and said point P being given by a coordinate point (kh1=0.48, kh2=0.83).

9. A surface acoustic wave device for 2nd mode surface acoustic wave of a wavelength λ (μm) comprising:

(i) a diamond layer, (ii) a ZnO layer disposed on said diamond layer, said ZnO layer having a thickness $t_z$, (iii) an interdigital transducer (IDT) disposed on said ZnO layer, said IDT having a thickness of $t_A$, and (iv) a SiO$_2$ layer disposed over said interdigital transducer onto said ZnO layer, said SiO$_2$ layer having a thickness of $t_s$;

wherein a parameter kh3=2π($t_A$/λ) is:
0.297≦kh3≦0.363, and wherein a parameter kh1=2π($t_s$/λ) and a parameter kh2=2π($t_z$/λ) are given within a region ABCDEFGHIJKLA in a two-dimensional Cartesian coordinate graph having abscissa axis of kh1 and ordinate axis of kh2, the outer edge of said region ABCDEFGHIJKLA being given by a closed chain in said Cartesian coordinate consisting of points A, B, C, D, E, F, G, H, I, J, K and L and lines A–B, B–C, C–D, D–E, E–F, F–G, G–H, H–I, I–J, J–K, K–L and L–A;

said point A being given by a coordinate point (kh1=0.30, kh2=1.29);

said point B being given by a coordinate point (kh1=0.33, kh2=1.36);

said point C being given by a coordinate point (kh1=0.40, kh2=1.60);

said point D being given by a coordinate point (kh1=0.71, kh2=1.60);

said point E being given by a coordinate point (kh1=0.82, kh2=1.41);

said point F being given by a coordinate point (kh1=1.00, kh2=1.22);

said point G being given by a coordinate point (kh1=1.27, kh2=0.97);

said point H being given by a coordinate point (kh1=1.03, kh2=0.89);

said point I being given by a coordinate point (kh1=0.68, kh2=0.78);

said point J being given by a coordinate point (kh1=0.52, kh2=0.77);

said point K being given by a coordinate point (kh1=0.30, kh2=0.76); and said point L being given by a coordinate point (kh1=0.30, kh2=1.09).

10. A surface acoustic wave device according to claim 9, wherein said parameters kh1 and kh2 are given within a region LMJKL in said two-dimensional Cartesian coordinate graph, the outer edge of said region LMJKL being given by a closed chain in said Cartesian coordinate, consisting of said point L, a point M, and said points J and K, and lines L–M, M–J, J–K and K–L, said point M being given by a coordinate point (kh1=0.37, kh2=0.94).

11. A surface acoustic wave device for 2nd mode surface acoustic wave of a wavelength λ (μm) comprising:

(i) a diamond layer, (ii) a short circuit electrode disposed on said diamond layer, (iii) a ZnO layer disposed over said short circuit electrode onto said diamond layer, said ZnO layer having a thickness $t_z$, (iv) an interdigital transducer (IDT) disposed on said ZnO layer, said IDT having a thickness of $t_A$, and (v) a SiO$_2$ layer disposed over said interdigital transducer onto said ZnO layer, said SiO$_2$ layer having a thickness of $t_s$;

wherein a parameter kh3=2π($t_A$/λ) is:
0.033≦kh3≦0.099, and wherein a parameter kh1=2π($t_s$/λ) and a parameter kh2=2π($t_z$/λ) are given within a region ABCDEFGHIJKLA in a two-dimensional Cartesin coordinate graph having abscissa axis of kh1 and ordinate axis of kh2, the outer edge of said region ABCDEFGHIJKLA being given by a closed chain in said Cartesian coordinate consisting of points A, B, C, D, E, F, G, H, I, J, K and L and lines A–B, B–C, C–D, D–E, E–F, F–G, G–H, H–I, I–J, J–K, K–L and L–A;

said point A being given by a coordinate point (kh1=0.30, kh2=0.87);

said point B being given by a coordinate point (kh1=0.54, kh2=0.87);

said point C being given by a coordinate point (kh1=0.60, kh2=0.87);

said point D being given by a coordinate point (kh1=0.81, kh2=0.97);

said point E being given by a coordinate point (kh1=1.16, kh2=1.20);

said point F being given by a coordinate point (kh1=1.52, kh2=0.93);

said point G being given by a coordinate point (kh1=1.69, kh2=0.77);

said point H being given by a coordinate point (kh1=1.31, kh2=0.59);

said point I being given by a coordinate point (kh1=1.04, kh2=0.50);

said point J being given by a coordinate point (kh1=0.68, kh2=0.40);

said point K being given by a coordinate point (kh1=0.63, kh2=0.33); and said point L being given by a coordinate point (kh1=0.30, kh2=0.63).

12. A surface acoustic wave device according to claim 11, wherein said parameters kh1 and kh2 are given within a region ABIJKLA in said two-dimensional Cartesian coordinate graph, the outer edge of said region ABIJKLA being given by a closed chain in said Cartesian coordinate, consisting of said points A, B, I, J, K and L, and lines A–B, B–I, I–J, J–K, K–L and L–A.

13. A surface acoustic wave device for 2nd mode surface acoustic wave of a wavelength $\lambda$ (μm) comprising:

(i) a diamond layer, (ii) a short circuit electrode disposed on said diamond layer, (iii) a ZnO layer disposed over said short circuit electrode onto said diamond layer, said ZnO layer having a thickness $t_z$, (iv) an interdigital transducer (IDT) disposed on said ZnO layer, said IDT having a thickness of $t_A$, and (v) a SiO$_2$ layer disposed over said interdigital transducer onto said ZnO layer, said SiO$_2$ layer having a thickness of $t_s$;

wherein a parameter kh3=$2\pi(t_A/\lambda)$ is: $0.099 \leq kh3 \leq 0.165$, and wherein a parameter kh1=$2\pi(t_z/\lambda)$ and a parameter kh2=$2\pi(t_s/\lambda)$ are given within a region ABCDEFGHIJKLMA in a two-dimensional Cartesian coordinate graph having abscissa axis of kh1 and ordinate axis of kh2, the outer edge of said region ABCDEFGHIJKLMA being given by a closed chain in said Cartesian coordinate consisting of points A, B, C, D, E, F, G, H, I, J, K, L and M and lines A–B, B–C, C–D, D–E, E–F, F–G, G–H, H–I, I–J, J–K, K–L, L–M and M–A;

said point A being given by a coordinate point (kh1=0.30, kh2=0.98);

said point B being given by a coordinate point (kh1=0.40, kh2=0.95);

said point C being given by a coordinate point (kh1=0.45, kh2=0.96);

said point D being given by a coordinate point (kh1=0.60, kh2=1.00);

said point E being given by a coordinate point (kh1=1.04, kh2=1.25);

said point F being given by a coordinate point (kh1=1.53, kh2=0.89);

said point G being given by a coordinate point (kh1=1.60, kh2=0.80);

said point H being given by a coordinate point (kh1=1.22, kh2=0.63);

said point I being given by a coordinate point (kh1=1.00, kh2=0.59);

said point J being given by a coordinate point (kh1=0.89, kh2=0.57);

said point K being given by a coordinate point (kh1=0.53, kh2=0.52);

said point L being given by a coordinate point (kh1=0.53, kh2=0.45); and said point M being given by a coordinate point (kh1=0.30, kh2=0.65).

14. A surface acoustic wave device according to claim 13, wherein said parameters kh1 and kh2 are given within a region ABCNJKLMA in said two-dimensional Cartesian coordinate graph, the outer edge of said region ABCNJKLMA being given by a closed chain in said Cartesian coordinate, consisting of said points A, B and C, a point N, and said points J, K, L, and M, and lines A–B, B–C, C–N, N–J, J–K, K–L, L–M and M–A, said point N being given by a coordinate point (kh1=0.62, kh2=0.77).

15. A surface acoustic wave device for 2nd mode surface acoustic wave of a wavelength $\lambda$ (μm) comprising:

(i) a diamond layer, (ii) a short circuit electrode disposed on said diamond layer, (iii) a ZnO layer disposed over said short circuit electrode onto said diamond layer, said ZnO layer having a thickness $t_z$, (iv) an interdigital transducer (IDT) disposed on said ZnO layer, said IDT having a thickness of $t_A$ and (v) a SiO$_2$ layer disposed over said interdigital transducer onto said ZnO layer, said SiO$_2$ layer having a thickness of $t_s$;

wherein a parameter kh3=$2\pi(t_A/\lambda)$ is: $0.165 \leq kh3 \leq 0.231$, and wherein a parameter kh1=$2\pi(t_z/\lambda)$ and a parameter kh2=$2\pi(t_s/\lambda)$ are given within a region ABCDEFGHIJKLMA in a two-dimensional Cartesian coordinate graph having abscissa axis of kh1 and ordinate axis of kh2, the outer edge of said region ABCDEFGHIJKLMA being given by a closed chain in said Cartesian coordinate consisting of points A, B, C, D, E, F, G, H, I, J, K, L and M and lines A–B, B–C, C–D, D–E, E–F, F–G, G–H, H–I, I–J, J–K, K–L, L–M and M–A;

said point A being given by a coordinate point (kh1=0.30, kh2=1.07);

said point B being given by a coordinate point (kh1=0.36, kh2=1.07);

said point C being given by a coordinate point (kh1=0.43, kh2=1.07);

said point D being given by a coordinate point (kh1=0.90, kh2=1.37);

said point E being given by a coordinate point (kh1=1.05, kh2=1.20);

said point F being given by a coordinate point (kh1=1.52, kh2=0.85);

said point G being given by a coordinate point (kh1=1.34, kh2=0.79);

said point H being given by a coordinate point (kh1=1.05, kh2=0.72);

said point I being given by a coordinate point (kh1=0.85, kh2=0.68);

said point J being given by a coordinate point (kh1=0.71, kh2=0.68);

said point K being given by a coordinate point (kh1=0.38, kh2=0.68);

said point L being given by a coordinate point (kh1=0.42, kh2=0.55); and said point M being given by a coordinate point (kh1=0.30, kh2=0.65).

16. A surface acoustic wave device according to claim 15, wherein said parameters kh1 and kh2 are given within a region ABNOJKLMA in said two-dimensional Cartesian coordinate graph, the outer edge of said region ABCNJKLMA being given by a closed chain in said Cartesian coordinate, consisting of said points A, B and C, a point N, a point O, and said points J, K, L, and M, and lines A–B, B–C, C–N, N–J, J–K, K–L, L–M and M–A, said point N being given by a coordinate point (kh1=0.43, kh2=0.95); and said point O being given by a coordinate point (kh1=0.61, kh2=0.75).

17. A surface acoustic wave device for 2nd mode surface acoustic wave of a wavelength λ (μm) comprising:
   (i) a diamond layer,
   (ii) a short circuit electrode disposed on said diamond layer,
   (iii) a ZnO layer disposed over said short circuit electrode onto said diamond layer, said ZnO layer having a thickness $t_z$,
   (iv) an interdigital transducer (IDT) disposed on said ZnO layer, said IDT having a thickness of $t_A$, and
   (v) a SiO$_2$ layer disposed over said interdigital transducer onto said ZnO layer, said SiO$_2$ layer having a thickness of $t_s$;
   wherein a parameter kh3=2π($t_A$/λ) is:
   0.231≦kh3≦0.297,
   and wherein a parameter kh1=2π($t_z$/λ) and a parameter kh2=2π($t_s$/λ) are given within a region ABCDEFGHIJKLMNA in a two-dimensional Cartesian coordinate graph having abscissa axis of kh1 and ordinate axis of kh2,
   the outer edge of said region ABCDEFGHIJKLMNA being given by a closed chain in said Cartesian coordinate consisting of points A, B, C, D, E, F, G, H, I, J, K, L, M and N and lines A–B, B–C, C–D, D–E, E–F, F–G, G–H, H–I, I–J, J–K, K–L, L–M, M–N and N–A;
   said point A being given by a coordinate point (kh1=0.30, kh2=1.15);
   said point B being given by a coordinate point (kh1=0.38, kh2=1.20);
   said point C being given by a coordinate point (kh1=0.46, kh2=1.32);
   said point D being given by a coordinate point (kh1=0.60, kh2=1.52);
   said point E being given by a coordinate point (kh1=0.73, kh2=1.60);
   said point F being given by a coordinate point (kh1=0.81, kh2=1.44);
   said point G being given by a coordinate point (kh1=1.00, kh2=1.20);
   said point H being given by a coordinate point (kh1=1.40, kh2=0.91);
   said point I being given by a coordinate point (kh1=1.14, kh2=0.83);
   said point J being given by a coordinate point (kh1=0.83, kh2=0.76);
   said point K being given by a coordinate point (kh1=0.60, kh2=0.73);
   said point L being given by a coordinate point (kh1=0.35, kh2=0.73);
   said point M being given by a coordinate point (kh1=0.38, kh2=0.63); and
   said point N being given by a coordinate point (kh1=0.30, kh2=0.65).

18. A surface acoustic wave device according to claim 17, wherein said parameters kh1 and kh2 are given within a region AOPKLMNA in said two-dimensional Cartesian coordinate graph, the outer edge of said region AOPKLMNA being given by a closed chain in said Cartesian coordinate, consisting of said point A, a point O, a point P, and said points K, L, M and N, and lines A–O, O–P, P–K, K–L, L–M, M–N and N–A, said point O being given by a coordinate point (kh1=0.36, kh2=1.00); and said point P being given by a coordinate point (kh1=0.48, kh2=0.83).

19. A surface acoustic wave device for 2nd mode surface acoustic wave of a wavelength λ (μm) comprising:
   (i) a diamond layer,
   (ii) a short circuit electrode disposed on said diamond layer,
   (iii) a ZnO layer disposed over said short circuit electrode onto said diamond layer, said ZnO layer having a thickness $t_z$,
   (iv) an interdigital transducer (IDT) disposed on said ZnO layer, said IDT having a thickness of $t_A$ and
   (v) a SiO$_2$ layer disposed over said interdigital transducer onto said ZnO layer, said SiO$_2$ layer having a thickness of $t_s$;
   wherein a parameter kh3=2π($t_A$/λ) is:
   0.297≦kh3≦0.363,
   and wherein a parameter kh1=2π($t_z$/λ) and a parameter kh2=2π($t_s$/λ) are given within a region ABCDEFGHIJKLA in a two-dimensional Cartesian coordinate graph having abscissa axis of kh1 and ordinate axis of kh2,
   the outer edge of said region ABCDEFGHIJKLA being given by a closed chain in said Cartesian coordinate consisting of points A, B, C, D, E, F, G, H, I, J, K and L and lines A–B, B–C, C–D, D–E, E–F, F–G, G–H, H–I, I–J, J–K, K–L and L–A;
   said point A being given by a coordinate point (kh1=0.30, kh2=1.29);
   said point B being given by a coordinate point (kh1=0.33, kh2=1.36);
   said point C being given by a coordinate point (kh1=0.40, kh2=1.60);
   said point D being given by a coordinate point (kh1=0.71, kh2=1.60);
   said point E being given by a coordinate point (kh1=0.82, kh2=1.41);
   said point F being given by a coordinate point (kh1=1.00, kh2=1.22);
   said point G being given by a coordinate point (kh1=1.27, kh2=0.97);
   said point H being given by a coordinate point (kh1=1.03, kh2=0.89);
   said point I being given by a coordinate point (kh1=0.68, kh2=0.78);
   said point J being given by a coordinate point (kh1=0.52, kh2=0.77);
   said point K being given by a coordinate point (kh1=0.30, kh2=0.76); and
   said point L being given by a coordinate point (kh1=0.30, kh2=1.09).

20. A surface acoustic wave device according to claim 19, wherein said parameters kh1 and kh2 are given within a region LMJKL in said two-dimensional Cartesian coordinate graph, the outer edge of said region LMJKL being given by a closed chain in said Cartesian coordinate, consisting of said point L, a point M, and said points J and K, and lines L–M, M–J, J–K and K–L, said point M being given by a coordinate point (kh1=0.37, kh2=0.94).

21. A surface acoustic wave device for 2nd mode surface acoustic wave of a wavelength λ (μm) comprising:

(i) a diamond layer, (ii) a ZnO layer disposed on said diamond layer, said ZnO layer having a thickness $t_z$, (iii) an interdigital transducer (IDT) disposed on said ZnO layer, said IDT having a thickness of $t_A$, (iv) a SiO$_2$ layer disposed over said interdigital transducer onto said ZnO layer, said SiO$_2$ layer having a thickness of $t_s$, and (v) a short circuit electrode disposed on said SiO$_2$ layer;

wherein a parameter kh3=2π($t_A$/λ) is:
0.033≦kh3≦0.099, and wherein a parameter kh1=2π($t_z$/λ) and a parameter kh2=2π($t_s$/λ) are given within a region ABCDEFGHIJKLA in a two-dimensional Cartesin coordinate graph having abscissa axis of kh1 and ordinate axis of kh2, the outer edge of said region ABCDEFGHIJKLA being given by a closed chain in said Cartesian coordinate consisting of points A, B, C, D, E, F, G, H, I, J, K and L and lines A–B, B–C, C–D, D–E, E–F, F–G, G–H, H–I, I–J, J–K, K–L and L–A;

said point A being given by a coordinate point (kh1=0.30, kh2=0.87);

said point B being given by a coordinate point (kh1=0.54, kh2=0.87);

said point C being given by a coordinate point (kh1=0.60, kh2=0.87);

said point D being given by a coordinate point (kh1=0.81, kh2=0.97);

said point E being given by a coordinate point (kh1=1.16, kh2=1.20);

said point F being given by a coordinate point (kh1=1.52, kh2=0.93);

said point G being given by a coordinate point (kh1=1.69, kh2=0.77);

said point H being given by a coordinate point (kh1=1.31, kh2=0.59);

said point I being given by a coordinate point (kh1=1.04, kh2=0.50);

said point J being given by a coordinate point (kh1=0.68, kh2=0.40);

said point K being given by a coordinate point (kh1=0.63, kh2=0.33); and said point L being given by a coordinate point (kh1=0.30, kh2=0.63).

22. A surface acoustic wave device according to claim 21, wherein said parameters kh1 and kh2 are given within a region ABIJKLA in said two-dimensional Cartesian coordinate graph, the outer edge of said region ABIJKLA being given by a closed chain in said Cartesian coordinate, consisting of said points A, B, I, J, K and L, and lines A–B, B–I, I–J, J–K, K–L and L–A.

23. A surface acoustic wave device for 2nd mode surface acoustic wave of a wavelength λ (μm) comprising:

(i) a diamond layer, (ii) a ZnO layer disposed on said diamond layer, said ZnO layer having a thickness $t_z$, (iii) an interdigital transducer (IDT) disposed on said ZnO layer, said IDT having a thickness of $t_A$, (iv) a SiO$_2$ layer disposed over said interdigital transducer onto said ZnO layer, said SiO$_2$ layer having a thickness of $t_s$, and (v) a short circuit electrode disposed on said SiO$_2$ layer;

wherein a parameter kh3=2π($t_A$/λ) is:
0.099≦kh3≦0.165, and wherein a parameter kh1=2π($t_z$/λ) and a parameter kh2=2π($t_s$/λ) are given within a region ABCDEFGHIJKLMA in a two-dimensional Cartesian coordinate graph having abscissa axis of kh1 and ordinate axis of kh2, the outer edge of said region ABCDEFGHIJKLMA being given by a closed chain in said Cartesian coordinate consisting of points A, B, C, D, E, F, G, H, I, J, K, L and M and lines A–B, B–C, C–D, D–E, E–F, F–G, G–H, H–I, I–J, J–K, K–L, L–M and M–A;

said point A being given by a coordinate point (kh1=0.30, kh2=0.98);

said point B being given by a coordinate point (kh1=0.40, kh2=0.95);

said point C being given by a coordinate point (kh1=0.45, kh2=0.96);

said point D being given by a coordinate point (kh1=0.60, kh2=1.00);

said point E being given by a coordinate point (kh1=1.04, kh2=1.25);

said point F being given by a coordinate point (kh1=1.53, kh2=0.89);

said point G being given by a coordinate point (kh1=1.60, kh2=0.80);

said point H being given by a coordinate point (kh1=1.22, kh2=0.63);

said point I being given by a coordinate point (kh1=1.00, kh2=0.59);

said point J being given by a coordinate point (kh1=0.89, kh2=0.57);

said point K being given by a coordinate point (kh1=0.53, kh2=0.52);

said point L being given by a coordinate point (kh1=0.53, kh2=0.45); and said point M being given by a coordinate point (kh1=0.30, kh2=0.65).

24. A surface acoustic wave device according to claim 23, wherein said parameters kh1 and kh2 are given within a region ABCNJKLMA in said two-dimensional Cartesian coordinate graph, the outer edge of said region ABCNJKLMA being given by a closed chain in said Cartesian coordinate, consisting of said points A, B and C, a point N, and said points J, K, L, and M, and lines A–B, B–C, C–N, N–J, J–K, K–L, L–M and M–A, said point N being given by a coordinate point (kh1=0.62, kh2=0.77).

25. A surface acoustic wave device for 2nd mode surface acoustic wave of a wavelength λ (μm) comprising:

(i) a diamond layer, (ii) a ZnO layer disposed on said diamond layer, said ZnO layer having a thickness $t_z$, (iii) an interdigital transducer (IDT) disposed on said ZnO layer, said IDT having a thickness of $t_A$, (iv) a $SiO_2$ layer disposed over said interdigital transducer onto said ZnO layer, said $SiO_2$ layer having a thickness of $t_s$, and (v) a short circuit electrode disposed on said $SiO_2$ layer;

wherein a parameter $kh3=2\pi(t_A/\lambda)$ is:
$0.165 \leq kh3 \leq 0.231$, and wherein a parameter $kh1=2\pi(t_z/\lambda)$ and a parameter $kh2=2\pi(t_s/\lambda)$ are given within a region ABCDEFGHIJKLMA in a two-dimensional Cartesian coordinate graph having abscissa axis of kh1 and ordinate axis of kh2, the outer edge of said region ABCDEFGHIJKLMA being given by a closed chain in said Cartesian coordinate consisting of points A, B, C, D, E, F, G, H, I, J, K, L and M and lines A–B, B–C, C–D, D–E, E–F, F–G, G–H, H–I, I–J, J–K, K–L, L–M and M–A;

said point A being given by a coordinate point (kh1=0.30, kh2=1.07);

said point B being given by a coordinate point (kh1=0.36, kh2=1.07);

said point C being given by a coordinate point (kh1=0.43, kh2=1.07);

said point D being given by a coordinate point (kh1=0.90, kh2=1.37);

said point E being given by a coordinate point (kh1=1.05, kh2=1.20);

said point F being given by a coordinate point (kh1=1.52, kh2=0.85);

said point G being given by a coordinate point (kh1=1.34, kh2=0.79);

said point H being given by a coordinate point (kh1=1.05, kh2=0.72);

said point I being given by a coordinate point (kh1=0.85, kh2=0.68);

said point J being given by a coordinate point (kh1=0.71, kh2=0.68);

said point K being given by a coordinate point (kh1=0.38, kh2=0.68);

said point L being given by a coordinate point (kh1=0.42, kh2=0.55); and said point M being given by a coordinate point (kh1=0.30, kh2=0.65).

26. A surface acoustic wave device according to claim 25, wherein said parameters kh1 and kh2 are given within a region ABNOJKLMA in said two-dimensional Cartesian coordinate graph, the outer edge of said region ABCNJKLMA being given by a closed chain in said Cartesian coordinate, consisting of said points A, B and C, a point N, a point O, and said points J, K, L, and M, and lines A–B, B–C, C–N, N–J, J–K, K–L, L–M and M–A, said point N being given by a coordinate point (kh1=0.43, kh2=0.95); and said point O being given by a coordinate point (kh1=0.61, kh2=0.75).

27. A surface acoustic wave device for 2nd mode surface acoustic wave of a wavelength $\lambda$ (μm) comprising:

(i) a diamond layer, (ii) a ZnO layer disposed on said diamond layer, said ZnO layer having a thickness $t_z$, (iii) an interdigital transducer (IDT) disposed on said ZnO layer, said IDT having a thickness of $t_A$, (iv) a $SiO_2$ layer disposed over said interdigital transducer onto said ZnO layer, said $SiO_2$ layer having a thickness of $t_s$, and (v) a short circuit electrode disposed on said $SiO_2$ layer;

wherein a parameter $kh3=2\pi(t_A/\lambda)$ is:
$0.231 \leq kh3 \leq 0.297$, and wherein a parameter $kh1=2\pi(t_z/\lambda)$ and a parameter $kh2=2\pi(t_s/\lambda)$ are given within a region ABCDEFGHIJKLMNA in a two-dimensional Cartesian coordinate graph having abscissa axis of kh1 and ordinate axis of kh2, the outer edge of said region ABCDEFGHIJKLMNA being given by a closed chain in said Cartesian coordinate consisting of points A, B, C, D, E, F, G, H, I, J, K, L, M and N and lines A–B, B–C, C–D, D–E, E–F, F–G, G–H, H–I, I–J, J–K, K–L, L–M, M–N and N–A;

said point A being given by a coordinate point (kh1=0.30, kh2=1.15);

said point B being given by a coordinate point (kh1=0.38, kh2=1.20);

said point C being given by a coordinate point (kh1=0.46, kh2=1.32);

said point D being given by a coordinate point (kh1=0.60, kh2=1.52);

said point E being given by a coordinate point (kh1=0.73, kh2=1.60);

said point F being given by a coordinate point (kh1=0.81, kh2=1.44);

said point G being given by a coordinate point (kh1=1.00, kh2=1.20);

said point H being given by a coordinate point (kh1=1.40, kh2=0.91);

said point I being given by a coordinate point (kh1=1.14, kh2=0.83);

said point J being given by a coordinate point (kh1=0.83, kh2=0.76);

said point K being given by a coordinate point (kh1=0.60, kh2=0.73);

said point L being given by a coordinate point (kh1=0.35, kh2=0.73);

said point M being given by a coordinate point (kh1=0.38, kh2=0.63); and said point N being given by a coordinate point (kh1=0.30, kh2=0.65).

28. A surface acoustic wave device according to claim 27, wherein said parameters kh1 and kh2 are given within a region AOPKLMNA in said two-dimensional Cartesian coordinate graph, the outer edge of said region AOPKLMNA being given by a closed chain in said Cartesian coordinate, consisting of said point A, a point O, a point P, and said points K, L, M and N, and lines A–O, O–P, P–K, K–L, L–M, M–N and N–A, said point O being given by a coordinate point (kh1=0.36, kh2=1.00); and said point P being given by a coordinate point (kh1=0.48, kh2=0.83).

29. A surface acoustic wave device for 2nd mode surface acoustic wave of a wavelength $\lambda$ (μm) comprising:

(i) a diamond layer, (ii) a ZnO layer disposed on said diamond layer, said ZnO layer having a thickness $t_z$, (iii) an interdigital transducer (IDT) disposed on said ZnO layer, said IDT having a thickness of $t_A$,

49

(iv) a SiO$_2$ layer disposed over said interdigital transducer onto said ZnO layer, said SiO$_2$ layer having a thickness of t$_s$, and (v) a short circuit electrode disposed on said SiO$_2$ layer;

wherein a parameter kh3=2π(t$_A$/λ) is:
0.297≦kh3≦0.363, and wherein a parameter kh1=2π(t$_z$/λ) and a parameter kh2=2π(t$_s$/λ) are given within a region ABCDEFGHIJKLA in a two-dimensional Cartesian coordinate graph having abscissa axis of kh1 and ordinate axis of kh2, the outer edge of said region ABCDEFGHIJKLA being given by a closed chain in said Cartesian coordinate consisting of points A, B, C, D, E, F, G, H, I, J, K and L and lines A–B, B–C, C–D, D–E, E–F, F–G, G–H, H–I, I–J, J–K, K–L and L–A;

said point A being given by a coordinate point (kh1=0.30, kh2=1.29);

said point B being given by a coordinate point (kh1=0.33, kh2=1.36);

said point C being given by a coordinate point (kh1=0.40, kh2=1.60);

said point D being given by a coordinate point (kh1=0.71, kh2=1.60);

said point E being given by a coordinate point (kh1=0.82, kh2=1.41);

said point F being given by a coordinate point (kh1=1.00, kh2=1.22);

said point G being given by a coordinate point (kh1=1.27, kh2=0.97);

said point H being given by a coordinate point (kh1=1.03, kh2=0.89);

said point I being given by a coordinate point (kh1=0.68, kh2=0.78);

said point J being given by a coordinate point (kh1=0.52, kh2=0.77);

said point K being given by a coordinate point (kh1=0.30, kh2=0.76); and said point L being given by a coordinate point (kh1=0.30, kh2=1.09).

30. A surface acoustic wave device according to claim 29, wherein said parameters kh1 and kh2 are given within a region LMJKL in said two-dimensional Cartesian coordinate graph, the outer edge of said region LMJKL being given by a closed chain in said Cartesian coordinate, consisting of said point L, a point M, and said points J and K, and lines L–M, M–J, J–K and K–L, said point M being given by a coordinate point (kh1=0.37, kh2=0.94).

31. A surface acoustic wave device for 2nd mode surface acoustic wave of a wavelength λ (μm) comprising:

(i) a diamond layer, (ii) a first short circuit electrode disposed on said diamond layer, (iii) a ZnO layer disposed over said short circuit electrode onto said diamond layer, said ZnO layer having a thickness t$_z$, (iv) an interdigital transducer (IDT) disposed on said ZnO layer, said IDT having a thickness of t$_A$, (v) an SiO$_2$ layer disposed over said interdigital transducer onto said ZnO layer, said SiO$_2$ layer having a thickness of t$_s$, and

50

(vi) a second short circuit electrode disposed on said SiO$_2$ layer;

wherein a parameter kh3=2π(t$_A$/λ) is:
0.033≦kh3≦0.099, and wherein a parameter kh1=2π(t$_z$/λ) and a parameter kh2=2π(t$_s$/λ) are given within a region ABCDEFGHIJKLA in a two-dimensional Cartesin coordinate graph having abscissa axis of kh1 and ordinate axis of kh2, the outer edge of said region ABCDEFGHIJKLA being given by a closed chain in said Cartesian coordinate consisting of points A, B, C, D, E, F, G, H, I, J, K and L and lines A–B, B–C, C–D, D–E, E–F, F–G, G–H, H–I, I–J, J–K, K–L and L–A;

said point A being given by a coordinate point (kh1=0.30, kh2=0.87);

said point B being given by a coordinate point (kh1=0.54, kh2=0.87);

said point C being given by a coordinate point (kh1=0.60, kh2=0.87);

said point D being given by a coordinate point (kh1=0.81, kh2=0.97);

said point E being given by a coordinate point (kh1=1.16, kh2=1.20);

said point F being given by a coordinate point (kh1=1.52, kh2=0.93);

said point G being given by a coordinate point (kh1=1.69, kh2=0.77);

said point H being given by a coordinate point (kh1=1.31, kh2=0.59);

said point I being given by a coordinate point (kh1=1.04, kh2=0.50);

said point J being given by a coordinate point (kh1=0.68, kh2=0.40);

said point K being given by a coordinate point (kh1=0.63, kh2=0.33); and said point L being given by a coordinate point (kh1=0.30, kh2=0.63).

32. A surface acoustic wave device according to claim 31, wherein said parameters kh1 and kh2 are given within a region ABIJKLA in said two-dimensional Cartesian coordinate graph, the outer edge of said region ABIJKLA being given by a closed chain in said Cartesian coordinate, consisting of said points A, B, I, J, K and L, and lines A–B, B–I, I–J, J–K, K–L and L–A.

33. A surface acoustic wave device for 2nd mode surface acoustic wave of a wavelength λ (μm) comprising:

(i) a diamond layer, (ii) a first short circuit electrode disposed on said diamond layer, (iii) a ZnO layer disposed over said short circuit electrode onto said diamond layer, said ZnO layer having a thickness t$_z$, (iv) an interdigital transducer (IDT) disposed on said ZnO layer, said IDT having a thickness of t$_A$, (v) an SiO$_2$ layer disposed over said interdigital transducer onto said ZnO layer, said SiO$_2$ layer having a thickness of t$_s$, and (vi) a second short circuit electrode disposed on said SiO$_2$ layer;

wherein a parameter kh3=2π(t$_A$/λ) is:
0.099≦kh3≦0.165, and wherein a parameter kh1=2π(t_z/λ) and a parameter kh2=2π(t_z/λ) are given within a region ABCDEFGHIJKLMA in a two-dimensional Cartesian coordinate graph having abscissa axis of kh1 and ordinate axis of kh2, the outer edge of said region ABCDEFGHIJKLMA being given by a closed chain in said Cartesian coordinate consisting of points A, B, C, D, E, F, G, H, I, J, K, L and M and lines A–B, B–C, C–D, D–E, E–F, F–G, G–H, H–I, I–J, J–K, K–L, L–M and M–A;

said point A being given by a coordinate point (kh1=0.30, kh2=0.98);

said point B being given by a coordinate point (kh1=0.40, kh2=0.95);

said point C being given by a coordinate point (kh1=0.45, kh2=0.96);

said point D being given by a coordinate point (kh1=0.60, kh2=1.00);

said point E being given by a coordinate point (kh1=1.04, kh2=1.25);

said point F being given by a coordinate point (kh1=1.53, kh2=0.89);

said point G being given by a coordinate point (kh1=1.60, kh2=0.80);

said point H being given by a coordinate point (kh1=1.22, kh2=0.63);

said point I being given by a coordinate point (kh1=1.00, kh2=0.59);

said point J being given by a coordinate point (kh1=0.89, kh2=0.57);

said point K being given by a coordinate point (kh1=0.53, kh2=0.52);

said point L being given by a coordinate point (kh1=0.53, kh2=0.45); and said point M being given by a coordinate point (kh1=0.30, kh2=0.65).

34. A surface acoustic wave device according to claim 33, wherein said parameters kh1 and kh2 are given within a region ABCNJKLMA in said two-dimensional Cartesian coordinate graph, the outer edge of said region ABCNJKLMA being given by a closed chain in said Cartesian coordinate, consisting of said points A, B and C, a point N, and said points J, K, L, and M, and lines A–B, B–C, C–N, N–J, J–K, K–L, L–M and M–A, said point N being given by a coordinate point (kh1=0.62, kh2=0.77).

35. A surface acoustic wave device for 2nd mode surface acoustic wave of a wavelength λ (μm) comprising:

(i) a diamond layer, (ii) a first short circuit electrode disposed on said diamond layer, (iii) a ZnO layer disposed over said short circuit electrode onto said diamond layer, said ZnO layer having a thickness $t_z$, (iv) an interdigital transducer (IDT) disposed on said ZnO layer, said IDT having a thickness of $t_A$, (v) an SiO$_2$ layer disposed over said interdigital transducer onto said ZnO layer, said SiO$_2$ layer having a thickness of $t_s$, and (vi) a second short circuit electrode disposed on said SiO$_2$ layer;

wherein a parameter kh3=2π(t_A/λ) is:

0.165≤kh3≤0.231, and wherein a parameter kh1=2π(t_z/λ) and a parameter kh2=2π(t_z/λ) are given within a region ABCDEFGHIJKLMA in a two-dimensional Cartesian coordinate graph having abscissa axis of kh1 and ordinate axis of kh2, the outer edge of said region ABCDEFGHIJKLMA being given by a closed chain in said Cartesian coordinate consisting of points A, B, C, D, E, F, G, H, I, J, K, L and M and lines A–B, B–C, C–D, D–E, E–F, F–G, G–H, H–I, I–J, J–K, K–L, L–M and M–A;

said point A being given by a coordinate point (kh1=0.30, kh2=1.07);

said point B being given by a coordinate point (kh1=0.36, kh2=1.07);

said point C being given by a coordinate point (kh1=0.43, kh2=1.07);

said point D being given by a coordinate point (kh1=0.90, kh2=1.37);

said point E being given by a coordinate point (kh1=1.05, kh2=1.20);

said point F being given by a coordinate point (kh1=1.52, kh2=0.85);

said point G being given by a coordinate point (kh1=1.34, kh2=0.79);

said point H being given by a coordinate point (kh1=1.05, kh2=0.72);

said point I being given by a coordinate point (kh1=0.85, kh2=0.68);

said point J being given by a coordinate point (kh1=0.71, kh2=0.68);

said point K being given by a coordinate point (kh1=0.38, kh2=0.68);

said point L being given by a coordinate point (kh1=0.42, kh2=0.55); and said point M being given by a coordinate point (kh1=0.30, kh2=0.65).

36. A surface acoustic wave device according to claim 35, wherein said parameters kh1 and kh2 are given within a region ABNOJKLMA in said two-dimensional Cartesian coordinate graph, the outer edge of said region ABCNJKLMA being given by a closed chain in said Cartesian coordinate, consisting of said points A, B and C, a point N, a point O, and said points J, K, L, and M, and lines A–B, B–C, C–N, N–J, J–K, K–L, L–M and M–A, said point N being given by a coordinate point (kh1=0.43, kh2=0.95); and said point O being given by a coordinate point (kh1=0.61, kh2=0.75).

37. A surface acoustic wave device for 2nd mode surface acoustic wave of a wavelength λ (μm) comprising:

(i) a diamond layer, (ii) a first short circuit electrode disposed on said diamond layer, (iii) a ZnO layer disposed over said short circuit electrode onto said diamond layer, said ZnO layer having a thickness $t_z$, (iv) an interdigital transducer (IDT) disposed on said ZnO layer, said IDT having a thickness of $t_A$, (v) an SiO$_2$ layer disposed over said interdigital transducer onto said ZnO layer, said SiO$_2$ layer having a thickness of $t_s$, and (vi) a second short circuit electrode disposed on said SiO$_2$ layer;

wherein a parameter kh3=2π(t$_A$/λ) is:
0.231≦kh3≦0.297, and wherein a parameter kh1=2π(t$_e$/λ) and a parameter kh2=2π(t$_z$/λ) are given within a region ABCDEFGHIJKLMNA in a two-dimensional Cartesian coordinate graph having abscissa axis of kh1 and ordinate axis of kh2, the outer edge of said region ABCDEFGHIJKLMNA being given by a closed chain in said Cartesian coordinate consisting of points A, B, C, D, E, F, G, H, I, J, K, L, M and N and lines A–B, B–C, C–D, D–E, E–F, F–G, G–H, H–I, I–J, J–K, K–L, L–M, M–N and N–A;

said point A being given by a coordinate point (kh1=0.30, kh2=1.15);

said point B being given by a coordinate point (kh1=0.38, kh2=1.20);

said point C being given by a coordinate point (kh1=0.46, kh2=1.32);

said point D being given by a coordinate point (kh1=0.60, kh2=1.52);

said point E being given by a coordinate point (kh1=0.73, kh2=1.60);

said point F being given by a coordinate point (kh1=0.81, kh2=1.44);

said point G being given by a coordinate point (kh1=1.00, kh2=1.20);

said point H being given by a coordinate point (kh1=1.40, kh2=0.91);

said point I being given by a coordinate point (kh1=1.14, kh2=0.83);

said point J being given by a coordinate point (kh1=0.83, kh2=0.76);

said point K being given by a coordinate point (kh1=0.60, kh2=0.73);

said point L being given by a coordinate point (kh1=0.35, kh2=0.73);

said point M being given by a coordinate point (kh1=0.38, kh2=0.63); and said point N being given by a coordinate point (kh1=0.30, kh2=0.65).

38. A surface acoustic wave device according to claim 37, wherein said parameters kh1 and kh2 are given within a region AOPKLMNA in said two-dimensional Cartesian coordinate graph, the outer edge of said region AOPKLMNA being given by a closed chain in said Cartesian coordinate, consisting of said point A, a point O, a point P, and said points K, L, M and N, and lines A–O, O–P, P–K, K–L, L–M, M–N and N–A, said point O being given by a coordinate point (kh1=0.36, kh2=1.00); and said point P being given by a coordinate point (kh1=0.48, kh2=0.83).

39. A surface acoustic wave device for 2nd mode surface acoustic wave of a wavelength λ (μm) comprising:

(i) a diamond layer, (ii) a first short circuit electrode disposed on said diamond layer, (iii) a ZnO layer disposed over said short circuit electrode onto said diamond layer, said ZnO layer having a thickness t$_z$, (iv) an interdigital transducer (IDT) disposed on said ZnO layer, said IDT having a thickness of t$_A$, (v) an SiO$_2$ layer disposed over said interdigital transducer onto said ZnO layer, said SiO$_2$ layer having a thickness of t$_s$, and (vi) a second short circuit electrode disposed on said SiO$_2$ layer;

wherein a parameter kh3=2π(t$_A$/λ) is:
0.297≦kh3≦0.363, and wherein a parameter kh1=2π(t$_z$/λ) and a parameter kh2=2π(t$_s$/λ) are given within a region ABCDEFGHIJKLA in a two-dimensional Cartesian coordinate graph having abscissa axis of kh1 and ordinate axis of kh2, the outer edge of said region ABCDEFGHIJKLA being given by a closed chain in said Cartesian coordinate consisting of points A, B, C, D, E, F, G, H, I, J, K and L and lines A–B, B–C, C–D, D–E, E–F, F–G, G–H, H–I, I–J, J–K, K–L and L–A;

said point A being given by a coordinate point (kh1=0.30, kh2=1.29);

said point B being given by a coordinate point (kh1=0.33, kh2=1.36);

said point C being given by a coordinate point (kh1=0.40, kh2=1.60);

said point D being given by a coordinate point (kh1=0.71, kh2=1.60);

said point E being given by a coordinate point (kh1=0.82, kh2=1.41);

said point F being given by a coordinate point (kh1=1.00, kh2=1.22);

said point G being given by a coordinate point (kh1=1.27, kh2=0.97);

said point H being given by a coordinate point (kh1=1.03, kh2=0.89);

said point I being given by a coordinate point (kh1=0.68, kh2=0.78);

said point J being given by a coordinate point (kh1=0.52, kh2=0.77);

said point K being given by a coordinate point (kh1=0.30, kh2=0.76); and said point L being given by a coordinate point (kh1=0.30, kh2=1.09).

40. A surface acoustic wave device according to claim 39, wherein said parameters kh1 and kh2 are given within a region LMJKL in said two-dimensional Cartesian coordinate graph, the outer edge of said region LMJKL being given by a closed chain in said Cartesian coordinate, consisting of said point L, a point M, and said points J and K, and lines L–M, M–J, J–K and K–L, said point M being given by a coordinate point (kh1=0.37, kh2=0.94).

41. A surface acoustic wave device for 2nd mode surface acoustic wave of a wavelength λ (μm) comprising:

(i) a diamond layer, (ii) an interdigital transducer (IDT) disposed on said diamond layer, said IDT having a thickness of t$_A$, (iii) a ZnO layer disposed over said interdigital transducer onto said diamond layer, said ZnO layer having a thickness t$_z$, (iv) a short circuit electrode disposed on said ZnO layer, and (v) an SiO$_2$ layer disposed over said short circuit electrode onto said ZnO layer, said SiO$_2$ layer having a thickness of t$_s$;

wherein a parameter kh3=2π(t$_A$/λ) is:
0.033≤kh3≤0.099, and wherein a parameter kh1=2π(t$_z$/λ) and a parameter kh2=2π(t$_s$/λ) are given within a region ABCDEFGHIJKLA in a two-dimensional Cartesin coordinate graph having abscissa axis of kh1 and ordinate axis of kh2, the outer edge of said region ABCDEFGHIJKLA being given by a closed chain in said Cartesian coordinate consisting of points A, B, C, D, E, F, G, H, I, J, K and L and lines A–B, B–C, C–D, D–E, E–F, F–G, G–H, H–I, I–J, J–K, K–L and L–A;

said point A being given by a coordinate point (kh1=0.30, kh2=0.87);

said point B being given by a coordinate point (kh1=0.54, kh2=0.87);

said point C being given by a coordinate point (kh1=0.60, kh2=0.87);

said point D being given by a coordinate point (kh1=0.81, kh2=0.97);

said point E being given by a coordinate point (kh1=1.16, kh2=1.20);

said point F being given by a coordinate point (kh1=1.52, kh2=0.93);

said point G being given by a coordinate point (kh1=1.69, kh2=0.77);

said point H being given by a coordinate point (kh1=1.31, kh2=0.59);

said point I being given by a coordinate point (kh1=1.04, kh2=0.50);

said point J being given by a coordinate point (kh1=0.68, kh2=0.40);

said point K being given by a coordinate point (kh1=0.63, kh2=0.33); and said point L being given by a coordinate point (kh1=0.30, kh2=0.63).

42. A surface acoustic wave device according to claim 41, wherein said parameters kh1 and kh2 are given within a region ABIJKLA in said two-dimensional Cartesian coordinate graph, the outer edge of said region ABIJKLA being given by a closed chain in said Cartesian coordinate, consisting of said points A, B, I, J, K and L, and lines A–B, B–I, I–J, J–K, K–L and L–A.

43. A surface acoustic wave device for 2nd mode surface acoustic wave of a wavelength λ (μm) comprising:

(i) a diamond layer, (ii) an interdigital transducer (IDT) disposed on said diamond layer, said IDT having a thickness of t$_A$, (iii) a ZnO layer disposed over said interdigital transducer onto said diamond layer, said ZnO layer having a thickness t$_z$, (iv) a short circuit electrode disposed on said ZnO layer, and (v) an SiO$_2$ layer disposed over said short circuit electrode onto said ZnO layer, said SiO$_2$ layer having a thickness of t$_s$;

wherein a parameter kh3=2π(t$_A$/λ) is:
0.099≤kh3≤0.165, and wherein a parameter kh1=2π(t$_z$/λ) and a parameter kh2=2π(t$_s$/λ) are given within a region ABCDEFGHIJKLMA in a two-dimensional Cartesian coordinate graph having abscissa axis of kh1 and ordinate axis of kh2, the outer edge of said region ABCDEFGHIJKLMA being given by a closed chain in said Cartesian coordinate consisting of points A, B, C, D, E, F, G, H, I, J, K, L and M and lines A–B, B–C, C–D, D–E, E–F, F–G, G–H, H–I, I–J, J–K, K–L, L–M and M–A;

said point A being given by a coordinate point (kh1=0.30, kh2=0.98);

said point B being given by a coordinate point (kh1=0.40, kh2=0.95);

said point C being given by a coordinate point (kh1=0.45, kh2=0.96);

said point D being given by a coordinate point (kh1=0.60, kh2=1.00);

said point E being given by a coordinate point (kh1=1.04, kh2=1.25);

said point F being given by a coordinate point (kh1=1.53, kh2=0.89);

said point G being given by a coordinate point (kh1=1.60, kh2=0.80);

said point H being given by a coordinate point (kh1=1.22, kh2=0.63);

said point I being given by a coordinate point (kh1=1.00, kh2=0.59);

said point J being given by a coordinate point (kh1=0.89, kh2=0.57);

said point K being given by a coordinate point (kh1=0.53, kh2=0.52);

said point L being given by a coordinate point (kh1=0.53, kh2=0.45); and said point M being given by a coordinate point (kh1=0.30, kh2=0.65).

44. A surface acoustic wave device according to claim 43, wherein said parameters kh1 and kh2 are given within a region ABCNJKLMA in said two-dimensional Cartesian coordinate graph, the outer edge of said region ABCNJKLMA being given by a closed chain in said Cartesian coordinate, consisting of said points A, B and C, a point N, and said points J, K, L, and M, and lines A–B, B–C, C–N, N–J, J–K, K–L, L–M and M–A, said point N being given by a coordinate point (kh1=0.62, kh2=0.77).

45. A surface acoustic wave device for 2nd mode surface acoustic wave of a wavelength λ (μm) comprising:

(i) a diamond layer, (ii) an interdigital transducer (IDT) disposed on said diamond layer, said IDT having a thickness of t$_A$, (iii) a ZnO layer disposed over said interdigital transducer onto said diamond layer, said ZnO layer having a thickness t$_z$, (iv) a short circuit electrode disposed on said ZnO layer, and (v) an SiO$_2$ layer disposed over said short circuit electrode onto said ZnO layer, said SiO$_2$ layer having a thickness of t$_s$;

wherein a parameter kh3=2π(t$_A$/λ) is:
0.165≤kh3≤0.231, and wherein a parameter kh1=2π(t$_z$/λ) and a parameter kh2=2π(t$_s$/λ) are given within a region ABCDEFGHIJKLMA in a two-dimensional Cartesian coordinate graph having abscissa axis of kh1 and ordinate axis of kh2, the outer edge of said region ABCDEFGHIJKLMA being given by a closed chain in said Cartesian coordinate consisting of points A, B, C, D, E, F, G, H, I, J, K, L and M and lines A–B, B–C, C–D, D–E, E–F, F–G, G–H, H–I, I–J, J–K, K–L, L–M and M–A;

said point A being given by a coordinate point (kh1=0.30, kh2=1.07);

said point B being given by a coordinate point (kh1=0.36, kh2=1.07);

said point C being given by a coordinate point (kh1=0.43, kh2=1.07);

said point D being given by a coordinate point (kh1=0.90, kh2=1.37);

said point E being given by a coordinate point (kh1=1.05, kh2=1.20);

said point F being given by a coordinate point (kh1=1.52, kh2=0.85);

said point G being given by a coordinate point (kh1=1.34, kh2=0.79);

said point H being given by a coordinate point (kh1=1.05, kh2=0.72);

said point I being given by a coordinate point (kh1=0.85, kh2=0.68);

said point J being given by a coordinate point (kh1=0.71, kh2=0.68);

said point K being given by a coordinate point (kh1=0.38, kh2=0.68);

said point L being given by a coordinate point (kh1=0.42, kh2=0.55); and said point M being given by a coordinate point (kh1=0.30, kh2=0.65).

46. A surface acoustic wave device according to claim 45, wherein said parameters kh1 and kh2 are given within a region ABNOJKLMA in said two-dimensional Cartesian coordinate graph, the outer edge of said region ABCNJKLMA being given by a closed chain in said Cartesian coordinate, consisting of said points A, B and C, a point N, a point O, and said points J, K, L, and M, and lines A–B, B–C, C–N, N–J, J–K, K–L, L–M and M–A, said point N being given by a coordinate point (kh1=0.43, kh2=0.95); and said point O being given by a coordinate point (kh1=0.61, kh2=0.75).

47. A surface acoustic wave device for 2nd mode surface acoustic wave of a wavelength $\lambda$ (µm) comprising:

(i) a diamond layer, (ii) an interdigital transducer (IDT) disposed on said diamond layer, said IDT having a thickness of $t_A$, (iii) a ZnO layer disposed over said interdigital transducer onto said diamond layer, said ZnO layer having a thickness $t_z$, (iv) a short circuit electrode disposed on said ZnO layer, and (v) an SiO$_2$ layer disposed over said short circuit electrode onto said ZnO layer, said SiO$_2$ layer having a thickness of $t_s$;

wherein a parameter kh3=2π($t_A/\lambda$) is:
0.231≦kh3≦0.297, and wherein a parameter kh1=2π($t_z/\lambda$) and a parameter kh2=2π($t_s/\lambda$) are given within a region ABCDEFGHIJKLMNA in a two-dimensional Cartesian coordinate graph having abscissa axis of kh1 and ordinate axis of kh2, the outer edge of said region ABCDEFGHIJKLMNA being given by a closed chain in said Cartesian coordinate consisting of points A, B, C, D, E, F, G, H, I, J, K, L, M and N and lines A–B, B–C, C–D, D–E, E–F, F–G, G–H, H–I, I–J, J–K, K–L, L–M, M–N and N–A;

said point A being given by a coordinate point (kh1=0.30, kh2=1.15);

said point B being given by a coordinate point (kh1=0.38, kh2=1.20);

said point C being given by a coordinate point (kh1=0.46, kh2=1.32);

said point D being given by a coordinate point (kh1=0.60, kh2=1.52);

said point E being given by a coordinate point (kh1=0.73, kh2=1.60);

said point F being given by a coordinate point (kh1=0.81, kh2=1.44);

said point G being given by a coordinate point (kh1=1.00, kh2=1.20);

said point H being given by a coordinate point (kh1=1.40, kh2=0.91);

said point I being given by a coordinate point (kh1=1.14, kh2=0.83);

said point J being given by a coordinate point (kh1=0.83, kh2=0.76);

said point K being given by a coordinate point (kh1=0.60, kh2=0.73);

said point L being given by a coordinate point (kh1=0.35, kh2=0.73);

said point M being given by a coordinate point (kh1=0.38, kh2=0.63); and said point N being given by a coordinate point (kh1=0.30, kh2=0.65).

48. A surface acoustic wave device according to claim 47, wherein said parameters kh1 and kh2 are given within a region AOPKLMNA in said two-dimensional Cartesian coordinate graph, the outer edge of said region AOPKLMNA being given by a closed chain in said Cartesian coordinate, consisting of said point A, a point O, a point P, and said points K, L, M and N, and lines A–O, O–P, P–K, K–L, L–M, M–N and N–A, said point O being given by a coordinate point (kh1=0.36, kh2=1.00); and said point P being given by a coordinate point (kh1=0.48, kh2=0.83).

49. A surface acoustic wave device for 2nd mode surface acoustic wave of a wavelength $\lambda$ (µm) comprising:

(i) a diamond layer, (ii) an interdigital transducer (IDT) disposed on said diamond layer, said IDT having a thickness of $t_A$;

(iii) a ZnO layer disposed over said interdigital transducer onto said diamond layer, said ZnO layer having a thickness $t_z$, (iv) a short circuit electrode disposed on said ZnO layer, and (v) an SiO$_2$ layer disposed over said short circuit electrode onto said ZnO layer, said SiO$_2$ layer having a thickness of $t_s$;

wherein a parameter kh3=2π($t_A/\lambda$) is:
0.297≦kh3≦0.363, and wherein a parameter kh1=2π($t_z/\lambda$) and a parameter kh2=2π($t_s/\lambda$) are given within a region ABCDEF- GHIJKLA in a two-dimensional Cartesian coordinate graph having abscissa axis of kh1 and ordinate axis of kh2, the outer edge of said region ABCDEFGHIJKLA being given by a closed chain in said Cartesian coordinate consisting of points A, B, C, D, E, F, G, H, I, J, K and L and lines A–B, B–C, C–D, D–E, E–F, F–G, G–H, H–I, I–J, J–K, K–L and L–A;

said point A being given by a coordinate point (kh1=0.30, kh2=1.29);

said point B being given by a coordinate point (kh1=0.33, kh2=1.36);

said point C being given by a coordinate point (kh1=0.40, kh2=1.60);

said point D being given by a coordinate point (kh1=0.71, kh2=1.60);

said point E being given by a coordinate point (kh1=0.82, kh2=1.41);

said point F being given by a coordinate point (kh1=1.00, kh2=1.22);

said point G being given by a coordinate point (kh1=1.27, kh2=0.97);

said point H being given by a coordinate point (kh1=1.03, kh2=0.89);

said point I being given by a coordinate point (kh1=0.68, kh2=0.78);

said point J being given by a coordinate point (kh1=0.52, kh2=0.77);

said point K being given by a coordinate point (kh1=0.30, kh2=0.76); and said point L being given by a coordinate point (kh1=0.30, kh2=1.09).

50. A surface acoustic wave device according to claim 49, wherein said parameters kh1 and kh2 are given within a region LMJKL in said two-dimensional Cartesian coordinate graph, the outer edge of said region LMJKL being given by a closed chain in said Cartesian coordinate, consisting of said point L, a point M, and said points J and K, and lines L–M, M–J, J–K and K–L, said point M being given by a coordinate point (kh1=0.37, kh2=0.94).

51. A method for manufacturing a surface acoustic device for 2nd mode surface acoustic wave of a wavelength λ (μm), comprising;

(i) forming a ZnO layer onto a diamond layer, said ZnO layer having a thickness of $t_z$, (iii) forming an interdigital transducer (IDT) on said ZnO layer, said IDT having a thickness of $t_A$, and (iv) forming a SiO$_2$ layer over said interdigital transducer and onto said ZnO layer, said SiO$_2$ layer having a thickness of $t_s$;

wherein said $t_z$ and said $t_s$ are selected so that a parameter kh1=2π($t_z$/λ) and a parameter kh2=2π($t_s$/λ) are given within a region ABCDEFGHIJKLA in a two-dimensional Cartesin coordinate graph having abscissa axis of kh1 and ordinate axis of kh2, the outer edge of said region ABCDEFGHIJKLA being given by a closed chain in said Cartesian coordinate consisting of points A, B, C, D, E, F, G, H, I, J, K and L and lines A–B, B–C, C–D, D–E, E–F, F–G, G–H, H–I, I–J, J–K, K–L and L–A;

said point A being given by a coordinate point (kh1=0.30, kh2=0.87);

said point B being given by a coordinate point (kh1=0.54, kh2=0.87);

said point C being given by a coordinate point (kh1=0.60, kh2=0.87);

said point D being given by a coordinate point (kh1=0.81, kh2=0.97);

said point E being given by a coordinate point (kh1=1.16, kh2=1.20);

said point F being given by a coordinate point (kh1=1.52, kh2=0.93);

said point G being given by a coordinate point (kh1=1.69, kh2=0.77);

said point H being given by a coordinate point (kh1=1.31, kh2=0.59);

said point I being given by a coordinate point (kh1=1.04, kh2=0.50);

said point J being given by a coordinate point (kh1=0.68, kh2=0.40);

said point K being given by a coordinate point (kh1=0.63, kh2=0.33); and said point L being given by a coordinate point (kh1=0.30, kh2=0.63), and wherein said $t_A$ is selected so that a parameter kh3=2π($t_A$/λ) is: 0.033≦kh3≦0.099.

52. A method for manufacturing a surface acoustic device for 2nd mode surface acoustic wave of a wavelength λ (μm), comprising;

(i) forming a short circuit electrode disposed on a diamond layer, (ii) forming a ZnO layer over said short circuit electrode and onto a diamond layer, said ZnO layer having a thickness $t_z$, (iii) forming an interdigital transducer (IDT) on said ZnO layer, said IDT having a thickness of $t_A$, and (iv) forming a SiO$_2$ layer over said interdigital transducer and onto said ZnO layer, said SiO$_2$ layer having a thickness of $t_s$;

wherein said $t_z$ and said $t_s$ are selected so that a parameter kh1=2π($t_z$/λ) and a parameter kh2=2π($t_s$/λ) are given within a region ABCDEFGHIJKLMA in a two-dimensional Cartesian coordinate graph having abscissa axis of kh1 and ordinate axis of kh2, the outer edge of said region ABCDEFGHIJKLMA being given by a closed chain in said Cartesian coordinate consisting of points A, B, C, D, E, F, G, H, I, J, K, L and M and lines A–B, B–C, C–D, D–E, E–F, F–G, G–H, H–I, I–J, J–K, K–L, L–M and M–A;

said point A being given by a coordinate point (kh1=0.30, kh2=0.98);

said point B being given by a coordinate point (kh1=0.40, kh2=0.95);

said point C being given by a coordinate point (kh1=0.45, kh2=0.96);

said point D being given by a coordinate point (kh1=0.60, kh2=1.00);

said point E being given by a coordinate point (kh1=1.04, kh2=1.25);

said point F being given by a coordinate point (kh1=1.53, kh2=0.89);

said point G being given by a coordinate point (kh1=1.60, kh2=0.80);

said point H being given by a coordinate point (kh1=1.22, kh2=0.63);

said point I being given by a coordinate point (kh1=1.00, kh2=0.59);

said point J being given by a coordinate point (kh1=0.89, kh2=0.57);

said point K being given by a coordinate point (kh1=0.53, kh2=0.52);

said point L being given by a coordinate point (kh1=0.53, kh2=0.45); and said point M being given by a coordinate point (kh1=0.30, kh2=0.65), and wherein said $t_A$ is selected so that a parameter kh3=$2\pi(t_A/\lambda)$ is:

0.099≦kh3≦0.165.

53. A method for manufacturing a surface acoustic device for 2nd mode surface acoustic wave of a wavelength λ (μm), comprising:

(i) forming a ZnO layer onto a diamond layer, said ZnO layer having a thickness $t_z$, (ii) forming an interdigital transducer (IDT) on said ZnO layer, said IDT having a thickness of $t_A$, (iii) forming a $SiO_2$ layer over said interdigital transducer and onto said ZnO layer, said $SiO_2$ layer having a thickness of $t_s$, and (iv) forming a short circuit electrode on said $SiO_2$ layer;

wherein said $t_z$ and said $t_s$ are selected so that a parameter kh1=$2\pi(t_z/\lambda)$ and a parameter kh2=$2\pi(t_s/\lambda)$ are given within a region ABCDEFGHIJKLMA in a two-dimensional Cartesian coordinate graph having abscissa axis of kh1 and ordinate axis of kh2, the outer edge of said region ABCDEFGHIJKLMA being given by a closed chain in said Cartesian coordinate consisting of points A, B, C, D, E, F, G, H, I, J, K, L and M and lines A–B, B–C, C–D, D–E, E–F, F–G, G–H, H–I, I–J, J–K, K–L, L–M and M–A;

said point A being given by a coordinate point (kh1=0.30, kh2=1.07);

said point B being given by a coordinate point (kh1=0.36, kh2=1.07);

said point C being given by a coordinate point (kh1=0.43, kh2=1.07);

said point D being given by a coordinate point (kh1=0.90, kh2=1.37);

said point E being given by a coordinate point (kh1=1.05, kh2=1.20);

said point F being given by a coordinate point (kh1=1.52, kh2=0.85);

said point G being given by a coordinate point (kh1=1.34, kh2=0.79);

said point H being given by a coordinate point (kh1=1.05, kh2=0.72);

said point I being given by a coordinate point (kh1=0.85, kh2=0.68);

said point J being given by a coordinate point (kh1=0.71, kh2=0.68);

said point K being given by a coordinate point (kh1=0.38, kh2=0.68);

said point L being given by a coordinate point (kh1=0.42, kh2=0.55); and said point M being given by a coordinate point (kh1=0.30, kh2=0.65), and wherein said $t_A$ is selected so that a parameter kh3=$2\pi(t_A/\lambda)$ is:

0.165≦kh3≦0.231.

54. A method for manufacturing a surface acoustic device for 2nd mode surface acoustic wave of a wavelength λ (μm), comprising:

(i) forming a first short circuit electrode on a diamond layer, (ii) forming a ZnO layer over said short circuit electrode and onto said diamond layer, said ZnO layer having a thickness $t_z$, (iii) forming an interdigital transducer (IDT) on said ZnO layer, said IDT having a thickness of $t_A$, (iv) forming an $SiO_2$ layer disposed over said interdigital transducer and onto said ZnO layer, said $SiO_2$ layer having a thickness of $t_s$, and (v) forming a second short circuit electrode on said $SiO_2$ layer;

wherein said $t_z$ and said $t_s$ are selected so that a parameter kh1=$2\pi(t_z/\lambda)$ and a parameter kh2=$2\pi(t_s/\lambda)$ are given within a region ABCDEFGHIJKLMNA in a two-dimensional Cartesian coordinate graph having abscissa axis of kh1 and ordinate axis of kh2, the outer edge of said region ABCDEFGHIJKLMNA being given by a closed chain in said Cartesian coordinate consisting of points A, B, C, D, E, F, G, H, I, J, K, L, M and N and lines A–B, B–C, C–D, D–E, E–F, F–G, G–H, H–I, I–J, J–K, K–L, L–M, M–N and N–A;

said point A being given by a coordinate point (kh1=0.30, kh2=1.15);

said point B being given by a coordinate point (kh1=0.38, kh2=1.20);

said point C being given by a coordinate point (kh1=0.46, kh2=1.32);

said point D being given by a coordinate point (kh1=0.60, kh2=1.52);

said point E being given by a coordinate point (kh1=0.73, kh2=1.60);

said point F being given by a coordinate point (kh1=0.81, kh2=1.44);

said point G being given by a coordinate point (kh1=1.00, kh2=1.20);

said point H being given by a coordinate point (kh1=1.40, kh2=0.91);

said point I being given by a coordinate point (kh1=1.14, kh2=0.83);

said point J being given by a coordinate point (kh1=0.83, kh2=0.76);

said point K being given by a coordinate point (kh1=0.60, kh2=0.73);

said point L being given by a coordinate point (kh1=0.35, kh2=0.73);

said point M being given by a coordinate point (kh1=0.38, kh2=0.63); and said point N being given by a coordinate point (kh1=0.30, kh2=0.65), and wherein said $t_A$ is selected so that a parameter kh3=$2\pi(t_A/\lambda)$ is:

0.231≦kh3≦0.297.

55. A method for manufacturing a surface acoustic device for 2nd mode surface acoustic wave of a wavelength λ (μm), comprising:

(i) forming an interdigital transducer (IDT) on a diamond layer, said IDT having a thickness of $t_A$, (ii) forming a ZnO layer over said interdigital transducer and onto said diamond layer, said ZnO layer having a thickness $t_z$, (iii) forming a short circuit electrode on said ZnO layer, and (v) forming an SiO$_2$ layer over said short circuit electrode and onto said ZnO layer, said SiO$_2$ layer having a thickness of t$_s$;

wherein said t$_2$ and said t$_s$ are selected so that a parameter kh1=2$\pi$(t$_s$/$\lambda$) and a parameter kh2=2$\pi$(t$_s$/$\lambda$) are given within a region ABCDEFGHIJKLA in a two-dimensional Cartesian coordinate graph having abscissa axis of kh1 and ordinate axis of kh2, the outer edge of said region ABCDEFGHIJKLA being given by a closed chain in said Cartesian coordinate consisting of points A, B, C, D, E, F, G, H, I, J, K and L and lines A–B, B–C, C–D, D–E, E–F, F–G, G–H, H–I, I–J, J–K, K–L and L–A;

said point A being given by a coordinate point (kh1=0.30, kh2=1.29);

said point B being given by a coordinate point (kh1=0.33, kh2=1.36);

said point C being given by a coordinate point (kh1=0.40, kh2=1.60);

said point D being given by a coordinate point (kh1=0.71, kh2=1.60);

said point E being given by a coordinate point (kh1=0.82, kh2=1.41);

said point F being given by a coordinate point (kh1=1.00, kh2=1.22);

said point G being given by a coordinate point (kh1=1.27, kh2=0.97);

said point H being given by a coordinate point (kh1=1.03, kh2=0.89);

said point I being given by a coordinate point (kh1=0.68, kh2=0.78);

said point J being given by a coordinate point (kh1=0.52, kh2=0.77);

said point K being given by a coordinate point (kh1=0.30, kh2=0.76); and said point L being given by a coordinate point (kh1=0.30, kh2=1.09), and wherein said t$_A$ is selected so that a parameter kh3=2$\pi$(t$_A$/$\lambda$) is:

0.297≦kh3≦0.363.

* * * * *

UNITED STATES PATENT AND TRADEMARK OFFICE
CERTIFICATE OF CORRECTION

| | | |
|---|---|---|
| PATENT NO. | : | 5,783,896 |
| DATED | : | July 21, 1998 |
| INVENTOR(S) | : | Hideaki NAKAHATA, Kenjiro HIGAKI, Satoshi FUJII, Hiroyuki KITABAYASHI, Shin-ichi SHIKATA |

It is certified that error appears in the above-identified patent and that said Letters Patent is hereby corrected as shown below:

On the title page, item:
 [30] Foreign Application Priority Data, insert : "Aug. 8, 1995 [JP] Japan .... 202114/1995"

Signed and Sealed this

Twenty-ninth Day of December, 1998

Attest:

BRUCE LEHMAN

*Attesting Officer*          *Commissioner of Patents and Trademarks*